United States Patent
Hashimoto et al.

(10) Patent No.: US 12,101,997 B2
(45) Date of Patent: Sep. 24, 2024

(54) LIGHT-EMITTING DEVICE INCLUDING LIGHT-EMITTING LAYER AND ELECTRON-TRANSPORT LAYER

(71) Applicant: SEMICONDUCTOR ENERGY LABORATORY CO., LTD., Atsugi (JP)

(72) Inventors: Naoaki Hashimoto, Kanagawa (JP); Satoshi Seo, Kanagawa (JP); Tsunenori Suzuki, Kanagawa (JP); Yusuke Takita, Kanagawa (JP); Takumu Okuyama, Kanagawa (JP); Nobuharu Ohsawa, Kanagawa (JP); Shunpei Yamazaki, Tokyo (JP); Toshiki Sasaki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 624 days.

(21) Appl. No.: 17/416,754

(22) PCT Filed: Dec. 17, 2019

(86) PCT No.: PCT/IB2019/060883
§ 371 (c)(1),
(2) Date: Jun. 21, 2021

(87) PCT Pub. No.: WO2020/136499
PCT Pub. Date: Jul. 2, 2020

(65) Prior Publication Data
US 2022/0077397 A1   Mar. 10, 2022

(30) Foreign Application Priority Data

Dec. 28, 2018  (JP) .................................. 2018-247999
Feb. 6, 2019   (JP) .................................. 2019-020056
(Continued)

(51) Int. Cl.
*H10K 50/16* (2023.01)
*H10K 50/11* (2023.01)
(Continued)

(52) U.S. Cl.
CPC ......... *H10K 85/636* (2023.02); *H10K 85/342* (2023.02); *H10K 85/622* (2023.02);
(Continued)

(58) Field of Classification Search
CPC .. H10K 50/16; H10K 2101/30; H10K 50/166; H10K 50/11; H10K 50/15
(Continued)

(56) References Cited

U.S. PATENT DOCUMENTS 8,841,655 B2   9/2014   Okamoto
9,604,928 B2   3/2017   Shitagaki et al.
(Continued)

FOREIGN PATENT DOCUMENTS

CN   104761535 A   7/2015
CN   107710442 A   2/2018
(Continued)

OTHER PUBLICATIONS

Taiwanese Office Action (Application No. 108146796) Dated Dec. 28, 2023.
(Continued)

*Primary Examiner* — Didarul A Mazumder
(74) *Attorney, Agent, or Firm* — Fish & Richardson P.C.

(57) ABSTRACT

A novel light-emitting device, a light-emitting device with high emission efficiency, a light-emitting device with a long lifetime, or a light-emitting device with low driving voltage is provided. An EL layer includes a first layer, a second layer, a third layer, a light-emitting layer, and a fourth layer in this order from the anode side. The first layer contains a first organic compound and a second organic compound. The (Continued)

fourth layer contains a seventh organic compound. The first organic compound exhibits an electron-accepting property with respect to the second organic compound. A HOMO level of the second organic compound is higher than or equal to −5.7 eV and lower than or equal to −5.4 eV. The fourth layer includes a region where the amount of seventh organic compound is large and a region where the amount of seventh organic compound is small in the thickness direction.

18 Claims, 48 Drawing Sheets

(30) Foreign Application Priority Data

Feb. 20, 2019 (JP) .................................. 2019-028460
Apr. 19, 2019 (JP) .................................. 2019-080376
Apr. 30, 2019 (JP) .................................. 2019-087061

(51) Int. Cl.
*H10K 85/30* (2023.01)
*H10K 85/60* (2023.01)
*H10K 101/30* (2023.01)

(52) U.S. Cl.
CPC ......... *H10K 85/626* (2023.02); *H10K 85/657* (2023.02); *H10K 85/6572* (2023.02); *H10K 85/6576* (2023.02); *H10K 50/16* (2023.02); *H10K 85/6574* (2023.02); *H10K 2101/30* (2023.02)

(58) Field of Classification Search
USPC ........................................ 257/40; 438/82, 99
See application file for complete search history.

(56) References Cited

U.S. PATENT DOCUMENTS

| | | | |
|---|---|---|---|
| 9,663,711 B2 | 5/2017 | Takeda. et al. | |
| 10,096,658 B2 | 10/2018 | Watabe et al. | |
| 10,573,829 B2 | 2/2020 | Shitagaki et al. | |
| 10,586,934 B2 | 3/2020 | Shitagaki et al. | |
| 10,593,895 B2 | 3/2020 | Shitagaki et al. | |
| 11,008,510 B2 | 5/2021 | Takeda et al. | |
| 11,177,325 B2 | 11/2021 | Watabe et al. | |
| 11,773,321 B2 | 10/2023 | Takeda et al. | |
| 2012/0205632 A1 | 8/2012 | Shitagaki et al. | |
| 2015/0069357 A1* | 3/2015 | Park ..................... | H10K 50/171 |
| | | | 257/40 |
| 2016/0172620 A1 | 6/2016 | Hashimoto et al. | |
| 2018/0190924 A1 | 7/2018 | Tsang et al. | |
| 2018/0358562 A1* | 12/2018 | Takita ..................... | H05B 47/11 |
| 2020/0194692 A1 | 6/2020 | Shitagaki et al. | |
| 2021/0249619 A1 | 8/2021 | Seo et al. | |

FOREIGN PATENT DOCUMENTS

| | | |
|---|---|---|
| EP | 3319140 A | 5/2018 |
| JP | 2011-040479 A | 2/2011 |
| JP | 2012-186461 A | 9/2012 |
| JP | 2016-115717 A | 6/2016 |
| JP | 2017-017305 A | 1/2017 |
| JP | 2017-199903 A | 11/2017 |
| KR | 2015-0028554 A | 3/2015 |
| KR | 2016-0091198 A | 8/2016 |
| KR | 2018-0022973 A | 3/2018 |
| TW | 201709588 | 3/2017 |
| TW | 201825466 | 7/2018 |
| WO | WO-2011/065136 | 6/2011 |
| WO | WO-2013/027846 | 2/2013 |
| WO | WO-2017/002893 | 1/2017 |

OTHER PUBLICATIONS

Tse.S et al., "The role of charge-transfer integral in determining and engineering the carrier mobilities of 9,10-di(2-naphthyl)anthracene compounds", Chem. Phys. Lett. (Chemical Physics Letters), Feb. 28, 2006, vol. 422, No. 4-6, pp. 354-357.
Matsushima.H et al., "Organic electrophosphorescent devices with mixed hole transport material as emission layer", Current Applied Physics, May 1, 2005, vol. 5, No. 4, pp. 305-308, Elsevier.
International Search Report (Application No. PCT/IB2019/060883) Dated Mar. 3, 2020.
Written Opinion (Application No. PCT/IB2019/060883) Dated Mar. 3, 2020.
Okachi.T et al., "Determination of Charge-Carrier Mobility in Organic Light-Emitting Diodes by Impedance Spectroscopy in Presence of Localized States", Jpn. J. Appl. Phys. (Japanese Journal of Applied Physics) , Dec. 19, 2008, vol. 47, No. 12, pp. 8965-8972.

* cited by examiner

FIG. 1A1
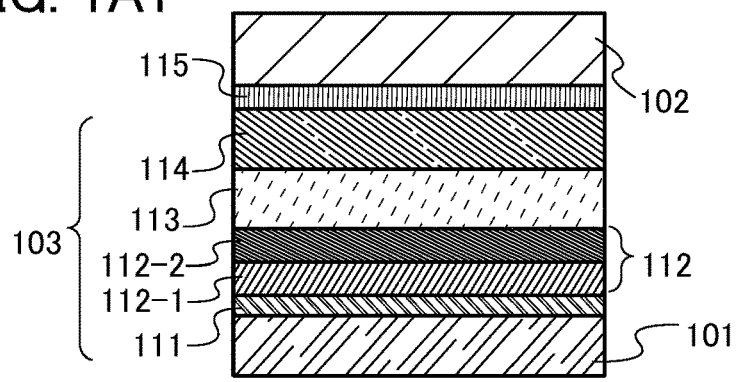
FIG. 1A2
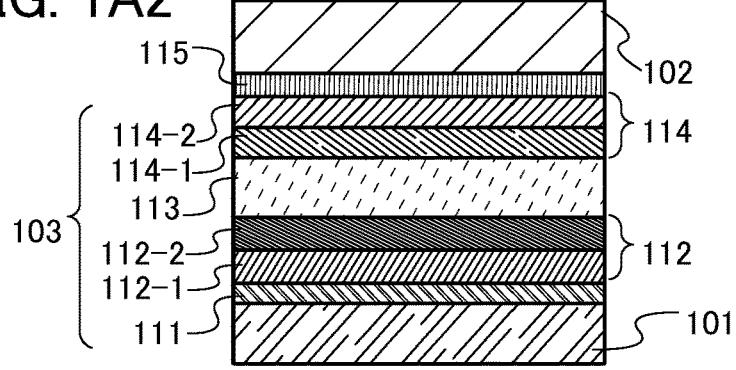
FIG. 1B
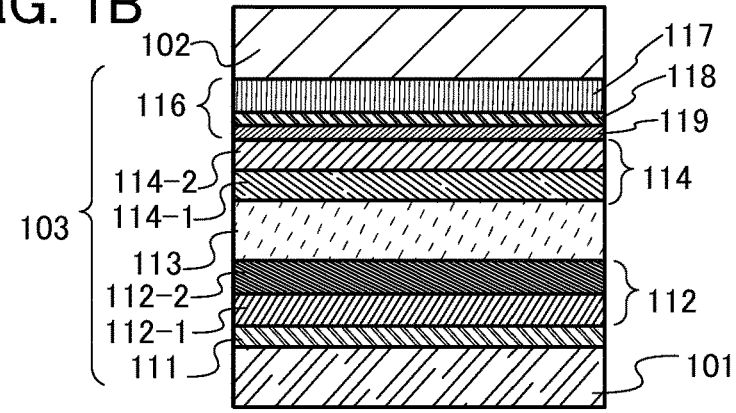
FIG. 1C
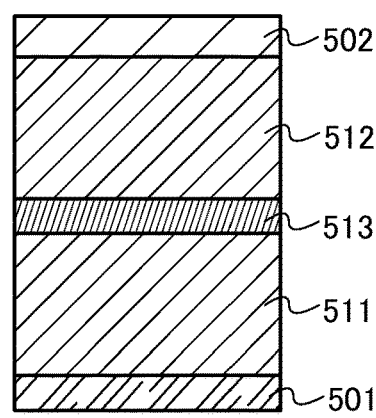

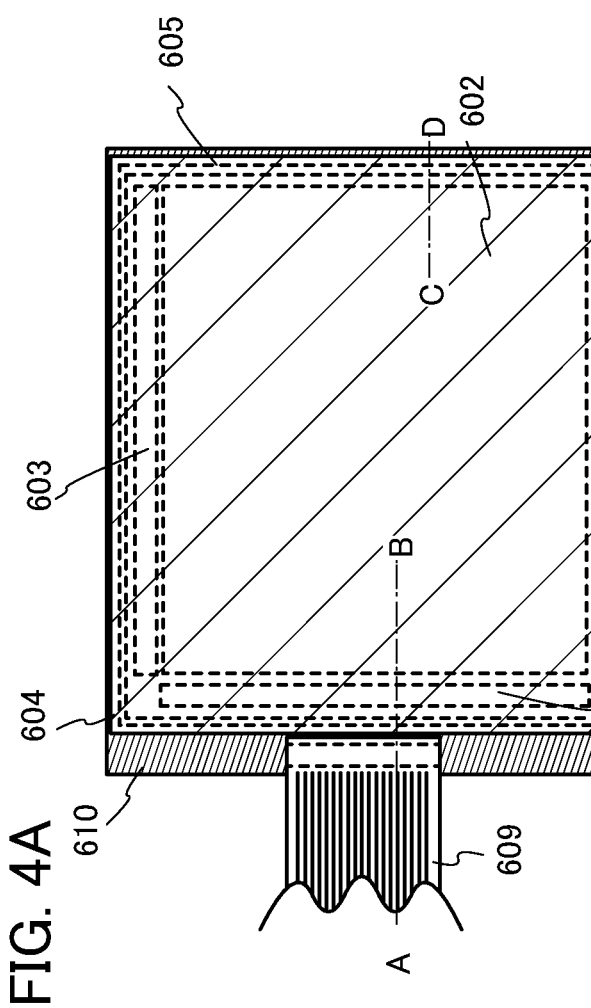
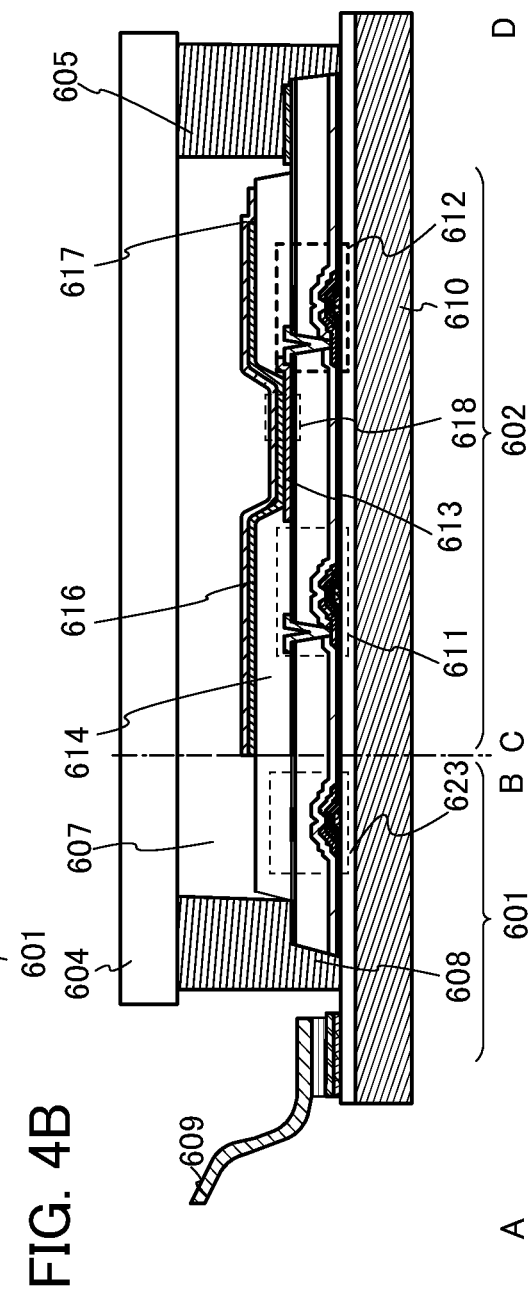
FIG. 4A
FIG. 4B

FIG. 9A
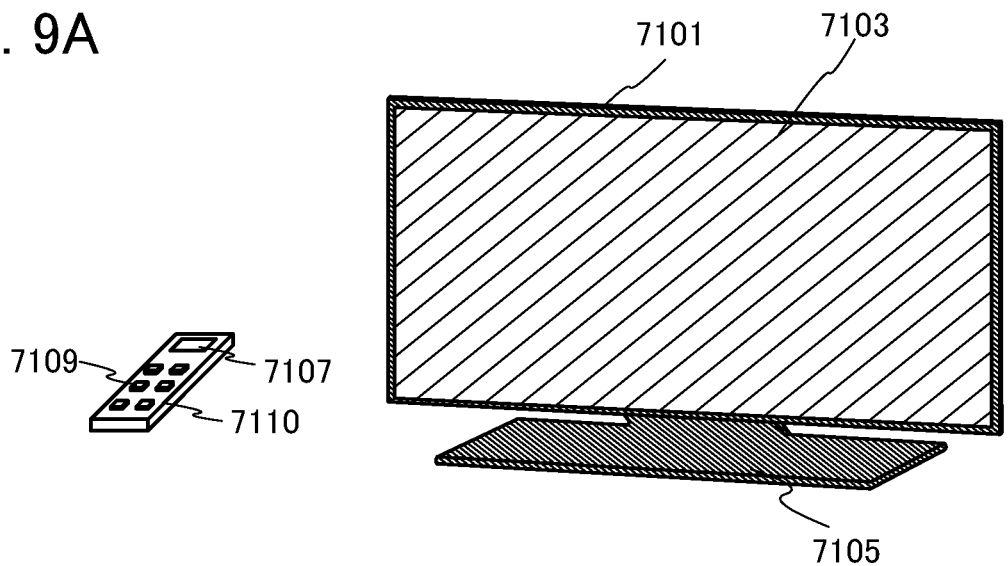
FIG. 9B1
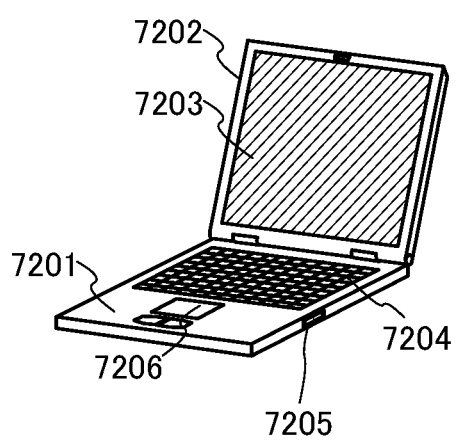
FIG. 9B2
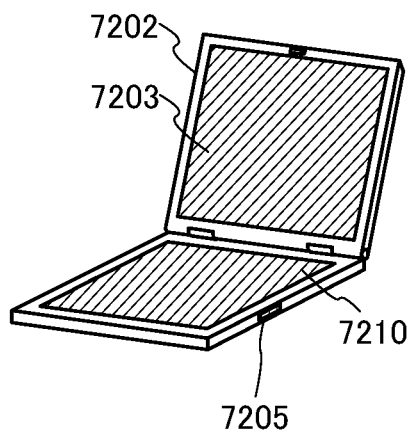
FIG. 9C
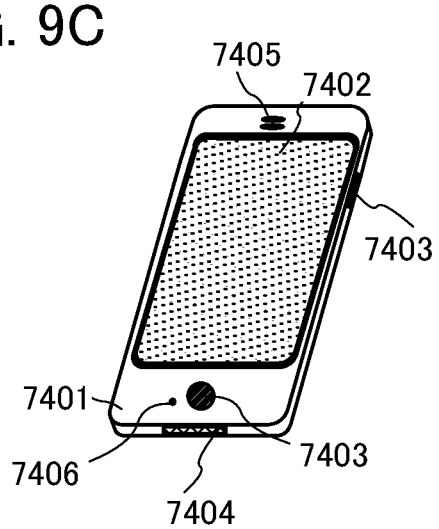

FIG. 23A1 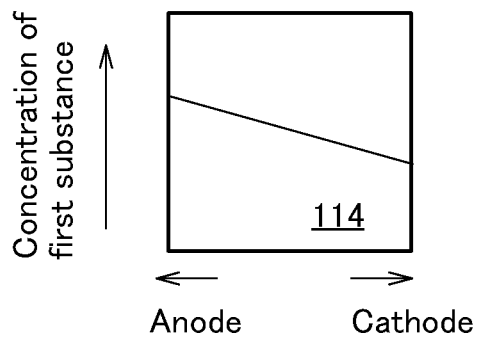
FIG. 23A2 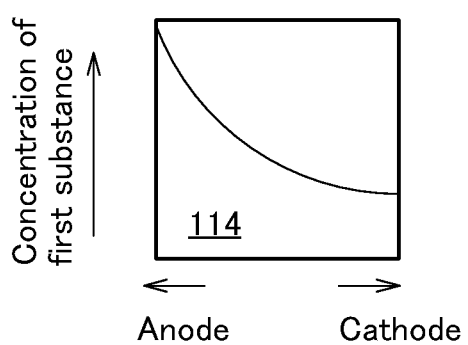
FIG. 23B1 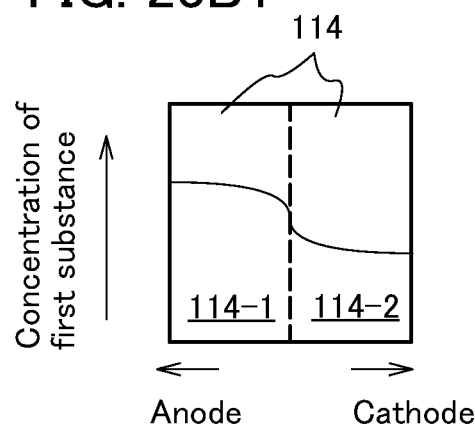
FIG. 23B2 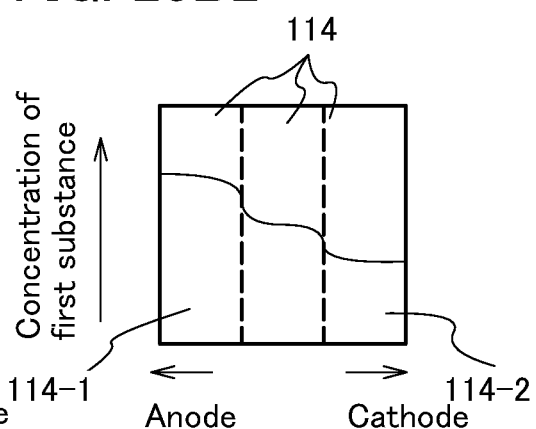

LIGHT-EMITTING DEVICE INCLUDING LIGHT-EMITTING LAYER AND ELECTRON-TRANSPORT LAYER

CROSS REFERENCE TO RELATED APPLICATIONS

This application is a U.S. National Phase Application under 35 U.S.C. § 371 of International Application PCT/IB2019/060883, filed on Dec. 17, 2019, which is incorporated by reference and claims the benefit of foreign priority applications filed in Japan on Dec. 28, 2018, as Application No. 2018-247999, on Feb. 6, 2019, as Application No. 2019-020056, on Feb. 20, 2019, as Application No. 2019-028460, on Apr. 19, 2019, as Application No. 2019-080376, and on Apr. 30, 2019, as Application No. 2019-087061.

TECHNICAL FIELD

Embodiments of the present invention relate to a light-emitting element, a light-emitting device, a display module, a lighting module, a display device, a light-emitting apparatus, an electronic device, and a lighting device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

BACKGROUND ART

Light-emitting devices (organic EL devices) including organic compounds and utilizing electroluminescence (EL) have been put to more practical use. In the basic structure of such light-emitting devices, an organic compound layer containing a light-emitting material (an EL layer) is interposed between a pair of electrodes. Carriers are injected by application of voltage to the device, and recombination energy of the carriers is used, whereby light emission can be obtained from the light-emitting material.

Such light-emitting devices are of self-light-emitting type and thus have advantages over liquid crystal displays, such as high visibility and no need for backlight when used as pixels of a display, and are suitable as flat panel display devices. Displays including such light-emitting devices are also highly advantageous in that they can be thin and lightweight. Moreover, such light-emitting devices also have a feature that response speed is extremely fast.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps. Thus, light-emitting devices also have great potential as planar light sources, which can be used for lighting devices and the like.

Displays or lighting devices including light-emitting devices can be suitably used for a variety of electronic devices as described above, and research and development of light-emitting devices have progressed for higher efficiency or longer lifetimes.

In a structure disclosed in Patent Document 1, a hole-transport material whose HOMO level is between the HOMO level of a first hole-injection layer and the HOMO level of a host material is provided between a light-emitting layer and a first hole-transport layer in contact with the hole-injection layer.

Although the characteristics of light-emitting devices have been improved considerably, advanced requirements for various characteristics including efficiency and durability are not yet satisfied.

REFERENCE

Patent Document

[Patent Document 1] PCT International Publication No. WO2011/065136

DISCLOSURE OF INVENTION

An object of one embodiment of the present invention is to provide a novel light-emitting device. Another object of one embodiment of the present invention is to provide alight-emitting device with high emission efficiency. Another object of one embodiment of the present invention is to provide a light-emitting device with a long lifetime. Another object of one embodiment of the present invention is to provide a light-emitting device with low driving voltage.

Another object of one embodiment of the present invention is to provide a light-emitting apparatus, an electronic device, and a display device each having high reliability. Another object of one embodiment of the present invention is to provide a light-emitting apparatus, an electronic device, and a display device each with low power consumption.

It is only necessary that at least one of the above-described objects be achieved in the present invention.

One embodiment of the present invention is a light-emitting device including an anode, a cathode, and an EL layer between the anode and the cathode. The EL layer includes a light-emitting layer and an electron-transport layer. The electron-transport layer contains a first substance and a second substance. The first substance is any of an alkali metal, an alkaline earth metal, an organic complex of an alkali metal or an alkaline earth metal, and a compound of an alkali metal or an alkaline earth metal. The second substance is an organic compound having an electron-transport property. The electron-transport layer includes a region where the amount of first substance is small and a region where the amount of first substance is large in the thickness direction. The region where the amount of first substance is large is closer to the light-emitting layer than the region where the amount of first substance is small is. A decay curve showing a change in luminance of light emission obtained when a constant current is supplied to the light-emitting device has the maximum value.

Another embodiment of the present invention is a light-emitting device including an anode, a cathode, and an EL layer between the anode and the cathode. The EL layer includes a light-emitting layer and an electron-transport layer. The electron-transport layer contains a first substance and a second substance. The first substance is any of an alkali metal, an alkaline earth metal, an organic complex of an alkali metal or an alkaline earth metal, and a compound of an alkali metal or an alkaline earth metal. The second substance is an organic compound having an electron-transport property. The electron-transport layer includes a region where the amount of second substance is large and a region where the amount of second substance is small in the thickness direction. The region where the amount of second substance is small is closer to the light-emitting layer than the region where the amount of second substance is large is. A decay curve showing a change in luminance of light emission obtained when a constant current is supplied to the light-emitting device has the maximum value.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound and a first substance. The first organic compound exhibits an electron-accepting property with respect to the second organic compound. The fifth organic compound is an emission center substance. The first substance is any of an alkali metal, an alkaline earth metal, an organic complex of an alkali metal or an alkaline earth metal, and a compound of an alkali metal or an alkaline earth metal. A HOMO level of the second organic compound is higher than or equal to $-5.7$ eV and lower than or equal to $-5.4$ eV. The electron mobility of the seventh organic compound is higher than or equal to $1\times10^{-7}$ cm$^2$/Vs and lower than or equal to $5\times10^{-5}$ cm$^2$/Vs when the square root of the electric field strength [V/cm] is 600. The fourth layer includes a region where the amount of seventh organic compound is large and a region where the amount of seventh organic compound is small in the thickness direction. The region where the amount of seventh organic compound is small is closer to the light-emitting layer than the region where the amount of seventh organic compound is large is. A decay curve showing a change in luminance of light emission obtained when a constant current is supplied to the light-emitting device has the maximum value.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The fourth layer is in contact with the light-emitting layer. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound and a first substance. The first organic compound exhibits an electron-accepting property with respect to the second organic compound. The fifth organic compound is an emission center substance. The first substance is any of an alkali metal, an alkaline earth metal, an organic complex of an alkali metal or an alkaline earth metal, and a compound of an alkali metal or an alkaline earth metal. A HOMO level of the second organic compound is higher than or equal to $-5.7$ eV and lower than or equal to $-5.4$ eV. The electron mobility of the seventh organic compound is higher than or equal to $1\times10^{-7}$ cm$^2$/Vs and lower than or equal to $5\times10^{-5}$ cm$^2$/Vs when the square root of the electric field strength [V/cm] is 600. A HOMO level of the seventh organic compound is higher than or equal to $-6.0$ eV. The fourth layer includes a region where the amount of seventh organic compound is large and a region where the amount of seventh organic compound is small in the thickness direction. The region where the amount of seventh organic compound is small is closer to the light-emitting layer than the region where the amount of seventh organic compound is large is. A decay curve showing a change in luminance of light emission obtained when a constant current is supplied to the light-emitting device has the maximum value.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The fourth layer is in contact with the light-emitting layer. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound and a first substance. The first organic compound exhibits an electron-accepting property with respect to the second organic compound. The fifth organic compound is an emission center substance. The first substance is any of an alkali metal, an alkaline earth metal, an organic complex of an alkali metal or an alkaline earth metal, and a compound of an alkali metal or an alkaline earth metal. A HOMO level of the second organic compound is higher than or equal to $-5.7$ eV and lower than or equal to $-5.4$ eV. A difference between a HOMO level of the third organic compound and the HOMO level of the second organic compound is less than or equal to 0.2 eV. The HOMO level of the third organic compound is deeper than or equal to the HOMO level of the second organic compound. The electron mobility of the seventh organic compound is higher than or equal to $1\times10^{-7}$ cm$^2$/Vs and lower than or equal to $5\times10^{-5}$ cm$^2$/Vs when the square root of the electric field strength [V/cm] is 600. A HOMO level of the seventh organic compound is higher than or equal to $-6.0$ eV. The fourth layer includes a region where the amount of seventh organic compound is large and a region where the amount of seventh organic compound is small in the thickness direction. The region where the amount of seventh organic compound is small is closer to the light-emitting layer than the region where the amount of seventh organic compound is large is. A decay curve showing a change in luminance of light emission obtained when a constant current is supplied to the light-emitting device has the maximum value.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The fourth layer is in contact with the light-emitting layer. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound and a first substance. The first organic compound exhibits an electron-accepting property with respect to the second organic compound. The second organic compound has a first hole-transport skeleton. The third organic compound has a second hole-transport skeleton. The fourth organic compound has a third hole-transport skeleton. The fifth organic compound is an emission center substance. The first substance is any of an alkali metal, an alkaline earth metal, an organic complex of an alkali metal or an alkaline earth metal, and a compound of an alkali metal or an alkaline earth metal. A HOMO level of the second organic compound is higher than or equal to −5.7 eV and lower than or equal to −5.4 eV. The first hole-transport skeleton, the second hole-transport skeleton, and the third hole-transport skeleton are independently any one of a carbazole skeleton, a dibenzofuran skeleton, a dibenzothiophene skeleton, and an anthracene skeleton. The electron mobility of the seventh organic compound is higher than or equal to $1\times10^{-7}$ cm$^2$/Vs and lower than or equal to $5\times10^{-5}$ cm$^2$/Vs when the square root of the electric field strength [V/cm] is 600. A HOMO level of the seventh organic compound is higher than or equal to −6.0 eV. The fourth layer includes a region where the amount of seventh organic compound is large and a region where the amount of seventh organic compound is small in the thickness direction. The region where the amount of seventh organic compound is small is closer to the light-emitting layer than the region where the amount of seventh organic compound is large is. A decay curve showing a change in luminance of light emission obtained when a constant current is supplied to the light-emitting device has the maximum value.

Another embodiment of the present invention is a light-emitting device having the above structure, in which the decay curve has a portion where the luminance exceeds 100%.

Another embodiment of the present invention is a light-emitting device including an anode, a cathode, and an EL layer between the anode and the cathode. The EL layer includes a light-emitting layer and an electron-transport layer. The electron-transport layer contains a first substance and a second substance. The first substance is any of an alkali metal, an alkaline earth metal, an organic complex of an alkali metal or an alkaline earth metal, and a compound of an alkali metal or an alkaline earth metal. The second substance is an organic compound having an electron-transport property. The electron-transport layer includes a region where the amount of first substance is small and a region where the amount of first substance is large in the thickness direction. The region where the amount of first substance is large is closer to the light-emitting layer than the region where the amount of first substance is small is.

Another embodiment of the present invention is a light-emitting device including an anode, a cathode, and an EL layer between the anode and the cathode. The EL layer includes a light-emitting layer and an electron-transport layer. The electron-transport layer contains a first substance and a second substance. The first substance is any of an alkali metal, an alkaline earth metal, an organic complex of an alkali metal or an alkaline earth metal, and a compound of an alkali metal or an alkaline earth metal. The second substance is an organic compound having an electron-transport property. The electron-transport layer includes a region where the amount of second substance is large and a region where the amount of second substance is small in the thickness direction. The region where the amount of second substance is small is closer to the light-emitting layer than the region where the amount of second substance is large is.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound and a first substance. The first organic compound exhibits an electron-accepting property with respect to the second organic compound. The fifth organic compound is an emission center substance. The first substance is any of an alkali metal, an alkaline earth metal, an organic complex of an alkali metal or an alkaline earth metal, and a compound of an alkali metal or an alkaline earth metal. A HOMO level of the second organic compound is higher than or equal to −5.7 eV and lower than or equal to −5.4 eV. The electron mobility of the seventh organic compound is higher than or equal to $1\times10^{-7}$ cm$^2$/Vs and lower than or equal to $5\times10^{5}$ cm$^2$/Vs when the square root of the electric field strength [V/cm] is 600. The fourth layer includes a region where the amount of seventh organic compound is large and a region where the amount of seventh organic compound is small in the thickness direction. The region where the amount of seventh organic compound is small is closer to the light-emitting layer than the region where the amount of seventh organic compound is large is.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The fourth layer is in contact with the light-emitting layer. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound and a first substance. The first organic compound exhibits an electron-accepting property with respect to the second organic compound. The fifth organic compound is an emission center substance. The first substance is any of an alkali metal, an alkaline earth metal, an organic complex of an alkali metal or an alkaline earth metal, and a compound of an alkali metal or an alkaline earth metal. A HOMO level of the second organic compound is higher than or equal to −5.7 eV and lower than or equal to −5.4 eV. The electron mobility of the seventh organic compound is higher than or equal to $1\times10^{-7}$ cm$^2$/Vs and lower than or equal to $5\times10^{-5}$ cm$^2$/Vs when the square root of the electric field strength [V/cm] is 600. A HOMO level of the seventh organic compound is higher than or equal to −6.0 eV. The fourth layer includes a region where the amount of seventh organic compound is large and a region where the amount of seventh organic compound is small in the thickness direction. The region where the amount of seventh organic compound is small is closer to the light-emitting layer than the region where the amount of seventh organic compound is large is.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The fourth layer is in contact with the light-emitting layer. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound and a first substance. The first organic compound exhibits an electron-accepting property with respect to the second organic compound. The fifth organic compound is an emission center substance. The first substance is any of an alkali metal, an alkaline earth metal, an organic complex of an alkali metal or an alkaline earth metal, and a compound of an alkali metal or an alkaline earth metal. A HOMO level of the second organic compound is higher than or equal to −5.7 eV and lower than or equal to −5.4 eV A difference between a HOMO level of the third organic compound and the HOMO level of the second organic compound is less than or equal to 0.2 eV. The HOMO level of the third organic compound is deeper than or equal to the HOMO level of the second organic compound. The electron mobility of the seventh organic compound is higher than or equal to $1\times10^{-7}$ cm$^2$/Vs and lower than or equal to $5\times10^{-5}$ cm$^2$/Vs when the square root of the electric field strength [V/cm] is 600. A HOMO level of the seventh organic compound is higher than or equal to −6.0 eV. The fourth layer includes a region where the amount of seventh organic compound is large and a region where the amount of seventh organic compound is small in the thickness direction. The region where the amount of seventh organic compound is small is closer to the light-emitting layer than the region where the amount of seventh organic compound is large is.

Another embodiment of the present invention is a light-emitting device including an anode, a cathode, and an EL layer between the anode and the cathode. The EL layer includes a first layer, a second layer, a third layer, a light-emitting layer, and a fourth layer in this order from the anode side. The first layer is in contact with the anode. The fourth layer is in contact with the light-emitting layer. The first layer contains a first organic compound and a second organic compound. The second layer contains a third organic compound. The third layer contains a fourth organic compound. The light-emitting layer contains a fifth organic compound and a sixth organic compound. The fourth layer contains a seventh organic compound and a first substance. The first organic compound exhibits an electron-accepting property with respect to the second organic compound. The second organic compound has a first hole-transport skeleton. The third organic compound has a second hole-transport skeleton. The fourth organic compound has a third hole-transport skeleton. The fifth organic compound is an emission center substance. The first substance is any of an alkali metal, an alkaline earth metal, an organic complex of an alkali metal or an alkaline earth metal, and a compound of an alkali metal or an alkaline earth metal. A HOMO level of the second organic compound is higher than or equal to −5.7 eV and lower than or equal to −5.4 eV. The first hole-transport skeleton, the second hole-transport skeleton, and the third hole-transport skeleton are independently any one of a carbazole skeleton, a dibenzofuran skeleton, a dibenzothiophene skeleton, and an anthracene skeleton. The electron mobility of the seventh organic compound is higher than or equal to $1\times10^{-7}$ cm$^2$/Vs and lower than or equal to $5\times10^{-5}$ cm$^2$/Vs when the square root of the electric field strength [V/cm] is 600. A HOMO level of the seventh organic compound is higher than or equal to −6.0 eV. The fourth layer includes a region where the amount of seventh organic compound is large and a region where the amount of seventh organic compound is small in the thickness direction. The region where the amount of seventh organic compound is small is closer to the light-emitting layer than the region where the amount of seventh organic compound is large is.

Another embodiment of the present invention is a light-emitting device having the above structure, in which the seventh organic compound has an anthracene skeleton.

Another embodiment of the present invention is a light-emitting device having the above structure, in which the seventh organic compound has an anthracene skeleton and a heterocyclic skeleton.

Another embodiment of the present invention is a light-emitting device having the above structure, in which the electron mobility of the seventh organic compound is lower than the electron mobility of the sixth organic compound.

Another embodiment of the present invention is a light-emitting device having the above structure, in which a difference between the HOMO levels of the third organic compound and the fourth organic compound is less than or equal to 0.2 eV.

Another embodiment of the present invention is a light-emitting device having the above structure, in which the HOMO level of the fourth organic compound is deeper than the HOMO level of the third organic compound.

Another embodiment of the present invention is a light-emitting device in which the second organic compound has a dibenzofuran skeleton.

Another embodiment of the present invention is a light-emitting device in which the second organic compound and the third organic compound are the same substance.

Another embodiment of the present invention is a light-emitting device having the above structure, in which the fifth organic compound is a blue fluorescent material.

Another embodiment of the present invention is an electronic device including the light-emitting device having the above structure and a sensor, an operation button, a speaker, or a microphone.

Another embodiment of the present invention is a light-emitting apparatus including the light-emitting device having the above structure and a transistor or a substrate.

Another embodiment of the present invention is a lighting device including the light-emitting device having the above structure and a housing.

Note that the light-emitting apparatus in this specification includes, in its category, an image display device that uses a light-emitting device. The light-emitting apparatus may be included in a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. The light-emitting apparatus may be included in a lighting device or the like.

One embodiment of the present invention can provide a novel light-emitting device. Another embodiment of the present invention can provide a light-emitting device with a long lifetime. Another embodiment of the present invention can provide a light-emitting device with high emission efficiency.

Another embodiment of the present invention can provide a light-emitting apparatus, an electronic device, and a display device each having high reliability. Another embodiment of the present invention can provide a light-emitting apparatus, an electronic device, and a display device each with low power consumption.

Note that the description of the effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 1A1, 1A2, 1B, and 1C are schematic views of light-emitting devices;

FIGS. 4A and 4B are conceptual diagrams of an active matrix light-emitting apparatus;

FIGS. 9A, 9B1, 9B2, and 9C illustrate electronic devices;

FIGS. 23A1, 23A2, 23B1, and 23B2 each show the concentration of a first substance in an electron-transport layer;

BEST MODE FOR CARRYING OUT THE INVENTION

Figure 2A:
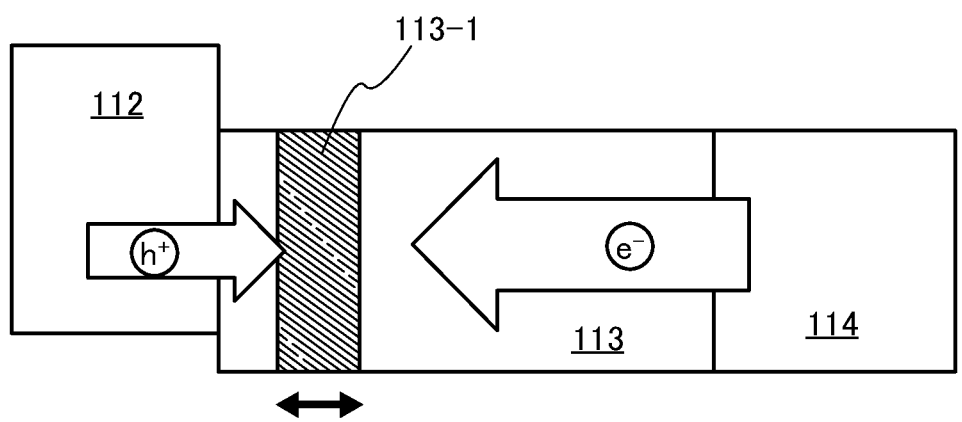
FIGS. 2A and 2B are diagrams for explaining a lifetime extension.

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

FIGS. 1A1 and 1A2 each illustrate a light-emitting device of one embodiment of the present invention. The light-emitting device of one embodiment of the present invention includes an anode 101, a cathode 102, and an EL layer 103. The EL layer includes a hole-injection layer 111, a hole-transport layer 112, alight-emitting layer 113, and an electron-transport layer 114. It is preferable that the hole-transport layer 112 include a first hole-transport layer 112-1 and a second hole-transport layer 112-2, and the electron-transport layer 114 include a first electron-transport layer 114-1 and a second electron-transport layer 114-2 as illustrated in FIG. 1A2.

Although each of FIGS. 1A1 and 1A2 additionally illustrates an electron-injection layer 115 in the EL layer 103, the structure of the light-emitting device is not limited thereto. As long as the above-described components are included, a layer having another function may be included.

The hole-injection layer 111 contains a first organic compound and a second organic compound. The first organic compound exhibits an electron-accepting property with respect to the second organic compound. The second organic compound has a relatively deep HOMO level which is higher than or equal to −5.7 eV and lower than or equal to −5.4 eV. The second organic compound with a relatively deep HOMO level inhibits induction of holes properly and facilitates injection of the induced holes into the hole-transport layer 112.

As the first organic compound, organic compounds having an electron-withdrawing group (in particular, a cyano group or a halogen group such as a fluoro group) can be used, for example. A substance that exhibits an electron-accepting property with respect to the second organic compound is selected from such organic compounds as appropriate. Examples of such organic compounds include 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is preferred because it is thermally stable. A [3]radialene derivative having an electron-withdrawing group (in particular, a cyano group or a halogen group such as a fluoro group) has a very high electron-accepting property and thus is preferred. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

The second organic compound is preferably an organic compound having a hole-transport property and further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring or an aromatic monoamine that includes a naphthalene ring is preferred, and an aromatic monoamine in which a 9-fluorenyl group is bonded to nitrogen of the amine through an arylene group may be used. Note that the second organic compound having an N,N-bis(4-biphenyl)amino group is preferable because a light-emitting device with a long lifetime can be manufactured. Specific examples of the second organic compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II) (4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4-(2;1'-binaphthyl-6-yl)-4',4"-diphenyltriphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4-(6;2'-binaphthyl-2-yl)-4',4"-diphenyltriphenylamine (abbreviation: BBA(βN2)B), 4-(2;2'-binaphthyl-7-yl)-4',4"-diphenyltriphenylamine (abbreviation: BBA(βN2)B-03), 4-(1;2'-binaphthyl-4-yl)-4',4"-diphenyltriphenylamine (abbreviation: BBAβNαNB), 4-(1;2'-binaphthyl-5-yl)-4',4"-diphenyltriphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-(1-naphthyl)-4'-phenyltriphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation:

PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), and N-(1,1'-biphenyl-4-yl)-9,9-dimethyl-N-[4-(9-phenyl-9H-carbazol-3-yl)phenyl]-9H-fluoren-2-amine (abbreviation: PCBBiF).

The weight ratio of the first organic compound to the second organic compound in the hole-injection layer 111 is preferably 1:0.01 to 1:0.15, further preferably 1:0.01 to 1:0.1.

The hole-transport layer 112 preferably includes the first hole-transport layer 112-1 and the second hole-transport layer 112-2. The first hole-transport layer 112-1 is closer to the anode 101 side than the second hole-transport layer 112-2 is. Note that the second hole-transport layer 112-2 also functions as an electron-blocking layer in some cases.

The first hole-transport layer 112-1 and the second hole-transport layer 112-2 contain a third organic compound and a fourth organic compound, respectively.

The third organic compound and the fourth organic compound are preferably organic compounds having a hole-transport property. As the third organic compound and the fourth organic compound, the organic compound that can be used as the second organic compound can be similarly used.

It is preferable that materials of the second organic compound and the third organic compound be selected so that the HOMO level of the third organic compound is deeper than that of the second organic compound and a difference between the HOMO levels is less than or equal to 0.2 eV.

In addition, the HOMO level of the fourth organic compound is preferably deeper than that of the third organic compound. It is preferable that materials of the third organic compound and the fourth organic compound be selected so that a difference between the HOMO levels is less than or equal to 0.2 eV. Owing to the above-described relation between the HOMO levels of the second organic compound, the third organic compound, and the fourth organic compound, holes are injected into each layer smoothly, which prevents an increase in driving voltage and deficiency of holes in the light-emitting layer.

The second organic compound, the third organic compound, and the fourth organic compound each preferably have a hole-transport skeleton. A carbazole skeleton, a dibenzofuran skeleton, a dibenzothiophene skeleton, and an anthracene skeleton, with which the HOMO levels of the organic compounds do not become too shallow, are preferably used as the hole-transport skeleton. Materials contained in adjacent layers (e.g., the second organic compound and the third organic compound or the third organic compound and the fourth organic compound) preferably have the same hole-transport skeleton, in which case holes can be injected smoothly. In particular, a dibenzofuran skeleton is preferably used as the hole-transport skeleton.

Furthermore, materials contained in adjacent layers (e.g., the second organic compound and the third organic compound or the third organic compound and the fourth organic compound) are preferably the same, in which case holes can be injected more smoothly. In particular, the second organic compound and the third organic compound are preferably the same material.

The light-emitting layer 113 contains a fifth organic compound and a sixth organic compound. The fifth organic compound is an emission center substance, and the sixth organic compound is a host material in which the fifth organic compound is to be dispersed. Note that the light-emitting layer 113 may contain another material in addition to the fifth organic compound and the sixth organic compound.

As the emission center substance, fluorescent substances, phosphorescent substances, substances exhibiting thermally activated delayed fluorescence (TADF), or other light-emitting materials may be used. Furthermore, the light-emitting layer 113 may be a single layer or include a plurality of layers. Note that one embodiment of the present invention is more suitable for the case where the light-emitting layer 113 emits fluorescence, specifically, blue fluorescence.

Examples of the material that can be used as a fluorescent substance in the light-emitting layer 113 are as follows. Other fluorescent substances can also be used.

Examples include κ,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N'-bis[4-(9-phenyl-9H-fluoren-9-yl)phenyl]pyrene-1,6-diamine (abbreviation: 1,6FLPAPm), N,N'-bis(3-methylphenyl)-N,N-bis[3-(9-phenyl-9H-fluoren-9-yl)phenyl]pyrene-1,6-diamine (abbreviation: 1,6mMemFLPAPm), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[j]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6- bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-(pyrene-1,6-diyl)bis[(6,N-diphenylbenzo[b]naphtho[1,2-d]furan)-8-amine](abbreviation:1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPm, 1,6mMemFLPAPm, and 1,6BnfAPm-03 are particularly preferable because of their high hole-trapping properties, high emission efficiency, and high reliability.

Examples of the material that can be used when a phosphorescent substance is used as the emission center substance in the light-emitting layer 113 are as follows.

Examples include an organometallic iridium complex having a 4H-triazole skeleton, such as tris{2-[5-(2-methylphenyl)-4-(2,6-dimethylphenyl)-4H-1,2,4-triazol-3-yl-κN$^2$]phenyl-κC}iridium(III) (abbreviation: [Ir(mpptz-dmp)$_3$]), tris(5-methyl-3,4-diphenyl-4H-1,2,4-triazolato) iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); an organometallic iridium complex having a 1H-triazole skeleton, such as tris[3-methyl-1-(2-methylphenyl)-5-phenyl-TH-1,2,4-triazolato] iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); an organometallic iridium complex having an imidazole skeleton, such as fac-tris[1-(2,6-diisopropylphenyl)-2-phenyl-TH-imidazole]iridium (III) (abbreviation: [Ir(iPrpmi)$_3$]) and tris[3-(2,6-dimethylphenyl)-7-methylimidazo[1,2-f]phenanthridinato]iridium (III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^2$]iridium (III) tetrakis(1-pyrazolyl)borate (abbreviation: FIr6), bis[2-(4',6'-difluorophenyl)pyridinato-N,C$^2$]iridium(III) picolinate (abbreviation: FIrpic), bis{2-[3',5'-bis(trifluoromethyl) phenyl]pyridinato-N,C$^2$}iridium(III) picolinate (abbreviation: [Ir(CF$_3$ppy)$_2$(pic)]), and bis[2-(4',6'-difluorophenyl)pyridinato-N,C$^2$]iridium(III) acetylacetonate (abbreviation: FIr(acac)). These compounds emit blue phosphorescence having an emission peak at 440 nm to 520 nm.

Other examples include an organometallic iridium complex having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium (III) (abbreviation: [Ir(tBuppm)$_3$]), (acetylacetonato)bis(6-methyl-4-phenylpyrimidinato)iridium(III) (abbreviation: [Ir (mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir (nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato) bis(4,6-diphenylpyrimidinato)iridium(III) (abbreviation: [Ir (dppm)$_2$(acac)]); an organometallic iridium complex having a pyrazine skeleton, such as (acetylacetonato)bis(3,5-dimethyl-2-phenylpyrazinato)iridium(III) (abbreviation: [Ir (mppr-Me)$_2$(acac)]) and (acetylacetonato)bis(5-isopropyl-3-methyl-2-phenylpyrazinato)iridium(III) (abbreviation: [Ir (mppr-iPr)$_2$(acac)]); an organometallic iridium complex having a pyridine skeleton, such as tris(2-phenylpyridinato-N,C$^2$)iridium(III) (abbreviation: [Ir(ppy)$_3$]), bis(2-phenylpyridinato-N,C$^2$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo [h]quinolinato)iridium(III) (abbreviation: [Ir(bzq)$_3$]), tris(2-phenylquinolinato-N,C$^2$)iridium(III) (abbreviation: [Ir(pq)$_3$]), and bis(2-phenylquinolinato-N,C$^2$)iridium(III) acetylacetonate (abbreviation: [Ir(pq)$_2$(acac)]); and a rare earth metal complex such as tris(acetylacetonato) (monophenanthroline)terbium(III) (abbreviation: [Tb(acac)$_3$ (Phen)]). These compounds mainly emit green phosphorescence having an emission peak at 500 nm to 600 nm. Note that an organometallic iridium complex having a pyrimidine skeleton has distinctively high reliability and emission efficiency and thus is especially preferable.

Other examples include an organometallic iridium complex having a pyrimidine skeleton, such as (diisobutyrylmethanato)bis[4,6-bis(3-methylphenyl)pyrimidinato] iridium(III) (abbreviation: [Ir(5mdppm)$_2$(dibm)]), bis[4,6-bis(3-methylphenyl)pyrimidinato](dipivaloylmethanato) iridium(III) (abbreviation: [Ir(5mdppm)$_2$(dpm)]), and bis[4,6-di(naphthalen-1-yl)pyrimidinato](dipivaloylmethanato) iridium(III) (abbreviation: [Ir(d1npm)$_2$(dpm)]); an organometallic iridium complex having a pyrazine skeleton, such as (acetylacetonato)bis(2,3,5-triphenylpyrazinato) iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), and (acetylacetonato)bis[2,3-bis (4-fluorophenyl)quinoxalinato]iridium(III) (abbreviation: [Ir(Fdpq)$_2$(acac)]); an organometallic iridium complex having a pyridine skeleton, such as tris(1-phenylisoquinolinato-N,C$^2$)iridium(III) (abbreviation: [Ir(piq)$_3$]) and bis(1-phenylisoquinolinato-N,C$^2$)iridium(III) acetylacetonate (abbreviation: [Ir(piq)$_2$(acac)]); a platinum complex such as 2,3,7,8,12,13,17,18-octaethyl-21H,23H-porphyrin platinum (II) (abbreviation: PtOEP); and a rare earth metal complex such as tris(1,3-diphenyl-1,3-propanedionato)(monophenanthroline)europium(III) (abbreviation: [Eu(DBM)$_3$ (Phen)]) and tris[1-(2-thenoyl)-3,3,3-trifluoroacetonato] (monophenanthroline)europium(III) (abbreviation: [Eu (TTA)$_3$(Phen)]). These compounds emit red phosphorescence having an emission peak at 600 nm to 700 nm. Furthermore, an organometallic iridium complex having a pyrazine skeleton can emit red light with favorable chromaticity.

Besides the above phosphorescent compounds, known phosphorescent materials may be selected and used.

Examples of the TADF material include a fullerene, a derivative thereof, an acridine, a derivative thereof, and an eosin derivative. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP), which are represented by the following structural formulae.

[Chemical Formulae 1]
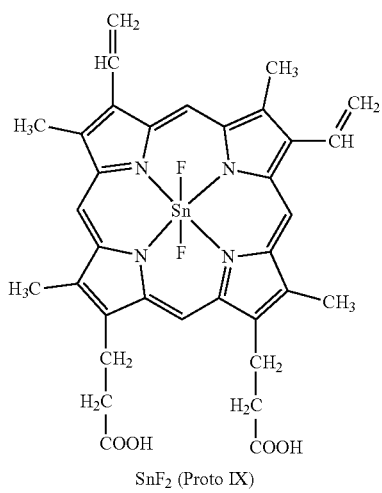
SnF$_2$ (Proto IX)
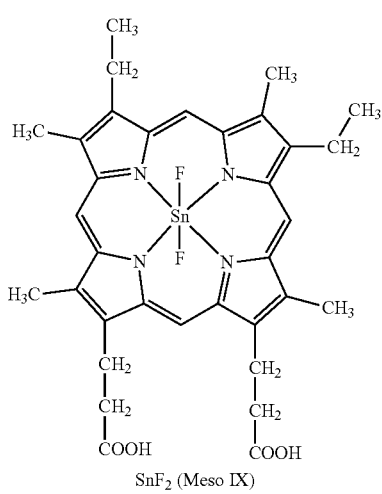
SnF$_2$ (Meso IX)
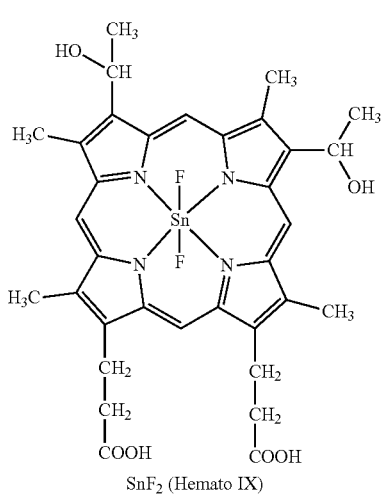
SnF$_2$ (Hemato IX)
-continued
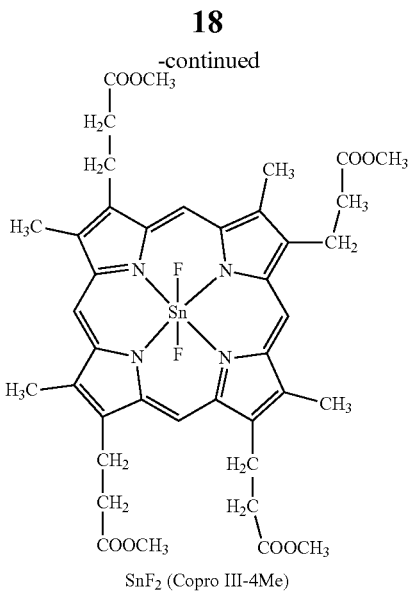
SnF$_2$ (Copro III-4Me)
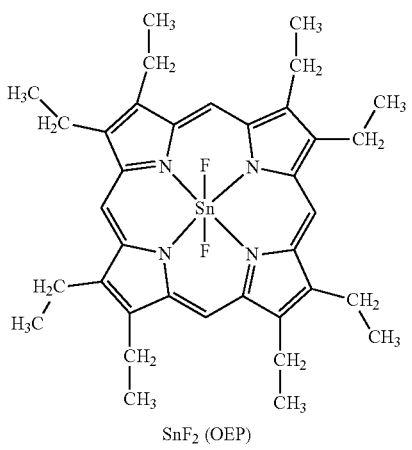
SnF$_2$ (OEP)
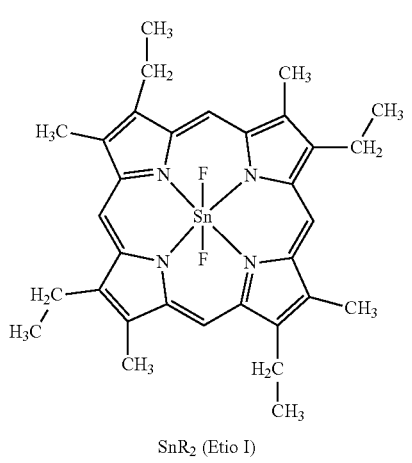
SnR$_2$ (Etio I)

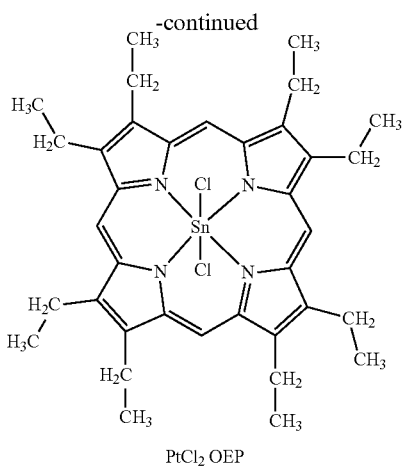

PtCl₂ OEP

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, or a pyridazine skeleton), and a triazine skeleton are preferable because of their high stability and reliability. In particular, a benzofuropyrimidine skeleton, a benzothienopyrimidine skeleton, a benzofuropyrazine skeleton, and a benzothienopyrazine skeleton are preferable because of their high acceptor properties and reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. As a furan skeleton, a dibenzofuran skeleton is preferable. As a thiophene skeleton, a dibenzothiophene skeleton is preferable. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferable because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, athioxanthene dioxide skeleton, an oxadiazole skeleton, atriazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formulae 2]

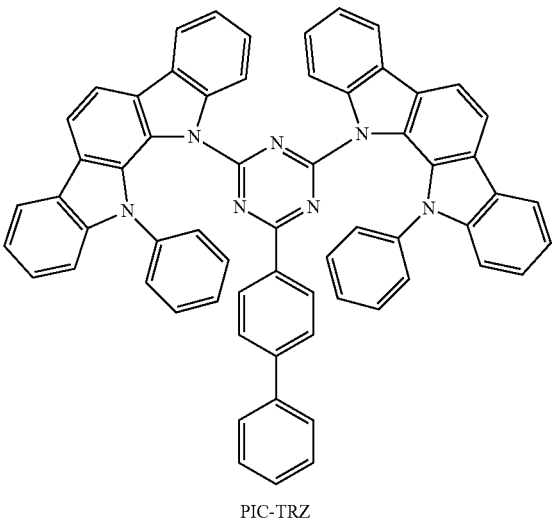

PIC-TRZ

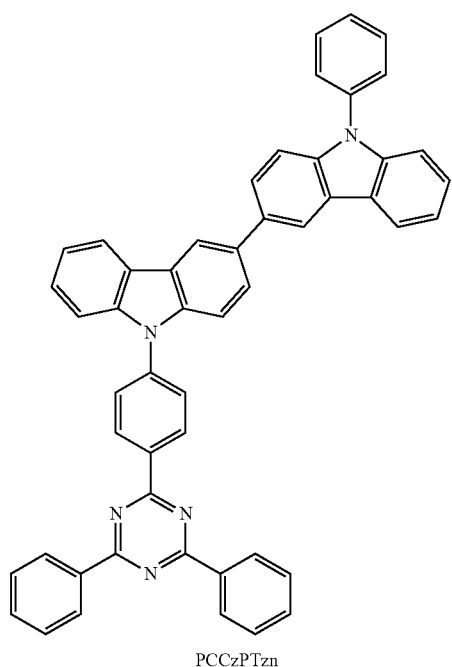
PCCzPTzn
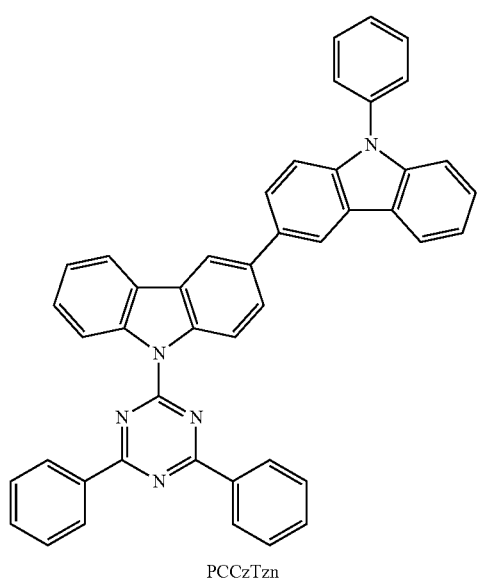
PCCzTzn
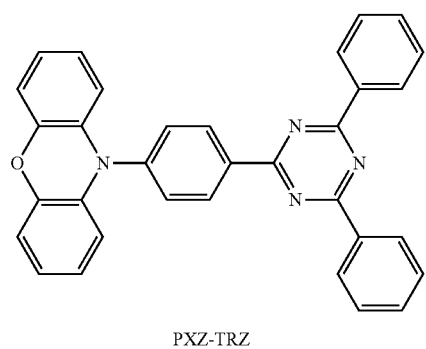
PXZ-TRZ
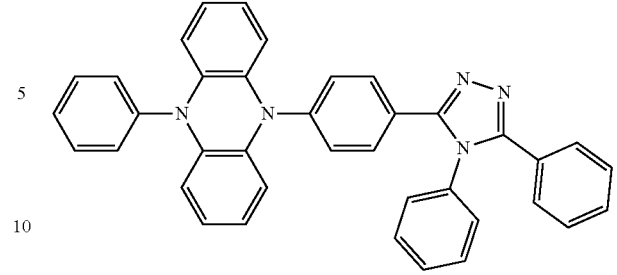
PPZ-3TPT
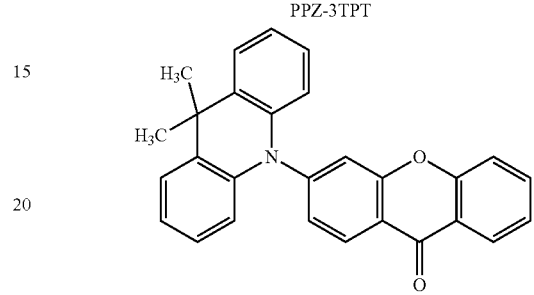
ACRXTN
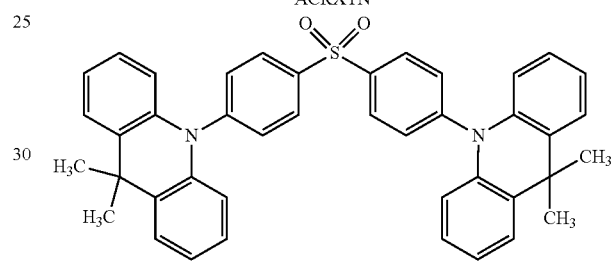
DMAC-DPS
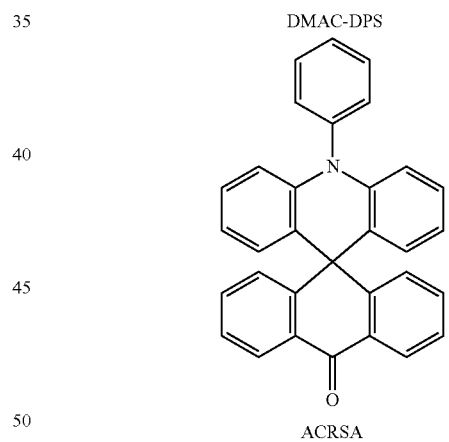
ACRSA
The TADF material is preferably a substance represented by any of General Formulae (G1) to (G11) below.
[Chemical Formulae 3]
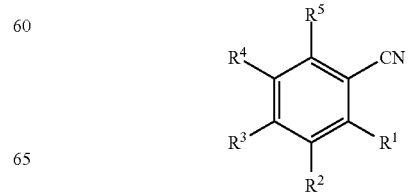
(G1)

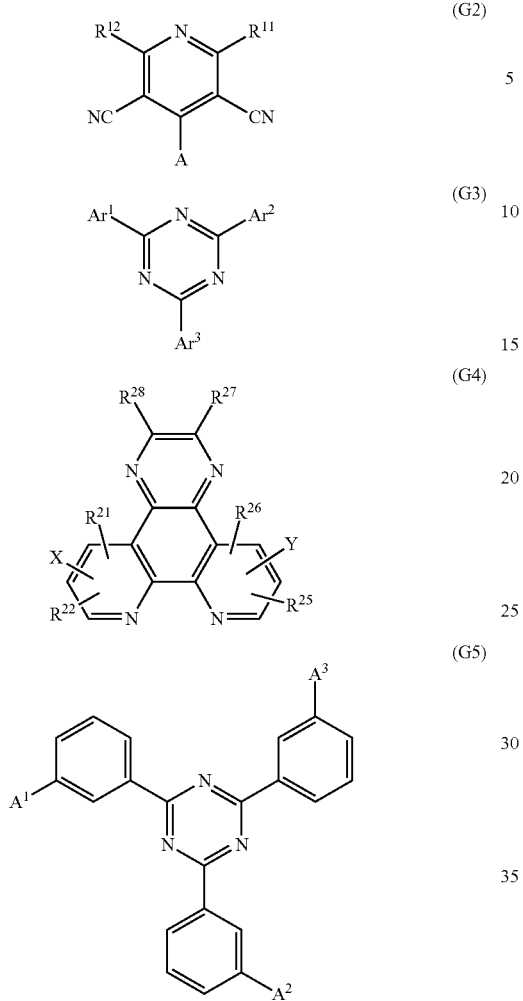
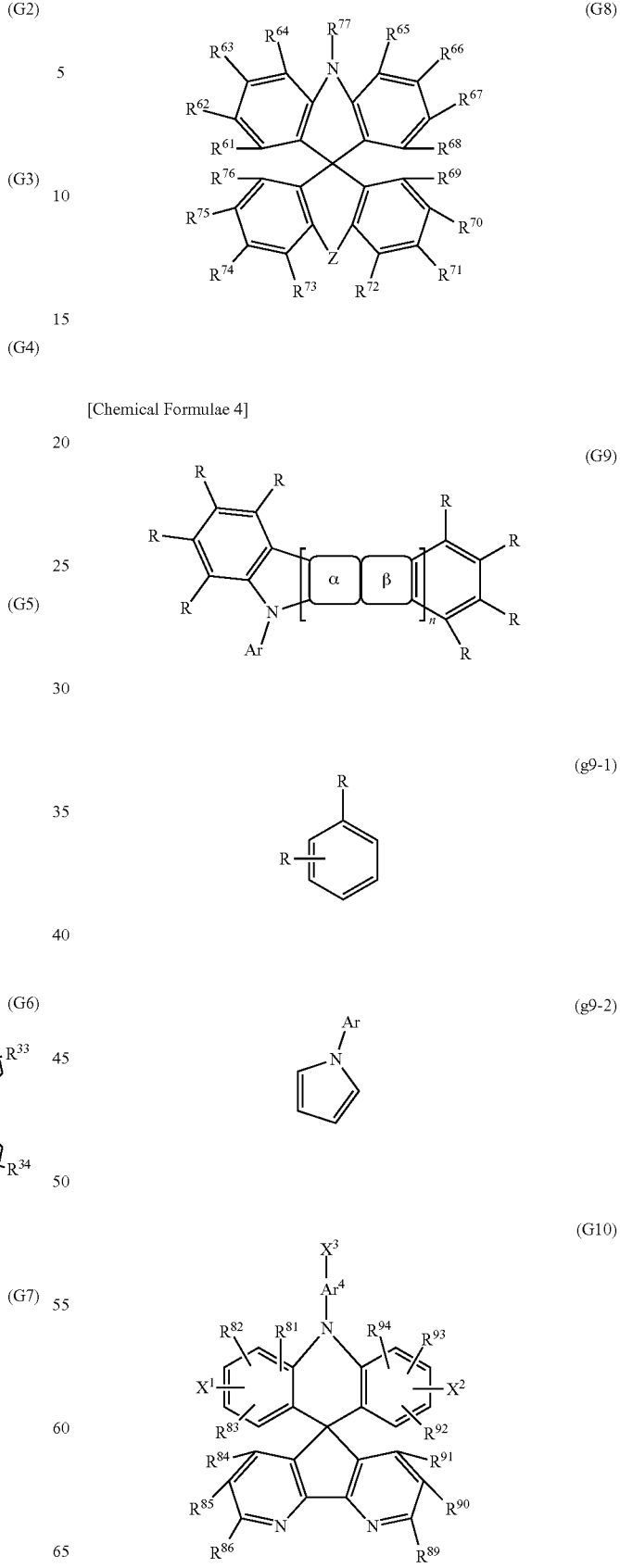

(G11)

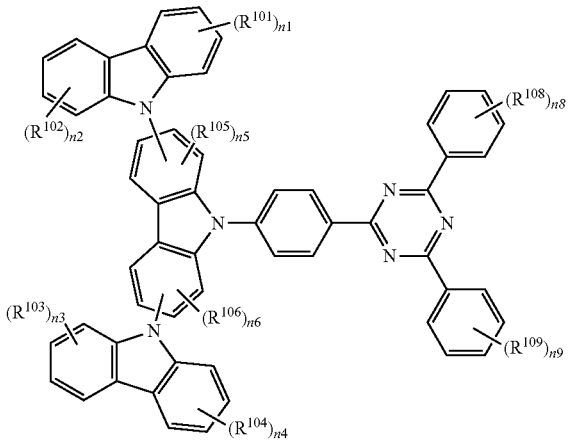

In General Formula (G1) above, at least one of $R^1$ to $R^5$ represents a cyano group, at least one of $R^1$ to $R^5$ represents a substituted or unsubstituted 9-carbazolyl group, a substituted or unsubstituted 1,2,3,4-tetrahydro-9-carbazolyl group, a substituted or unsubstituted 1-indolyl group, or a substituted or unsubstituted diarylamino group, and the others of $R^1$ to $R^5$ each independently represent a hydrogen atom or a substituent.

In General Formula (G2) above, $R^{11}$ and $R^{12}$ each independently represent a hydrogen atom or an arbitrary substituent, and A represents a substituent in which at least one heteroaryl group that may have a substituent or at least one arylamino group that may have a substituent is bonded to the 4-position carbon of a pyridine ring directly or through an aromatic group.

In General Formula (G3) above, $Ar^1$ to $Ar^3$ each represent an aryl group and at least one of $Ar^1$ to $Ar^3$ represents an aryl group substituted by a dibenzo-1,4-oxazine group or a dibenzo-1,4-thiazine group.

In General Formula (G4) above, X represents a substituted or unsubstituted aromatic hydrocarbon group; a substituted or unsubstituted aromatic heterocyclic group; a substituted or unsubstituted condensed polycyclic aromatic group; or a disubstituted amino group substituted by groups selected from an aromatic hydrocarbon group, an aromatic heterocyclic group, and a condensed polycyclic aromatic group. Y represents a hydrogen atom; a deuterium atom; a fluorine atom; a chlorine atom; a cyano group; a nitro group; a linear or branched alkyl group that may have a substituent and has 1 to 6 carbon atoms; a cycloalkyl group that may have a substituent and has 5 to 10 carbon atoms; a linear or branched alkenyl group that may have a substituent and has 2 to 6 carbon atoms; a linear or branched alkyloxy group that may have a substituent and has 1 to 6 carbon atoms; a cycloalkyloxy group that may have a substituent and has 5 to 10 carbon atoms; a substituted or unsubstituted aromatic hydrocarbon group; a substituted or unsubstituted aromatic heterocyclic group; a substituted or unsubstituted condensed polycyclic aromatic group; a substituted or unsubstituted aryloxy group; or a disubstituted amino group substituted by groups selected from an aromatic hydrocarbon group, an aromatic heterocyclic group, and a condensed polycyclic aromatic group. $R^{21}$, $R^{22}$, and $R^{25}$ to $R^{28}$, which may be the same or different from each other, each independently represent a hydrogen atom; a deuterium atom; a fluorine atom; a chlorine atom; a cyano group; a nitro group; a linear or branched alkyl group that may have a substituent and has 1 to 6 carbon atoms; a cycloalkyl group that may have a substituent and has 5 to 10 carbon atoms; a linear or branched alkenyl group that may have a substituent and has 2 to 6 carbon atoms; a linear or branched alkyloxy group that may have a substituent and has 1 to 6 carbon atoms; a cycloalkyloxy group that may have a substituent and has 5 to 10 carbon atoms; a substituted or unsubstituted aromatic hydrocarbon group; a substituted or unsubstituted aromatic heterocyclic group; a substituted or unsubstituted condensed polycyclic aromatic group; a substituted or unsubstituted aryloxy group; or a disubstituted amino group substituted by groups selected from an aromatic hydrocarbon group, an aromatic heterocyclic group, and a condensed polycyclic aromatic group. $R^{21}$, $R^{22}$, and $R^{25}$ to $R^{28}$ may be bonded to each other through a single bond, a substituted or unsubstituted methylene group, an oxygen atom, or a sulfur atom to form a ring.

In General Formula (G5) above, $A^1$ to $A^3$ each independently represent a substituted or unsubstituted dibenzofuranyl group.

In General Formula (G6) above, $R^{31}$ to $R^{34}$ and a to h each independently represent a hydrogen atom, a substituted or unsubstituted alkyl group having 1 to 20 carbon atoms, a substituted or unsubstituted alkoxy group having 1 to 20 carbon atoms, a substituted or unsubstituted aryl group having 6 to 20 carbon atoms, or an amino group.

In General Formula (G7) above, $R^{41}$ to $R^{48}$ each independently represent a hydrogen atom or an electron-donating group, and at least one of $R^{41}$ to $R^{48}$ represents an electron-donating group. $R^{49}$ to $R^{56}$ each independently represent a hydrogen atom or an electron-withdrawing group other than a triazino group, and at least one of $R^{49}$ to $R^{56}$ represents an electron-withdrawing group other than a triazino group. Note that 11 to 14 of $R^{41}$ to $R^{56}$ represent hydrogen atoms.

In General Formula (G8) above, $R^{61}$ to $R^{68}$ and $R^{77}$ each independently represent a hydrogen atom or an electron-donating group, and at least one of $R^{61}$ to $R^{68}$ and $R^{77}$ represents an electron-donating group. $R^{69}$ to $R^{76}$ each independently represent a hydrogen atom or an electron-withdrawing group that does not have an unshared electron pair at the α-position. Z represents a single bond or =C=Y, where Y represents S, C(CN)$_2$, or C(COOH)$_2$. Note that when Z represents a single bond, at least one of $R^{69}$ to $R^{76}$ represents an electron-withdrawing group that does not have an unshared electron pair at the α-position.

In General Formula (G9) above, a ring α is an aromatic ring condensed with an adjacent ring at an arbitrary position and represented by Formula (g9-1), and a ring β is a heterocycle condensed with an adjacent ring at an arbitrary position and represented by Formula (g9-2). Ar in Formula (G9) and Ar in Formula (g9-2) each independently represent an aromatic hydrocarbon group or an aromatic heterocyclic group. Rs in Formula (G9) and Rs in Formula (g9-1) each independently represent hydrogen or a monovalent substituent selected from the group consisting of an alkyl group having 1 to 10 carbon atoms, an alkoxy group having 1 to 10 carbon atoms, an alkylthio group having 1 to 10 carbon atoms, an alkylamino group having 1 to 10 carbon atoms, an acyl group having 2 to 10 carbon atoms, an aralkyl group having 7 to 20 carbon atoms, a substituted or unsubstituted aromatic hydrocarbon group having 6 to 30 carbon atoms, and a substituted or unsubstituted six-membered aromatic heterocyclic group having 3 to 30 carbon atoms, and the adjacent substituents may be bonded to each other to form a ring. Note that n represents an integer greater than or equal to 1 and less than or equal to 4.

In General Formula (G10) above, $X^1$, $X^2$, and $X^3$, which may be the same or different from each other, each independently represent a hydrogen atom; a deuterium atom; a fluorine atom; a chlorine atom; a cyano group; a nitro group; a linear or branched alkyl group that may have a substituent and has 1 to 6 carbon atoms; a cycloalkyl group that may have a substituent and has 5 to 10 carbon atoms; a linear or branched alkenyl group that may have a substituent and has 2 to 6 carbon atoms; a linear or branched alkyloxy group that may have a substituent and has 1 to 6 carbon atoms; a cycloalkyloxy group that may have a substituent and has 5 to 10 carbon atoms; a substituted or unsubstituted aromatic hydrocarbon group; a substituted or unsubstituted aromatic heterocyclic group; a substituted or unsubstituted condensed polycyclic aromatic group; a substituted or unsubstituted aryloxy group; or a disubstituted amino group substituted by groups selected from an aromatic hydrocarbon group, an aromatic heterocyclic group, and a condensed polycyclic aromatic group. At least one of $XI$, $X^2$, and $X^3$ represents a substituted or unsubstituted aromatic hydrocarbon group; a substituted or unsubstituted aromatic heterocyclic group; a substituted or unsubstituted condensed polycyclic aromatic group; or a disubstituted amino group substituted by groups selected from an aromatic hydrocarbon group, an aromatic heterocyclic group, and a condensed polycyclic aromatic group. $Ar^4$ represents a substituted or unsubstituted divalent aromatic hydrocarbon group, a substituted or unsubstituted divalent heteroaromatic hydrocarbon group, or a substituted or unsubstituted divalent condensed polycyclic aromatic hydrocarbon group. $R^{81}$ to $R^{86}$ and $R^{89}$ to $R^{94}$, which may be the same or different from each other, each independently represent a hydrogen atom; a deuterium atom; a fluorine atom; a chlorine atom; a cyano group; a nitro group; a linear or branched alkyl group that may have a substituent and has 1 to 6 carbon atoms; a cycloalkyl group that may have a substituent and has 5 to 10 carbon atoms; a linear or branched alkenyl group that may have a substituent and has 2 to 6 carbon atoms; a linear or branched alkyloxy group that may have a substituent and has 1 to 6 carbon atoms; a cycloalkyloxy group that may have a substituent and has 5 to 10 carbon atoms; a substituted or unsubstituted aromatic hydrocarbon group; a substituted or unsubstituted aromatic heterocyclic group; a substituted or unsubstituted condensed polycyclic aromatic group; a substituted or unsubstituted aryloxy group; or a disubstituted amino group substituted by groups selected from an aromatic hydrocarbon group, an aromatic heterocyclic group, and a condensed polycyclic aromatic group. $R^{81}$ to $R^{16}$ and $R^{89}$ to $R^{94}$ may be bonded to each other through a single bond, a substituted or unsubstituted methylene group, an oxygen atom, or a sulfur atom to form a ring.

In General Formula (G11) above, $R^{101}$ to $R^{104}$ each independently represent a substituted or unsubstituted aryl group, a substituted or unsubstituted heteroaryl group, a substituted or unsubstituted alkyl group, or a substituted or unsubstituted cycloalkyl group, $R^{105}$ and $R^{106}$ each independently represent a substituted or unsubstituted alkyl group, $R^{107}$, $R^{108}$, and $R^{109}$ each independently represent a substituted or unsubstituted aryl group or a substituted or unsubstituted alkyl group, n1 to n4 and n7 each independently represent an integer selected from 0 to 4, n5 and n6 each independently represent an integer selected from 0 to 3, and n8 and n9 each independently represent an integer selected from 0 to 5. When n1 to n9, which respectively correspond to $R^{101}$ to $R^{109}$, are each an integer of 2 or more, $R^{101}$s may be the same or different from each other and the same applies to $R^{102}$ to $R^{109}$.

Note that a TADF material is a material having a small difference between the Si level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into light emission.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at low temperatures (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably less than or equal to 0.3 eV, further preferably less than or equal to 0.2 eV.

When the TADF material is used as an emission center substance, the S1 level and the T1 level of the host material are preferably higher than those of the TADF material.

As the host material in the light-emitting layer, various carrier-transport materials such as a material having an electron-transport property, a material having a hole-transport property, and the TADF material can be used.

As the material having a hole-transport property, an organic compound having an amine skeleton or a π-electron rich heteroaromatic ring skeleton is preferably used. Examples of the material having a hole-transport property include compounds having an aromatic amine skeleton, such as 4,4'-bis[N-(1-naphthyl)-N-phenylamino]biphenyl (abbreviation: NPB), N,N-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6- phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. In addition, the organic compounds given as examples of the above second organic compound can be used.

As the material having an electron-transport property, for example, a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ) or an organic compound having a π-electron deficient heteroaromatic ring skeleton is preferably used. Examples of the organic compound having a π-electron deficient heteroaromatic ring skeleton include a heterocyclic compound having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); and a heterocyclic compound having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above materials, the heterocyclic compound having a diazine skeleton and the heterocyclic compound having a pyridine skeleton have high reliability and thus are preferable. In particular, the heterocyclic compound having a diazine (pyrimidine or pyrazine) skeleton has an excellent electron-transport property to contribute to a reduction in driving voltage.

As the TADF material that can be used as the host material, the above-mentioned TADF materials can also be used. When the TADF material is used as the host material, triplet excitation energy generated in the TADF material is converted into singlet excitation energy by reverse intersystem crossing and transferred to the emission center substance, whereby the emission efficiency of the light-emitting device can be increased. Here, the TADF material functions as an energy donor, and the emission center substance functions as an energy acceptor.

This is very effective in the case where the emission center substance is a fluorescent substance. In that case, the Si level of the TADF material is preferably higher than the Si level of the fluorescent substance in order that high emission efficiency can be achieved. Furthermore, the T1 level of the TADF material is preferably higher than the Si level of the fluorescent substance. Therefore, the T1 level of the TADF material is preferably higher than the T1 level of the fluorescent substance.

A TADF material that emits light whose wavelength overlaps with the wavelength on a lowest-energy-side absorption band of the fluorescent substance is preferably used, in which case excitation energy is transferred smoothly from the TADF material to the fluorescent substance and light emission can be obtained efficiently.

In addition, in order that singlet excitation energy can be efficiently generated from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituent having no π bond has a poor carrier-transport property, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the emission center substance, a material having an anthracene skeleton is suitably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-βNPAnth). Note that CzPA, cgDBCzPA, 2mBnfPPA, and PCzPA are preferably selected because of their excellent characteristics.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the emission center substance, a phosphorescent substance can be used as an energy donor for supplying excitation energy to the fluorescent substance.

An exciplex may be formed of these mixed materials. When these mixed materials are selected so as to form an exciplex that exhibits light emission whose wavelength overlaps with the wavelength on a lowest-energy-side absorption band of the light-emitting material, energy can be transferred smoothly and light emission can be obtained efficiently. The use of such a structure is preferred because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to the HOMO level of the material having an electron-transport property is preferable for forming an exciplex efficiently. In addition, the LUMO level of the material having a hole-transport property is preferably higher than or equal to the LUMO level of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectrum of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response (e.g., a phenomenon in which the transient photoluminescence (PL) lifetime of the mixed film has more long lifetime components or has a larger proportion of delayed components than that of each of the materials) observed by comparison of transient PL of the material having a hole-transport property, the material having an electron-transport property, and the mixed film of the materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of the materials.

The electron-transport layer 114 is provided in contact with the light-emitting layer 113 as illustrated in FIG. 1A1 and contains a seventh organic compound and a first substance. The seventh organic compound preferably has an electron-transport property that is higher than a hole-transport property. The electron mobility of the seventh organic compound is preferably higher than or equal to $1 \times 10^{-7}$ cm$^2$/Vs and lower than or equal to $5 \times 10^{-5}$ cm$^2$/Vs when the square root of the electric field strength [V/cm] is 600. The number of electrons injected into the light-emitting layer can be controlled by a reduction in the electron-transport property of the electron-transport layer, whereby the light-emitting layer can be prevented from having excess electrons.

The seventh organic compound preferably has an anthracene skeleton and further preferably has both an anthracene skeleton and a heterocyclic skeleton. The heterocyclic skeleton is preferably a nitrogen-containing five-membered ring skeleton. In particular, the seventh organic compound preferably has a nitrogen-containing five-membered ring skeleton including two heteroatoms in a ring, such as a pyrazole ring, an imidazole ring, an oxazole ring, or a thiazole ring.

The first substance is any of an alkali metal, an alkaline earth metal, an organic complex of an alkali metal or an alkaline earth metal, and a compound of an alkali metal or an alkaline earth metal. Examples of the first substance include Li and Li$_2$O. An organic complex of lithium is particularly preferable, and 8-hydroxyquinolinatolithium (abbreviation: Liq) is especially preferable.

Note that a mixing ratio of the seventh organic compound to the first substance differs between regions of the electron-transport layer 114 in the thickness direction. The mixing ratio of the first substance to the seventh organic compound on the cathode side is preferably low. The mixing ratio can be presumed by the number of atoms or molecules measured by time-of-flight secondary ion mass spectrometry (ToF-SIMS). In regions containing the same two kinds of materials with different mixing ratios, the mixing ratios measured by ToF-SIMS analysis correspond to the proportions of atoms or molecules in the regions. Thus, comparison between the detected amount of seventh organic compound and the detected amount of first substance enables presumption of the mixing ratio.

That is, in the electron-transport layer 114, a region where the amount of seventh organic compound is small is closer to the light-emitting layer than a region where the amount of seventh organic compound is large is. In other words, in the electron-transport layer 114, a region where the amount of first substance is large is closer to the light-emitting layer than a region where the amount of first substance is small is.

The electron mobility of the region where the amount of seventh organic compound is large (the region where the amount of first substance is small) is preferably higher than or equal to $1\times10^{-7}$ cm$^2$/Vs and lower than or equal to $5\times10^{-5}$ cm$^2$/Vs when the square root of the electric field strength [V/cm] is 600.

As illustrated in FIG. 1A2, the electron-transport layer 114 preferably includes the first electron-transport layer 114-1 and the second electron-transport layer 114-2 in this order from the light-emitting layer 113 side. The mixing ratio of the seventh organic compound to the first substance differs between the first electron-transport layer 114-1 and the second electron-transport layer 114-2. Specifically, it is preferable that the mixing ratio of the first substance to the seventh organic compound in the first electron-transport layer 114-1 be higher than that in the second electron-transport layer 114-2, and the mixing ratio of the seventh organic compound to the first substance in the first electron-transport layer 114-1 be lower than that in the second electron-transport layer 114-2. Note that the mixing ratios can be presumed by the number of atoms or molecules measured by ToF-SIMS analysis as described above. That is, it is preferable that the amount of first substance in the first electron-transport layer 114-1 be larger than that in the second electron-transport layer 114-2, and the amount of seventh organic compound in the first electron-transport layer 114-1 be smaller than that in the second electron-transport layer 114-2.

Another layer may be provided between the first electron-transport layer 114-1 and the second electron-transport layer 114-2 as long as the first electron-transport layer 114-1 is closer to the light-emitting layer 113 than the second electron-transport layer 114-2 is.

When there is no clear boundary between the layers in the electron-transport layer 114 as in FIG. 1A1, the amount ratio of the first substance to the seventh organic compound may continuously change as in FIGS. 23A1 and 23A2, whereas when there is a boundary between the layers in the electron-transport layer 114 as in FIG. 1A2, the amount ratio of the first substance to the seventh organic compound may change stepwise as in FIGS. 23B1 and 23B2. In any case, it is important that in the electron-transport layer 114, a region where the concentration of the first substance is high is provided closer to the light-emitting layer 113 than a region where the concentration of the first substance is low, which determines the electron mobility. Note that although the amount, the concentration, and the mixing ratio are presumed by ToF-SIMS for convenience in this specification, another method may be employed as long as the amount, the concentration, and the mixing ratio can be measured.

Figure 24A:
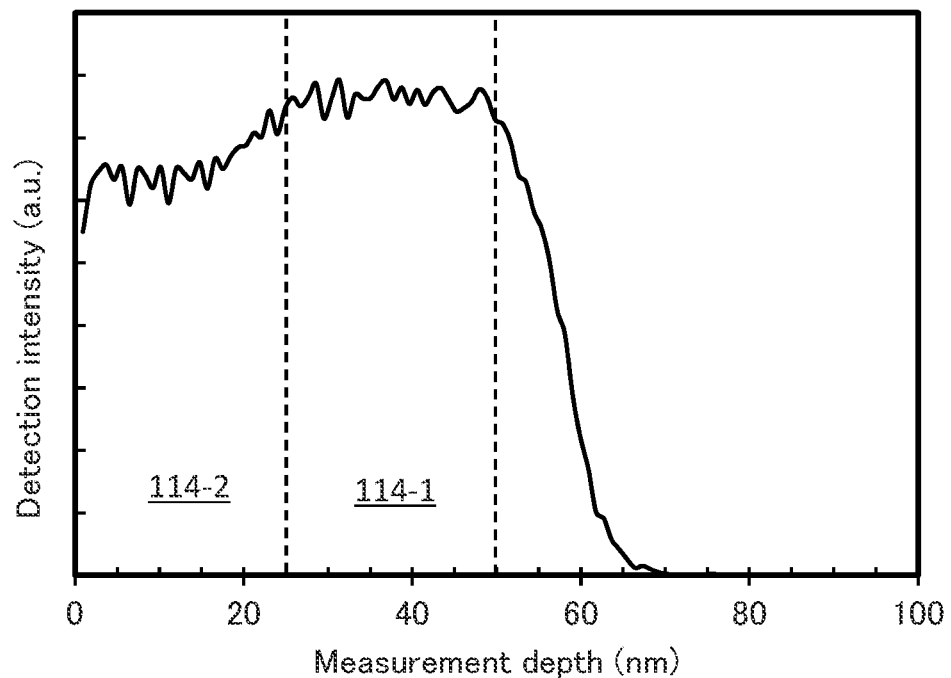
FIGS. 24A and 24B show ToF-SIMS analysis results.
Figure 24B:
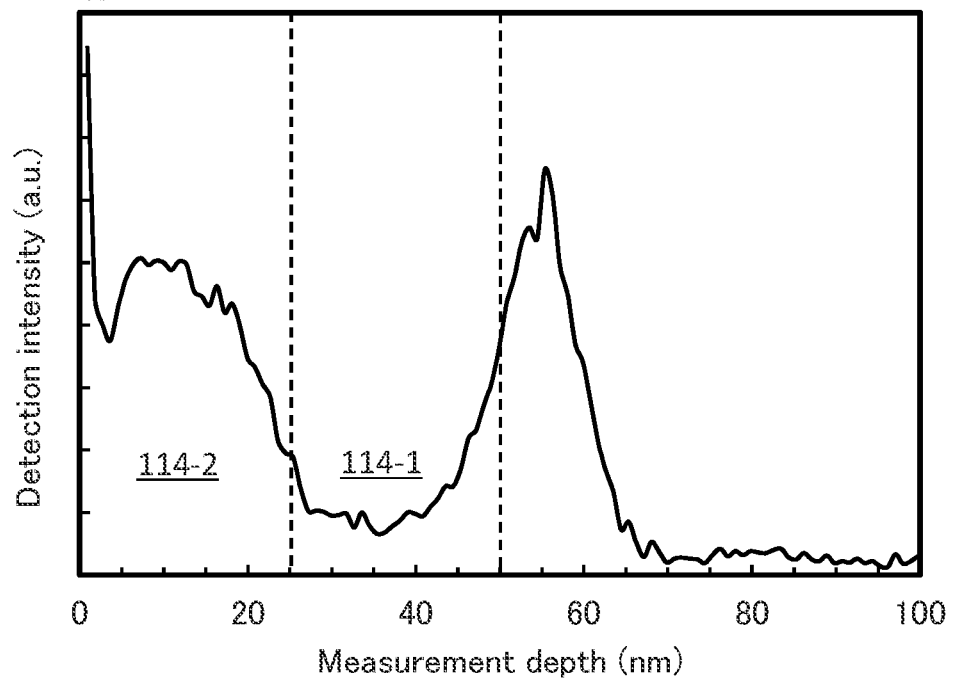

FIGS. 24A and 24B show the ToF-SIMS analysis results of the light-emitting device of one embodiment of the present invention. FIG. 24A shows the detection results of lithium atoms with m/z of 6, and FIG. 24B shows the detection results of the number of molecules that correspond to an organic compound used as the seventh organic compound. Although the detection sensitivity differs between FIGS. 24A and 24B, both FIGS. 24A and 24B show the detection intensity that reflects the device structure and the mixing ratio.

The seventh organic compound preferably has an electron-transport property and a HOMO level of −6.0 eV or higher.

Alternatively, as the electron-transport organic compound that can be used as the seventh organic compound, any of the above-mentioned electron-transport organic compounds that can be used as the host material, and the above-mentioned organic compounds that can be used as the host material for the fluorescent substance can be used.

The electron mobility of the seventh organic compound when the square root of the electric field strength [V/cm] is 600 is preferably lower than that of the sixth organic compound or the light-emitting layer 113.

Figure 2B:
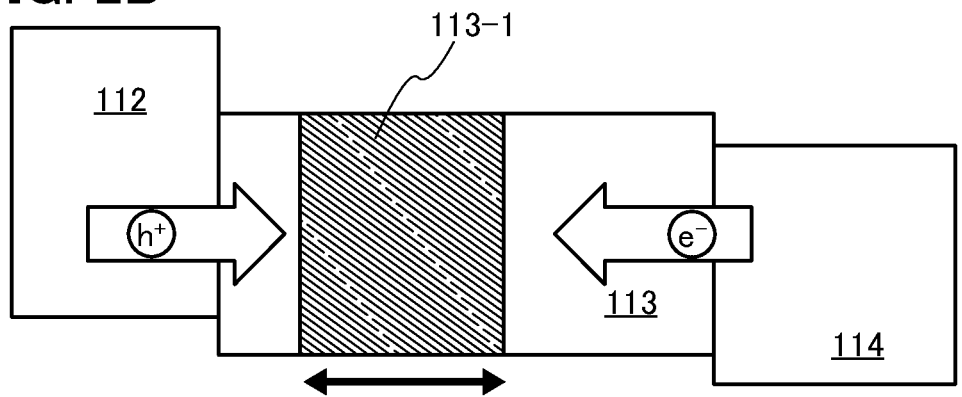

When the light-emitting layer has excess electrons, as illustrated in FIG. 2A, a light-emitting region 113-1 is limited to a part and a great strain is imposed on the part, which promotes degradation. In addition, electrons failing to recombine and passing through the light-emitting layer also diminish a lifetime and emission efficiency. In one embodiment of the present invention, a reduction in the electron-transport property of the electron-transport layer 114 expands the light-emitting region 113-1 as illustrated in FIG. 2B and spreads the strain on the material included in the light-emitting layer 113. Thus, a light-emitting device having a long lifetime and high emission efficiency can be provided.

The luminance decay curve of a light-emitting device having such a structure, which is obtained by a driving test at a constant current density, sometimes has the maximum value. In other words, the decay curve of the light-emitting device of one embodiment of the present invention may have a portion where the luminance increases with time. The light-emitting device showing such a degradation behavior enables a rapid decay at the initial driving stage, which is called an initial decay, to be canceled out by the luminance increase. Thus, the light-emitting device can have an extremely long driving lifetime with a smaller initial decay. Such a light-emitting device is referred to as a recombination-site tailoring injection (ReSTI) device.

A differential value of such a decay curve having the maximum value is 0 in a part. Thus, the light-emitting device of one embodiment of the present invention with a decay curve having a differential value of 0 in a part can have an extremely long lifetime with a smaller initial decay.

Figure 3A:
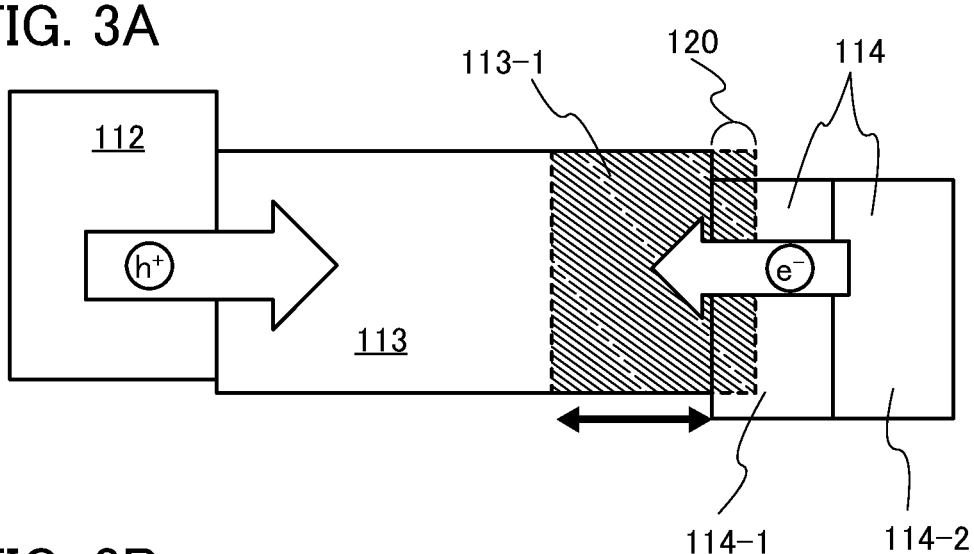
FIGS. 3A and 3B are diagrams for explaining a luminance increase.

The above degradation behavior is probably caused by recombination that occurs because of a low electron mobility in the electron-transport layer and does not contribute to light emission in anon-light-emitting recombination region 120, as illustrated in FIG. 3A. In the light-emitting device of the present invention having the above-described structure, a hole injection barrier is small at the initial driving stage and the electron-transport property of the electron-transport layer 114 is relatively low; accordingly, the light-emitting region 113-1 (i.e., recombination region) is formed on the electron-transport layer 114 side. Since the seventh organic compound contained in the electron-transport layer 114 has a relatively high HOMO level of −6.0 eV or higher, some holes even reach the electron-transport layer 114 to cause recombination also in the electron-transport layer 114; thus, the non-light-emitting recombination region 120 is formed. The recombination region reaches the inside of the electron-transport layer 114; hence, the difference between the HOMO levels of the sixth organic compound and the seventh organic compound is preferably 0.2 eV or less.

Figure 3B:
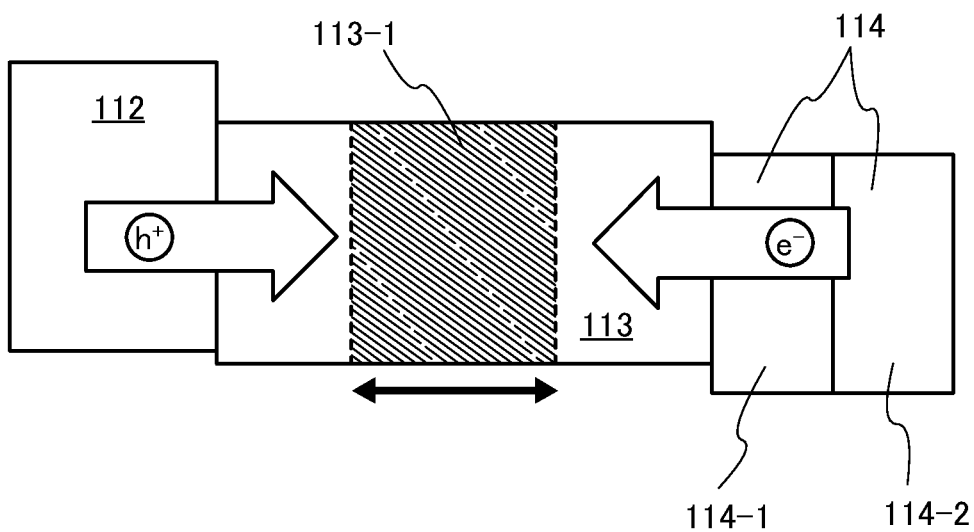

In the light-emitting device of one embodiment of the present invention, the carrier balance changes over the driving time, and the light-emitting region 113-1 (recombination region) moves toward the hole-transport layer 112 side as shown in FIG. 3B. A reduction in the area of the non-light-emitting recombination region 120 allows energy of recombined carriers to contribute to light emission effectively, so that the luminance increases as compared with that at the initial driving stage. This luminance increase cancels out the rapid luminance decrease at the initial driving stage, which is called the initial decay, of the light-emitting device. Thus, the light-emitting device can have a long driving lifetime with a smaller initial decay.

A change in the electron mobility of the electron-transport layer 114 probably brings about a change in carrier balance in the light-emitting device of one embodiment of the present invention. The concentration of an organometallic complex or compound of an alkali metal or an alkaline earth metal (first substance) differs in the electron-transport layer 114 in the light-emitting device of one embodiment of the present invention; a region with a high concentration of the first substance exists between a region with a low concentration of the first substance and the light-emitting layer. That is, the region with a low concentration of the first substance is closer to the cathode than the region with a high concentration of the first substance is. A higher concentration of an organometallic complex or compound of an alkali metal or an alkaline earth metal results in a higher electron mobility of the electron-transport layer 114; therefore, the electron mobility of the electron-transport layer 114 depends on the region with a low concentration of an organometallic complex or compound of an alkali metal or an alkaline earth metal.

The present inventors have found that an organometallic complex or compound of an alkali metal or an alkaline earth metal (first substance) diffuses from the anode side to the cathode side (from the region with a high concentration to the region with a low concentration) by voltage applied to the light-emitting device for driving. That is, since the region with a high concentration of the first substance is closer to the anode than the region with a low concentration of the first substance is, the electron mobility of the electron-transport layer increases with driving. This causes a change in carrier balance in the light-emitting device, which is accompanied by the movement of the recombination region; thus, the light-emitting device with the above decay curve and a long lifetime can be obtained.

The light-emitting device of one embodiment of the present invention having the above-described structure can have an extremely long lifetime. In particular, a lifetime until when the luminance decreases to approximately 95% of the initial luminance (LT95), which means that the decay is extremely small, can be significantly extended.

When the initial decay can be reduced, the problem of burn-in, which has still been mentioned as a great drawback of organic EL devices, and the time and effort for aging for reducing the problem before shipment can be significantly reduced.

Embodiment 2

Next, examples of specific structures and materials of the aforementioned light-emitting device are described. As described above, the light-emitting device of one embodiment of the present invention includes the EL layer 103 that is positioned between the pair of electrodes (the anode 101 and the cathode 102) and has a plurality of layers. In the EL layer 103, at least the hole-injection layer 111, the first hole-transport layer 112-1, the second hole-transport layer 112-2, the light-emitting layer 113, and the electron-transport layer 114 are provided from the anode 101 side.

There is no particular limitation on the other layers included in the EL layer 103, and various layers such as a hole-injection layer, a hole-transport layer, an electron-transport layer, an electron-injection layer, a carrier-blocking layer, an exciton-blocking layer, and a charge-generation layer can be employed.

The anode 101 is preferably formed using a metal, an alloy, a conductive compound with a high work function (specifically, a work function of 4.0 eV or higher), a mixture thereof, or the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method but may be formed by application of a sol-gel method or the like. In an example of the formation method, indium oxide-zinc oxide is deposited by a sputtering method using a target obtained by adding 1 wt % to 20 wt % of zinc oxide to indium oxide. Furthermore, indium oxide containing tungsten oxide and zinc oxide (IWZO) can be deposited by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that although the typical materials for forming the anode are listed above, a composite material of an organic compound having a hole-transport property and a substance exhibiting an electron-accepting property with respect to the organic compound is used for the hole-injection layer 111 of one embodiment of the present invention; thus, an electrode material can be selected regardless of its work function.

Two kinds of stacked layer structure of the EL layer 103 are described: structures illustrated in FIGS. 1A1 and 1A2, each of which includes the electron-injection layer 115 in addition to the hole-injection layer 111, the first hole-transport layer 112-1, the second hole-transport layer 112-2, the light-emitting layer 113, and the electron-transport layer 114 (the first electron-transport layer 114-1 and the second electron-transport layer 114-2); and a structure illustrated in FIG. 1B, which includes a charge-generation layer 116 instead of the electron-injection layer 115. Materials for the layers will be specifically described below.

Since the hole-injection layer 111, the hole-transport layer 112 (the hole-transport layer 112-1 and the hole-transport layer 112-2), the light-emitting layer 113, and the electron-transport layer 114 (the electron-transport layer 114-1 and the electron-transport layer 114-2) are described in detail in Embodiment 1, the description thereof is not repeated. Refer to the description in Embodiment 1.

A layer containing an alkali metal, an alkaline earth metal, or a compound thereof such as lithium fluoride (LiF), cesium fluoride (CsF), or calcium fluoride ($CaF_2$) may be provided as the electron-injection layer 115 between the electron-transport layer 114 and the cathode 102. For example, an electride or a layer that is formed using a substance having an electron-transport property and that contains an alkali metal, an alkaline earth metal, or a compound thereof may be used as the electron-injection layer 115. Examples of the electride include a substance in which electrons are added at high concentration to calcium oxide-aluminum oxide.

Instead of the electron-injection layer 115, the charge-generation layer 116 may be provided between the electron-transport layer 114 and the cathode 102 (FIG. 1B). The charge-generation layer 116 refers to a layer capable of injecting holes into a layer in contact with the cathode side of the charge-generation layer 116 and electrons into a layer in contact with the anode side thereof when a potential is applied. The charge-generation layer 116 includes at least a p-type layer 117. The p-type layer 117 is preferably formed using any of the composite materials given above as examples of the material that can be used for the hole-injection layer 111. The p-type layer 117 may be formed by stacking a film containing the above-described acceptor material as a material included in the composite material and a film containing a hole-transport material. When a potential is applied to the p-type layer 117, electrons are injected into the electron-transport layer 114 and holes are injected into the cathode 102; thus, the light-emitting device operates.

Note that the charge-generation layer 116 preferably includes an electron-relay layer 118 and/or an electron-injection buffer layer 119 in addition to the p-type layer 117.

The electron-relay layer 118 contains at least the substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the electron-accepting substance in the p-type layer 117 and the LUMO level of a substance contained in a layer of the electron-transport layer 114 that is in contact with the charge-generation layer 116. As a specific value of the energy level, the LUMO level of the substance having an electron-transport property in the electron-relay layer 118 is preferably higher than or equal to −5.0 eV, further preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

A substance having an excellent electron-injection property can be used for the electron-injection buffer layer 119. For example, an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)) can be used.

In the case where the electron-injection buffer layer 119 contains the substance having an electron-transport property and a substance having an electron-donating property, an organic compound such as tetrathianaphthacene (abbreviation: TTN), nickelocene, or decamethylnickelocene, as well as an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)), can be used as the substance having an electron-donating property. As the substance having an electron-transport property, a material similar to the above-described material for the electron-transport layer 114 can be used.

For the cathode 102, a metal, an alloy, an electrically conductive compound, a mixture thereof with a low work function (specifically, a work function of 3.8 eV or lower), or the like can be used. Specific examples of such a cathode material include elements belonging to Groups 1 and 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode 102 and the electron-transport layer, a variety of conductive materials such as Al, Ag, ITO, or indium oxide-tin oxide containing silicon or silicon oxide can be used for the cathode 102 regardless of the work function. Films of these conductive materials can be formed by a dry process such as a vacuum evaporation method or a sputtering method, an inkjet method, a spin coating method, or the like. Alternatively, a wet process using a sol-gel method or a wet process using a paste of a metal material may be employed.

Furthermore, any of a variety of methods can be used for forming the EL layer 103, regardless of whether it is a dry process or a wet process. For example, a vacuum evaporation method, a gravure printing method, an offset printing method, a screen printing method, an inkjet method, or a spin coating method may be used.

Different methods may be used to form the electrodes or the layers described above.

The structure of the layers provided between the anode 101 and the cathode 102 is not limited to the above-described structure. Preferably, a light-emitting region where holes and electrons recombine is positioned away from the anode 101 and the cathode 102 so that quenching due to the proximity of the light-emitting region and a metal used for electrodes and carrier-injection layers can be prevented.

Furthermore, in order that transfer of energy from an exciton generated in the light-emitting layer can be suppressed, preferably, the hole-transport layer and the electron-transport layer that are in contact with the light-emitting layer 113, particularly a carrier-transport layer closer to the recombination region in the light-emitting layer 113, are formed using a substance having a wider band gap than the light-emitting material of the light-emitting layer or the light-emitting material included in the light-emitting layer.

Next, an embodiment of a light-emitting device with a structure in which a plurality of light-emitting units are stacked (this type of light-emitting device is also referred to as a stacked or tandem light-emitting device) is described with reference to FIG. 1C. This light-emitting device includes a plurality of light-emitting units between an anode and a cathode. One light-emitting unit has substantially the same structure as the EL layer 103 illustrated in FIG. 1A1 or FIG. 1A2. In other words, the light-emitting device illustrated in FIG. 1A1, FIG. 1A2, or FIG. 1B includes a single light-emitting unit, and the light-emitting device illustrated in FIG. 1C includes a plurality of light-emitting units.

In FIG. 1C, a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond, respectively, to the anode 101 and the cathode 102 illustrated in FIG. 1A1, and the materials given in the description for FIG. 1A1 can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied between the anode 501 and the cathode 502. That is, in FIG. 1C, the charge-generation layer 513 injects electrons into the first light-emitting unit 511 and holes into the second light-emitting unit 512 when a voltage is applied so that the potential of the anode becomes higher than the potential of the cathode.

The charge-generation layer 513 preferably has a structure similar to that of the charge-generation layer 116 described with reference to FIG. 1B. A composite material of an organic compound and a metal oxide has an excellent carrier-injection property and an excellent carrier-transport property; thus, low-voltage driving and low-current driving can be achieved. In the case where the anode-side surface of a light-emitting unit is in contact with the charge-generation layer 513, the charge-generation layer 513 can also function as a hole-injection layer of the light-emitting unit; therefore, a hole-injection layer is not necessarily provided in the light-emitting unit.

In the case where the charge-generation layer 513 includes the electron-injection buffer layer 119, the electron-injection buffer layer 119 functions as an electron-injection layer in the light-emitting unit on the anode side; thus, an electron-injection layer is not necessarily formed in the light-emitting unit on the anode side.

The light-emitting device having two light-emitting units is described with reference to FIG. 1C; however, one embodiment of the present invention can also be applied to a light-emitting device in which three or more light-emitting units are stacked. With a plurality of light-emitting units partitioned by the charge-generation layer 513 between a pair of electrodes as in the light-emitting device of this embodiment, it is possible to provide a long-life device that can emit light with high luminance at a low current density. A light-emitting apparatus that can be driven at a low voltage and has low power consumption can also be provided.

When the emission colors of the light-emitting units are different, light emission of a desired color can be obtained from the light-emitting device as a whole. For example, in a light-emitting device having two light-emitting units, the emission colors of the first light-emitting unit may be red and green and the emission color of the second light-emitting unit may be blue, so that the light-emitting device can emit white light as a whole. The light-emitting device in which three or more light-emitting units are stacked can be, for example, a tandem device in which a first light-emitting unit includes a first blue light-emitting layer, a second light-emitting unit includes a yellow or yellow-green light-emitting layer and a red light-emitting layer, and a third light-emitting unit includes a second blue light-emitting layer. The tandem device can provide white light emission like the above light-emitting device.

The above-described layers and electrodes such as the EL layer 103, the first light-emitting unit 511, the second light-emitting unit 512, and the charge-generation layer can be formed by a method such as an evaporation method (including a vacuum evaporation method), a droplet discharge method (also referred to as an inkjet method), a coating method, or a gravure printing method. A low molecular material, a middle molecular material (including an oligomer and a dendrimer), or a high molecular material may be included in the layers and electrodes.

Embodiment 3

In this embodiment, a light-emitting apparatus including the light-emitting device described in Embodiments 1 and 2 will be described.

In this embodiment, the light-emitting apparatus manufactured using the light-emitting device described in Embodiments 1 and 2 is described with reference to FIGS. 4A and 4B. Note that FIG. 4A is a top view of the light-emitting apparatus and FIG. 4B is a cross-sectional view taken along the lines A-B and C-D in FIG. 4A. This light-emitting apparatus includes a driver circuit portion (source line driver circuit) 601, a pixel portion 602, and a driver circuit portion (gate line driver circuit) 603, which control light emission of a light-emitting device and are illustrated with dotted lines. A reference numeral 604 denotes a sealing substrate, a reference numeral 605 denotes a sealant, and a reference numeral 607 denotes a space surrounded by the sealant 605.

A lead wiring 608 is a wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in this specification includes, in its category, not only the light-emitting apparatus itself but also the light-emitting apparatus provided with the FPC or the PWB.

Next, a cross-sectional structure is described with reference to FIG. 4B. The driver circuit portions and the pixel portion are formed over an element substrate 610. Here, the source line driver circuit 601, which is a driver circuit portion, and one pixel in the pixel portion 602 are illustrated.

The element substrate 610 may be a substrate containing glass, quartz, an organic resin, a metal, an alloy, or a semiconductor or a plastic substrate formed of fiber reinforced plastics (FRP), polyvinyl fluoride (PVF), polyester, acrylic, or the like.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case degradation of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

An oxide semiconductor that can be used in one embodiment of the present invention is described below.

Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear grain boundary even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, an In layer) and a layer containing the element M, zinc, and oxygen (hereinafter, an (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, M) layer.

The CAAC-OS is an oxide semiconductor with high crystallinity. By contrast, in the CAAC-OS, a reduction in electron mobility due to a grain boundary is less likely to occur because it is difficult to observe a clear grain boundary. Entry of impurities, formation of defects, or the like might decrease the crystallinity of an oxide semiconductor. This means that the CAAC-OS is an oxide semiconductor having small amounts of impurities and defects (e.g., oxygen vacancies ($V_O$). Thus, an oxide semiconductor including the CAAC-OS is physically stable. Accordingly, the oxide semiconductor including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that an indium-gallium-zinc oxide (hereinafter, IGZO) that is an oxide semiconductor containing indium, gallium, and zinc has a stable structure in some cases by being formed of the above-described nanocrystals. In particular, IGZO crystals tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor can have any of various structures that show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

A cloud-aligned composite OS (CAC-OS) may be used as an oxide semiconductor other than the above.

A CAC-OS has a conducting function in part of the material and has an insulating function in another part of the material; as a whole, the CAC-OS has a function of a semiconductor. Note that in the case where the CAC-OS is used in a semiconductor layer of a transistor, the conducting function is to allow electrons (or holes) serving as carriers to flow, and the insulating function is to not allow electrons serving as carriers to flow. By the complementary action of the conducting function and the insulating function, the CAC-OS can have a switching function (on/off function). In the CAC-OS, separation of the functions can maximize each function.

Furthermore, the CAC-OS includes conductive regions and insulating regions. The conductive regions have the above-described conducting function, and the insulating regions have the above-described insulating function. In some cases, the conductive regions and the insulating regions in the material are separated at the nanoparticle level. Furthermore, in some cases, the conductive regions and the insulating regions are unevenly distributed in the material. The conductive regions are sometimes observed to be coupled in a cloud-like manner with their boundaries blurred.

Furthermore, in the CAC-OS, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS includes components having different band gaps. For example, the CAC-OS includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS is used in a channel formation region of a transistor, high current drive capability in the on state of the transistor, that is, high on-state current and high field-effect mobility, can be obtained.

In other words, the CAC-OS can also be referred to as a matrix composite or a metal matrix composite.

The use of the above-described oxide semiconductor materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed on each display region is maintained. As a result, an electronic device with extremely low power consumption can be obtained.

For stable characteristics or the like of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the driver circuit portion 601. In addition, the driver circuit may be formed with any of a variety of circuits such as a CMOS circuit, a PMOS circuit, and an NMOS circuit. Although a driver integrated type in which the driver circuit is formed over the substrate is illustrated in this embodiment, the driver circuit is not necessarily formed over the substrate, and the driver circuit can be formed outside the substrate.

The pixel portion 602 includes a plurality of pixels each including a switching FET 611, a current controlling FET 612, and an anode 613 electrically connected to a drain of the current controlling FET 612. One embodiment of the present invention is not limited to the structure. The pixel portion 602 may include three or more FETs and a capacitor in combination.

Note that to cover an end portion of the anode 613, an insulator 614 is formed. Here, the insulator 614 can be formed using positive photosensitive acrylic here.

In order to improve the coverage with an EL layer or the like which is formed later, the insulator 614 is formed to have a curved surface with curvature at its upper or lower end portion. For example, in the case where positive photosensitive acrylic is used as a material of the insulator 614, only the upper end portion of the insulator 614 preferably has a curved surface with a curvature radius (0.2 m to 3 m). As the insulator 614, either a negative photosensitive resin or a positive photosensitive resin can be used.

An EL layer 616 and a cathode 617 are formed over the anode 613. Here, as a material used for the anode 613, a material having a high work function is desirably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance and favorable ohmic contact, and can function as an anode.

The EL layer 616 is formed by any of a variety of methods such as an evaporation method using an evaporation mask, an inkjet method, and a spin coating method. The EL layer 616 has the structure described in Embodiments 1 and 2. As another material included in the EL layer 616, a low molecular compound or a high molecular compound (including an oligomer or a dendrimer) may be used.

As a material used for the cathode 617, which is formed over the EL layer 616, a material having a low work function (e.g., Al, Mg, Li, and Ca, or an alloy or a compound thereof, such as MgAg, MgIn, or AlLi) is preferably used. In the case where light generated in the EL layer 616 is transmitted through the cathode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the cathode 617.

Note that the light-emitting device is formed with the anode 613, the EL layer 616, and the cathode 617. The light-emitting device is the light-emitting device described in Embodiments 1 and 2. In the light-emitting apparatus of this embodiment, the pixel portion, which includes a plurality of light-emitting devices, may include both the light-emitting device described in Embodiments 1 and 2 and a light-emitting device having a different structure.

The sealing substrate 604 is attached to the element substrate 610 with the sealant 605, so that a light-emitting device 618 is provided in the space 607 surrounded by the element substrate 610, the sealing substrate 604, and the sealant 605. The space 607 is filled with a filler, and may be filled with an inert gas (such as nitrogen or argon) or the sealant. It is preferable that the sealing substrate have a recessed portion provided with a desiccant, in which case degradation due to the influence of moisture can be suppressed.

An epoxy-based resin or glass frit is preferably used for the sealant 605. It is desirable that such a material transmit moisture or oxygen as little as possible. As the sealing substrate 604, a glass substrate, a quartz substrate, or a plastic substrate formed of fiber reinforced plastics (FRP), polyvinyl fluoride (PVF), polyester, or acrylic can be used.

Although not illustrated in FIGS. 4A and 4B, a protective film may be provided over the cathode. As the protective film, an organic resin film or an inorganic insulating film may be formed. The protective film may be formed so as to cover an exposed portion of the sealant 605. The protective film can be provided so as to cover surfaces and side surfaces of the pair of substrates and exposed side surfaces of a sealing layer, an insulating layer, and the like.

The protective film can be formed using a material through which impurities such as water do not permeate easily. Thus, diffusion of impurities such as water from the outside into the inside can be effectively suppressed.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage to a process member in forming the protective film can be reduced.

By an ALD method, a uniform protective film with few defects can be formed even on a surface with a complex uneven shape or upper, side, and lower surfaces of a touch panel.

As described above, the light-emitting apparatus manufactured using the light-emitting device described in Embodiments 1 and 2 can be obtained.

The light-emitting apparatus in this embodiment is manufactured using the light-emitting device described in Embodiments 1 and 2 and thus can have favorable characteristics. Specifically, since the light-emitting device described in Embodiments 1 and 2 has a long lifetime, the light-emitting apparatus can have high reliability. Since the light-emitting apparatus using the light-emitting device described in Embodiments 1 and 2 has high emission efficiency, the light-emitting apparatus can achieve low power consumption.

Figure 5A:
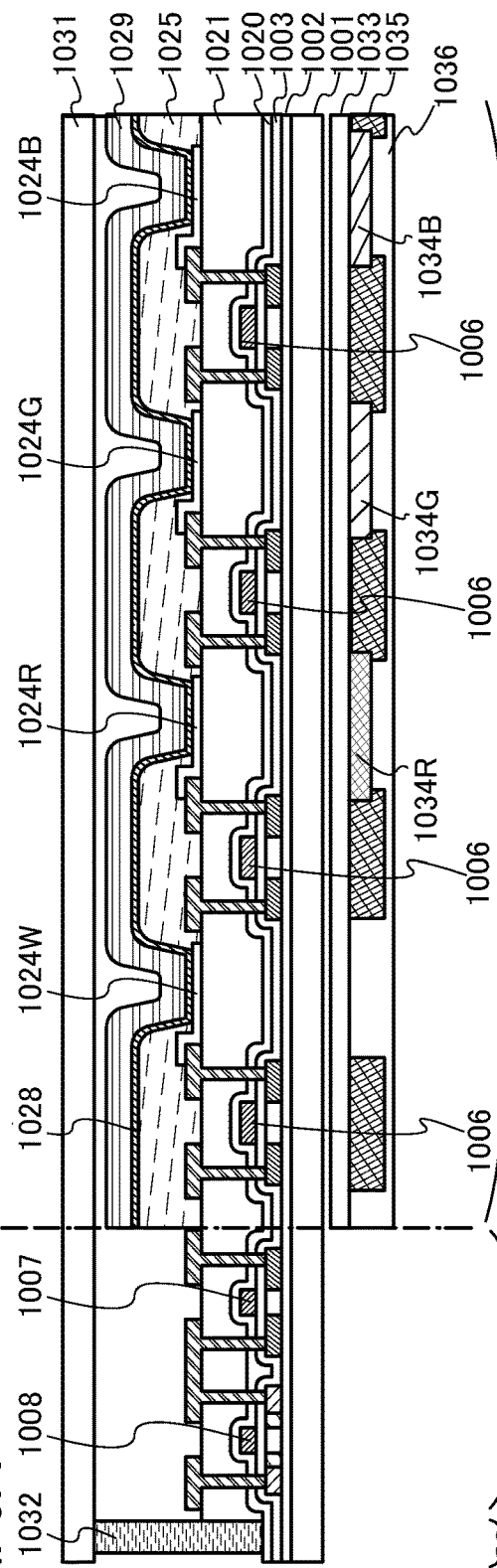
FIGS. 5A and 5B are conceptual diagrams of an active matrix light-emitting apparatus.
Figure 5B:
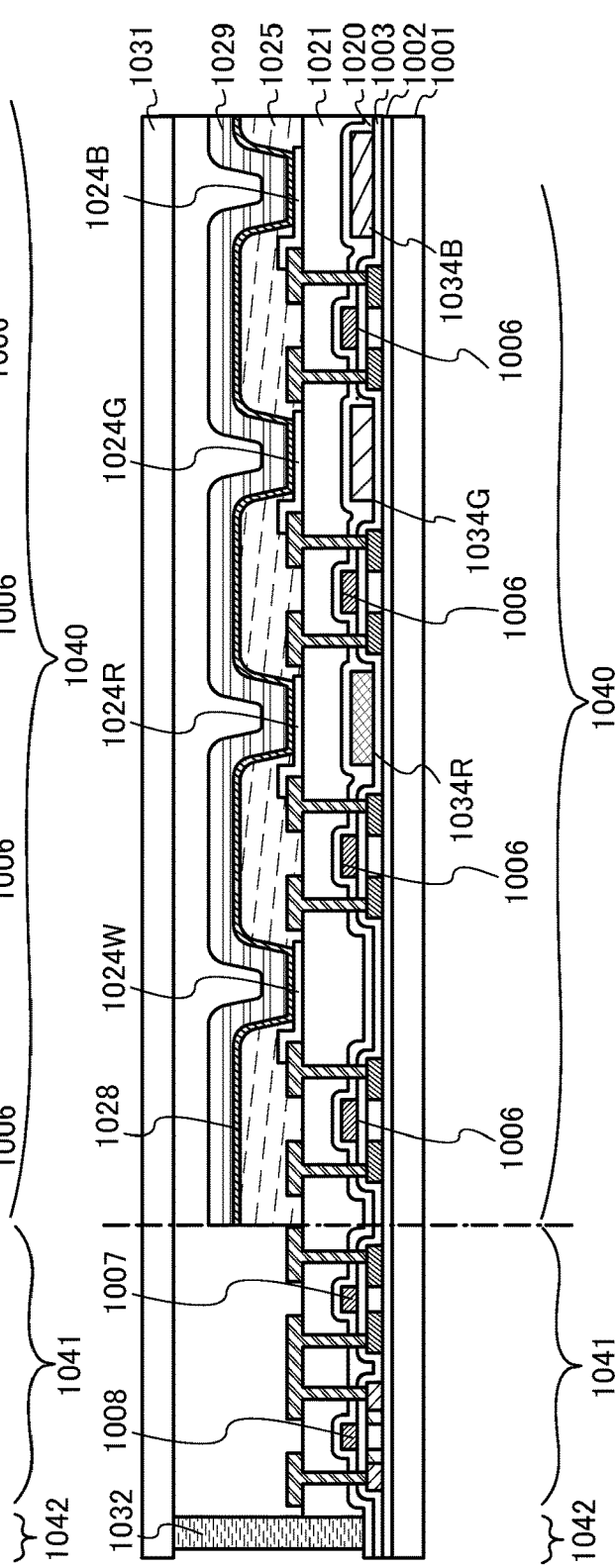

FIGS. 5A and 5B each illustrate an example of a light-emitting apparatus that includes a light-emitting device exhibiting white light emission and coloring layers (color filters) and the like to display a full-color image. FIG. 5A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, anodes 1024W, 1024R, 1024G, and 1024B of light-emitting devices, a partition 1025, an EL layer 1028, a cathode 1029 of the light-emitting devices, a sealing substrate 1031, a sealant 1032, and the like.

In FIG. 5A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 5A, light emitted from part of the light-emitting layer does not pass through the coloring layers, while light emitted from the other part of the light-emitting layer passes through the coloring layers. The light that does not pass through the coloring layers is white and the light that passes through any one of the coloring layers is red, green, or blue; thus, an image can be displayed using pixels of the four colors.

FIG. 5B illustrates an example in which the coloring layers (the red coloring layer 1034R, the green coloring layer 1034G, and the blue coloring layer 1034B) are provided between the gate insulating film 1003 and the first interlayer insulating film 1020. As in this structure, the coloring layers may be provided between the substrate 1001 and the sealing substrate 1031.

Figure 6:
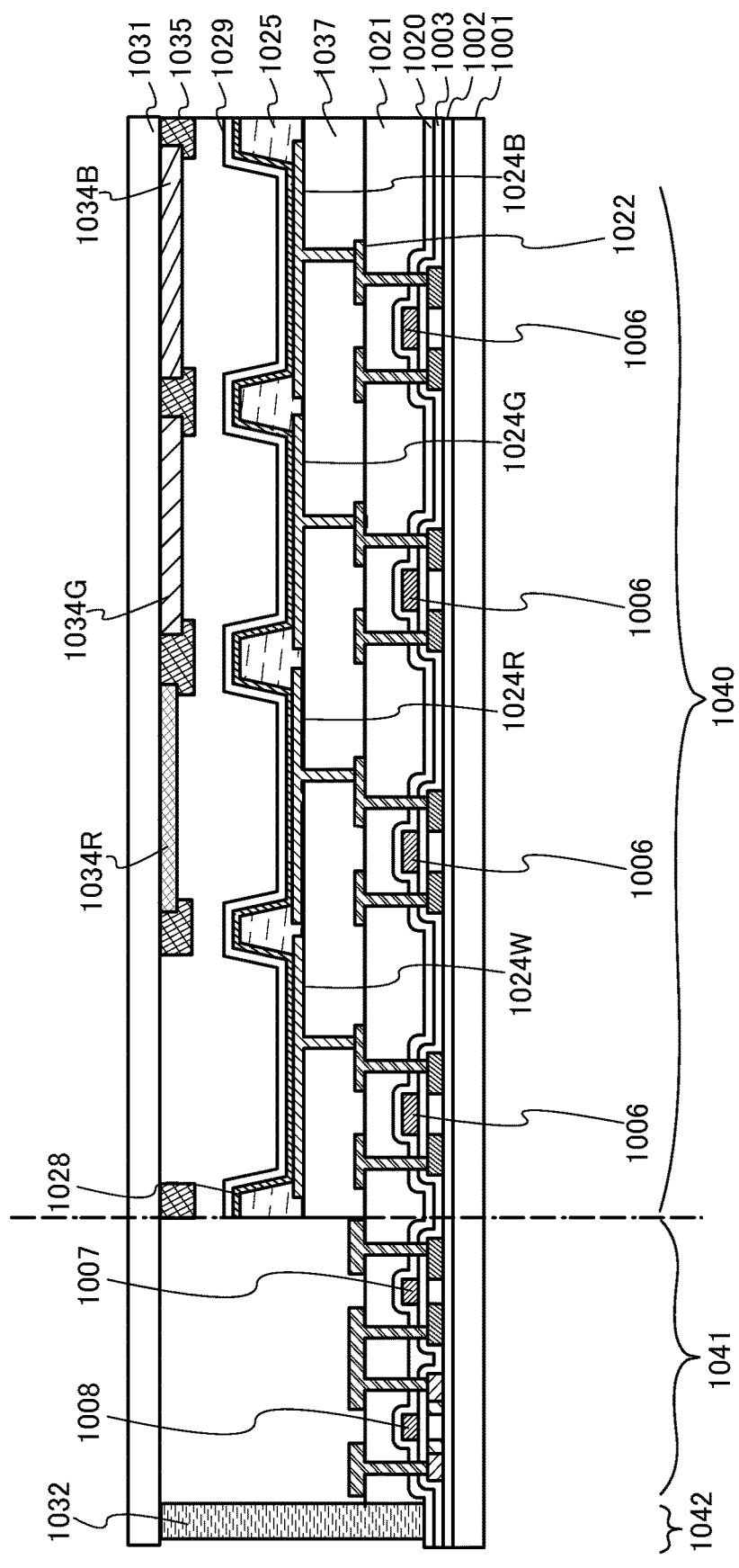
FIG. 6 is a conceptual diagram of an active matrix light-emitting apparatus.

The above-described light-emitting apparatus has a structure in which light is extracted from the substrate 1001 side where FETs are formed (a bottom emission structure), but may have a structure in which light is extracted from the sealing substrate 1031 side (a top emission structure). FIG. 6 is a cross-sectional view of a light-emitting apparatus having a top emission structure. In this case, a substrate that does not transmit light can be used as the substrate 1001. The process up to the step of forming a connection electrode that connects the FET and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film or using any of other known materials.

The anodes 1024W, 1024R, 1024G, and 1024B of the light-emitting devices are anodes here, but may be formed as cathodes. Furthermore, in the case of a light-emitting apparatus having a top emission structure as illustrated in FIG. 6, the anodes are preferably reflective electrodes. The EL layer 1028 is formed to have a structure similar to the structure of the EL layer 103 described in Embodiments 1 and 2, with which white light emission can be obtained.

In the case of a top emission structure as illustrated in FIG. 6, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 that is positioned between pixels. The coloring layers (the red coloring layer 1034R, the green coloring layer 1034G, and the blue coloring layer 1034B) and the black matrix may be covered with the overcoat layer 1036. Note that a light-transmitting substrate is used as the sealing substrate 1031. Although an example in which full color display is performed using four colors of red, green, blue, and white is shown here, there is no particular limitation and full color display using four colors of red, yellow, green, and blue or three colors of red, green, and blue may be performed.

In the light-emitting apparatus having a top emission structure, a microcavity structure can be suitably employed. A light-emitting device with a microcavity structure is formed with the use of a reflective electrode as the anode and a transflective electrode as the cathode. The light-emitting device with a microcavity structure includes at least an EL layer between the reflective electrode and the transflective electrode. The EL layer includes at least a light-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the transflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the transfective electrode.

In the light-emitting device, by changing the thicknesses of the transparent conductive film, the composite material, the carrier-transport material, and the like, the optical path length between the reflective electrode and the transflective electrode can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transfective electrode from the light-emitting layer (first incident light). For this reason, the optical path length between the reflective electrode and the light-emitting layer is preferably adjusted to $(2n-1)\lambda/4$ (n is a natural number of 1 or larger and λ is a wavelength of color to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting device described above may be combined with the EL layer; for example, a light-emitting device may have a structure in which a plurality of EL layers are provided, a charge-generation layer is provided between the EL layers, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus that displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is manufactured using the light-emitting device described in Embodiments 1 and 2 and thus can have favorable characteristics. Specifically, since the light-emitting device described in Embodiments 1 and 2 has a long lifetime, the light-emitting apparatus can have high reliability. Since the light-emitting apparatus using the light-emitting device described in Embodiments 1 and 2 has high emission efficiency, the light-emitting apparatus can achieve low power consumption.

Figure 7A:
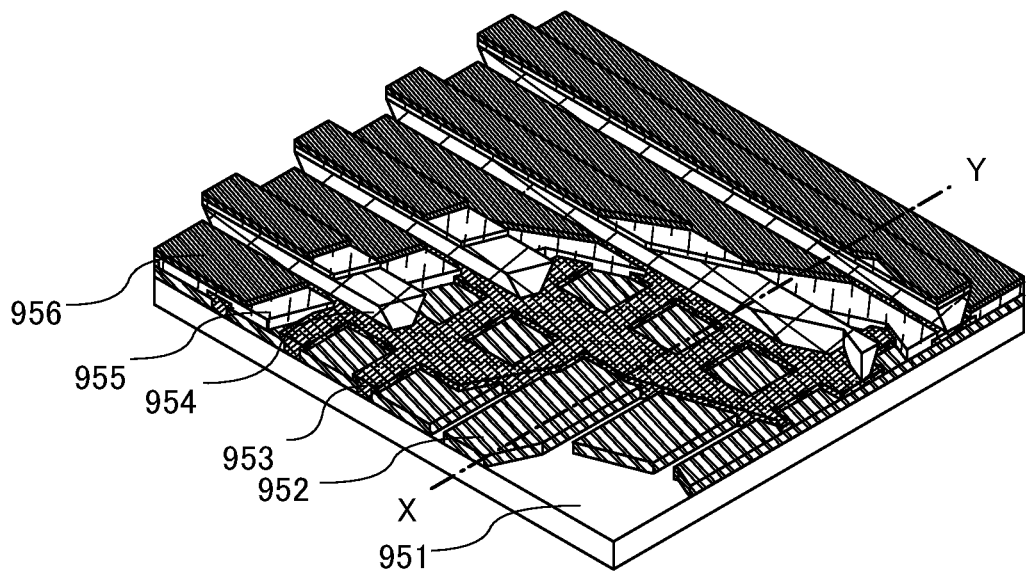
FIGS. 7A and 7B are conceptual diagrams of a passive matrix light-emitting apparatus.
Figure 7B:
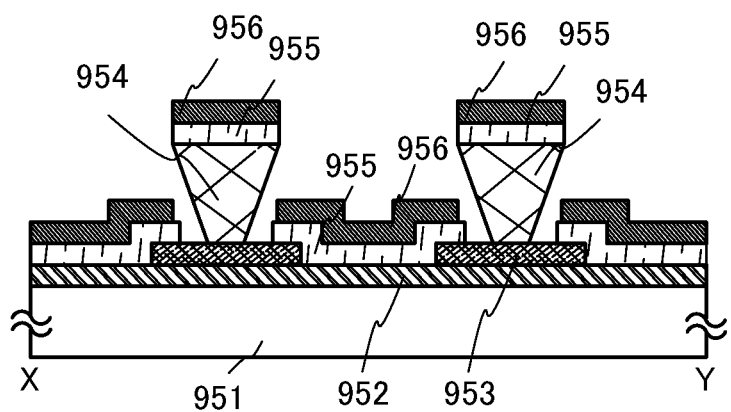

The active matrix light-emitting apparatus is described above, whereas a passive matrix light-emitting apparatus is described below. FIGS. 7A and 7B illustrate a passive matrix light-emitting apparatus manufactured using the present invention. Note that FIG. 7A is a perspective view of the light-emitting apparatus, and FIG. 7B is a cross-sectional view taken along the line X-Y in FIG. 7A. In FIGS. 7A and 7B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between the sidewalls is gradually narrowed toward the surface of the substrate. In other words, a cross section taken along the direction of the short side of the partition layer 954 is trapezoidal, and the lower side (a side of the trapezoid that is parallel to the surface of the insulating layer 953 and is in contact with the insulating layer 953) is shorter than the upper side (a side of the trapezoid that is parallel to the surface of the insulating layer 953 and is not in contact with the insulating layer 953). The partition layer 954 provided in this manner can prevent defects of the light-emitting device due to static electricity or the like. The passive matrix light-emitting apparatus also includes the light-emitting device described in Embodiments 1 and 2; thus, the light-emitting apparatus can have high reliability or low power consumption.

Since many minute light-emitting devices arranged in a matrix in the light-emitting apparatus described above can be independently controlled, the light-emitting apparatus can be suitably used as a display device for displaying images.

This embodiment can be freely combined with any of the other embodiments.

Embodiment 4

Figure 8A:
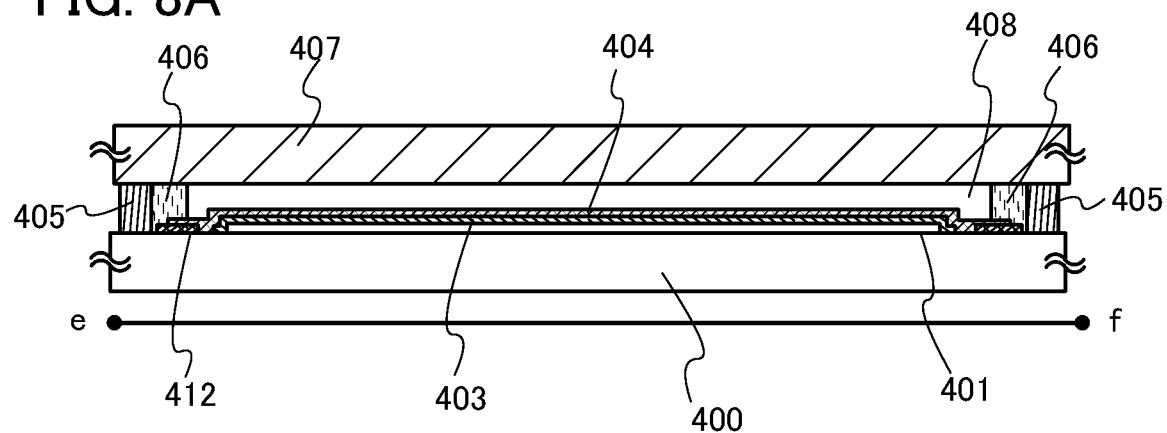
FIGS. 8A and 8B illustrate a lighting device.
Figure 8B:
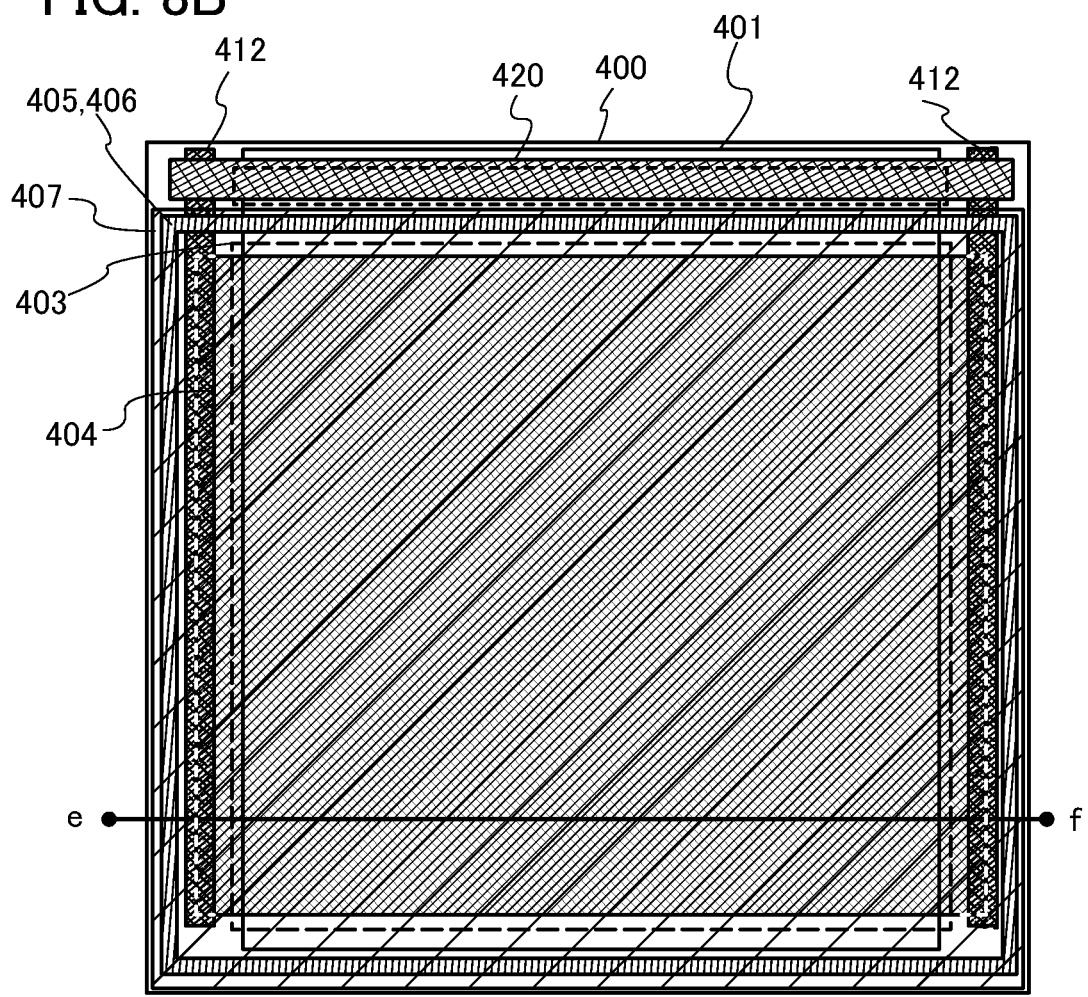

In this embodiment, an example in which the light-emitting device described in Embodiments 1 and 2 is used for a lighting device is described with reference to FIGS. 8A and 8B. FIG. 8B is a top view of the lighting device, and FIG. 8A is a cross-sectional view taken along the line e-f in FIG. 8B.

In the lighting device in this embodiment, an anode 401 is formed over a substrate 400 which is a support and has a light-transmitting property. The anode 401 corresponds to the anode 101 in Embodiment 2. When light is extracted from the anode 401 side, the anode 401 is formed using a material having a light-transmitting property.

A pad 412 for applying voltage to a cathode 404 is formed over the substrate 400.

An EL layer 403 is formed over the anode 401. The structure of the EL layer 403 corresponds to, for example, the structure of the EL layer 103 in Embodiments 1 and 2, or the structure in which the light-emitting units 511 and 512 and the charge-generation layer 513 are combined. Refer to the descriptions for the structures.

The cathode 404 is formed to cover the EL layer 403. The cathode 404 corresponds to the cathode 102 in Embodiment 2. The cathode 404 is formed using a material having high reflectivity when light is extracted from the anode 401 side. The cathode 404 is connected to the pad 412, whereby voltage is applied.

As described above, the lighting device described in this embodiment includes a light-emitting device including the anode 401, the EL layer 403, and the cathode 404. Since the light-emitting device has high emission efficiency, the lighting device in this embodiment can have low power consumption.

The substrate 400 provided with a light-emitting device having the above structure is fixed to a sealing substrate 407 with sealants 405 and 406 and sealing is performed, whereby the lighting device is completed. It is possible to use only either the sealant 405 or the sealant 406. The inner sealant 406 (not illustrated in FIG. 8B) can be mixed with a desiccant that enables moisture to be adsorbed, which results in improved reliability.

When parts of the pad 412 and the anode 401 are extended to the outside of the sealants 405 and 406, the extended parts can function as external input terminals. An IC chip 420 mounted with a converter or the like may be provided over the external input terminals.

The lighting device described in this embodiment includes, as an EL device, the light-emitting device described in Embodiments 1 and 2; thus, the light-emitting apparatus can have high reliability. In addition, the light-emitting apparatus can consume less power.

Embodiment 5

In this embodiment, examples of electronic devices each including the light-emitting device described in Embodiments 1 and 2 are described. The light-emitting device described in Embodiments 1 and 2 has a long lifetime and high reliability. As a result, the electronic devices described in this embodiment can each include a light-emitting portion having high reliability.

Examples of the electronic devices including the above light-emitting device include a television device (also referred to as a television or a television receiver), a monitor for a computer or the like, a digital camera, a digital video camera, a digital photo frame, a cellular phone (also referred to as a mobile phone or a mobile phone device), a portable game machine, a portable information terminal, an audio playback device, and a large game machine such as a pachinko machine. Specific examples of these electronic devices are described below.

FIG. 9A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in Embodiments 1 and 2 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 9B1 illustrates a computer, which includes a main body 7201, a housing 7202, a display portion 7203, a keyboard 7204, an external connection port 7205, a pointing device 7206, and the like. Note that this computer is manufactured using the light-emitting devices described in Embodiments 1 and 2 and arranged in a matrix in the display portion 7203. The computer illustrated in FIG. 9B1 may have a structure illustrated in FIG. 9B2. A computer illustrated in FIG. 9B2 is provided with a second display portion 7210 instead of the keyboard 7204 and the pointing device 7206. The second display portion 7210 is a touch panel, and input operation can be performed by touching display for input on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken while the computer is being stored or carried.

FIG. 9C illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 including the light-emitting devices described in Embodiments 1 and 2 and arranged in a matrix.

When the display portion 7402 of the portable terminal illustrated in FIG. 9C is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting data such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor for sensing inclination, such as a gyroscope sensor or an acceleration sensor, is provided inside the portable terminal, display on the screen of the display portion 7402 can be automatically changed by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 can also function as an image sensor. For example, an image of a palm print, a fingerprint, or the like is taken when the display portion 7402 is touched with the palm or the finger, whereby personal authentication can be performed. Furthermore, by providing a backlight or a sensing light source that emits near-infrared light in the display portion, an image of a finger vein, a palm vein, or the like can be taken.

Note that the structure described in this embodiment can be combined with any of the structures described in Embodiments 1 to 4 as appropriate.

As described above, the application range of the light-emitting apparatus having the light-emitting device described in Embodiments 1 and 2 is extremely wide so that this light-emitting apparatus can be used in electronic devices in a variety of fields. By using the light-emitting device described in Embodiments 1 and 2, an electronic device with high reliability can be obtained.

Figure 10A:
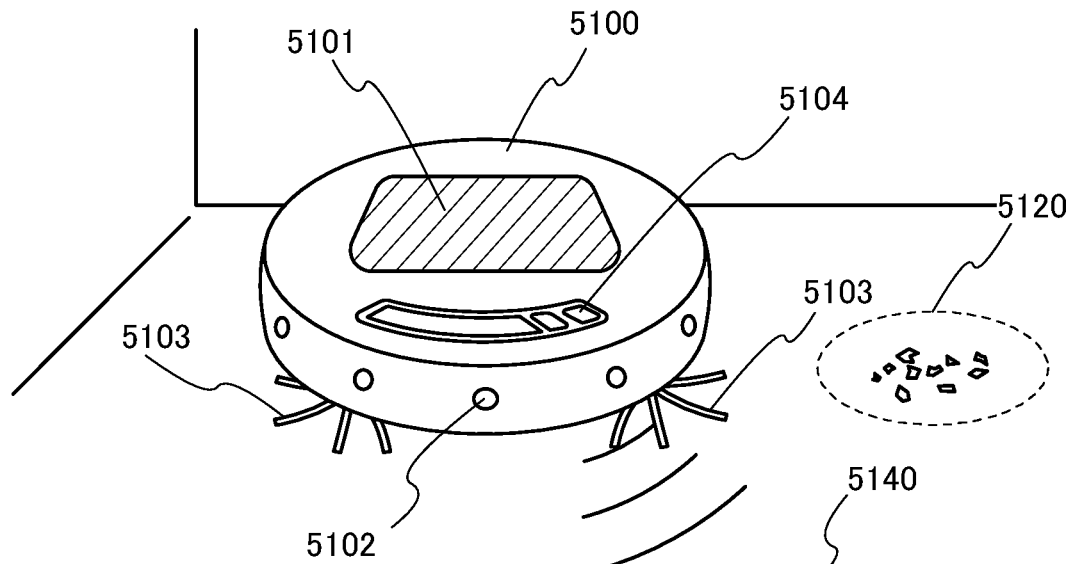
FIGS. 10A to 10C illustrate electronic devices.

FIG. 10A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 10B:
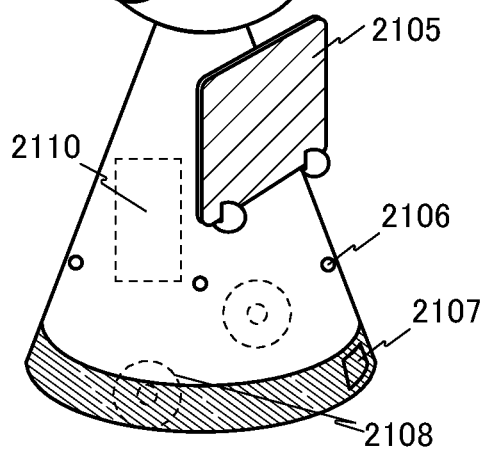

A robot 2100 illustrated in FIG. 10B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of capturing an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 10C:
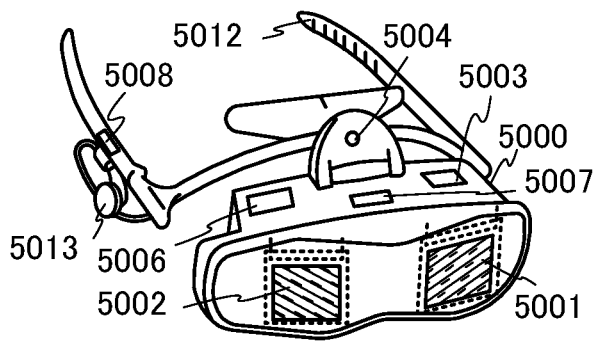

FIG. 10C illustrates an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the display portion 5001 and the display portion 5002.

Figure 11:
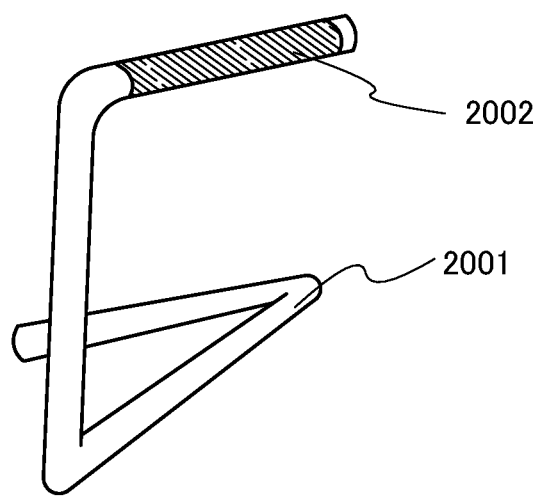
FIG. 11 illustrates a lighting device.

FIG. 11 illustrates an example in which the light-emitting device described in Embodiments 1 and 2 is used for a table lamp which is a lighting device. The table lamp illustrated in FIG. 11 includes a housing 2001 and a light source 2002, and the lighting device described in Embodiment 3 may be used for the light source 2002.

Figure 12:
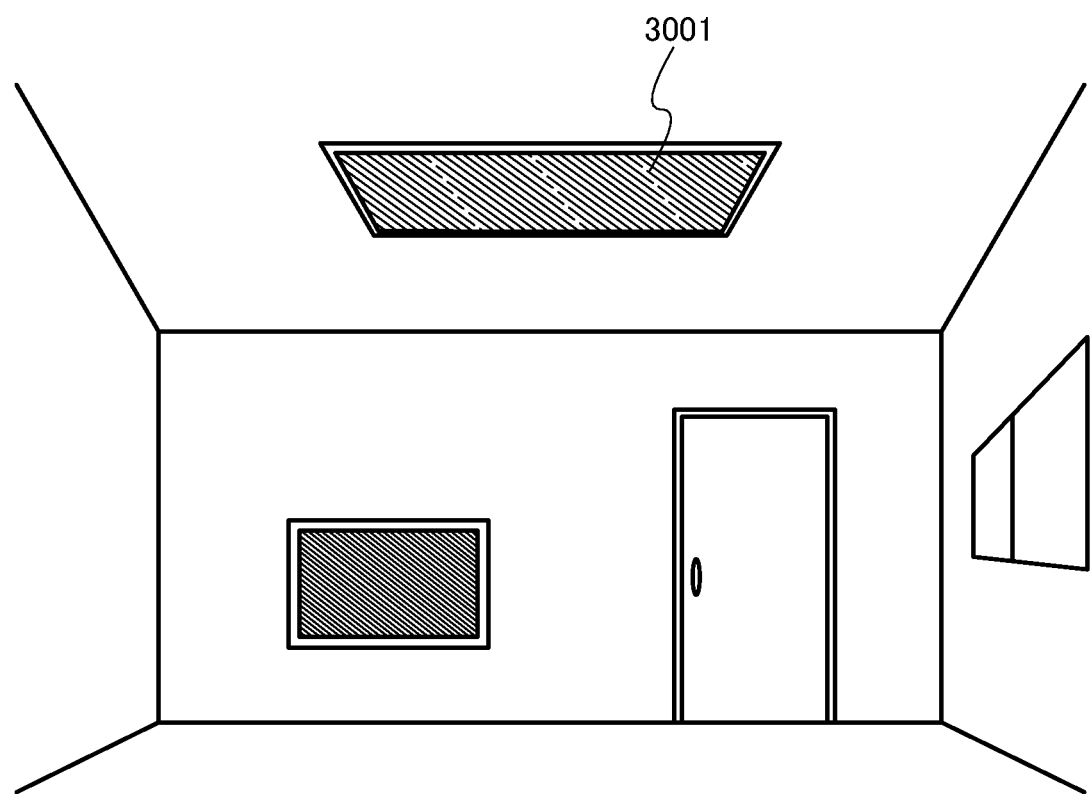
FIG. 12 illustrates a lighting device.

FIG. 12 illustrates an example in which the light-emitting device described in Embodiments 1 and 2 is used for an indoor lighting device 3001. Since the light-emitting device described in Embodiments 1 and 2 has high reliability, the lighting device can have high reliability. Furthermore, since the light-emitting device described in Embodiments 1 and 2 can have a large area, the light-emitting device can be used for a large-area lighting device. Furthermore, since the light-emitting device described in Embodiments 1 and 2 is thin, the light-emitting device can be used for a lighting device having a reduced thickness.

Figure 13:
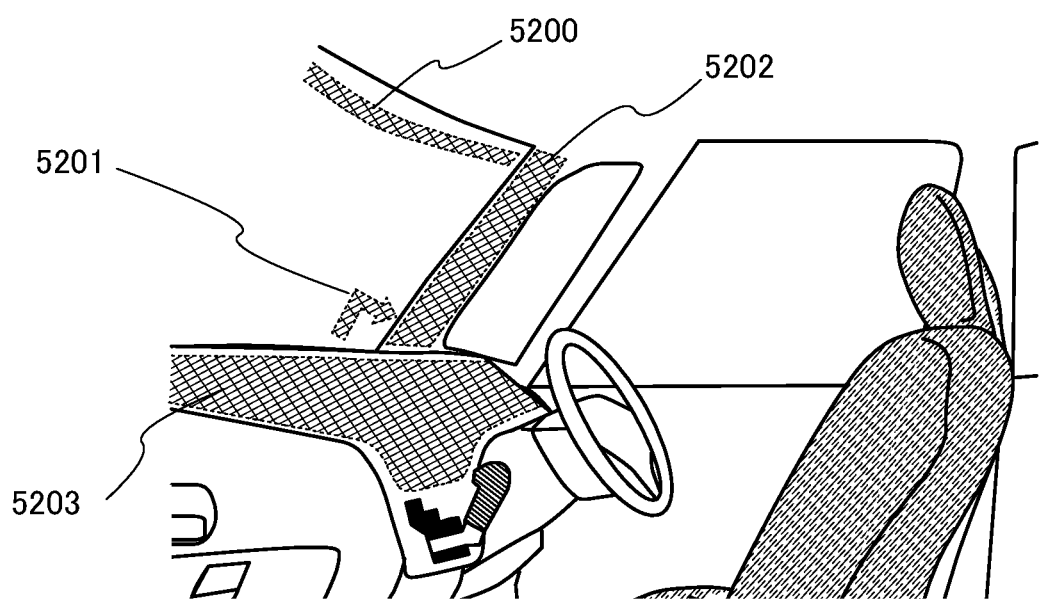
FIG. 13 illustrates in-vehicle display devices and lighting devices.

The light-emitting device described in Embodiments 1 and 2 can also be used for an automobile windshield or an automobile dashboard. FIG. 13 illustrates one mode in which the light-emitting device described in Embodiments 1 and 2 are used for an automobile windshield and an automobile dashboard. Display regions 5200 to 5203 each include the light-emitting device described in Embodiments 1 and 2.

The display regions 5200 and 5201 are display devices which are provided in the automobile windshield and in which the light-emitting devices described in Embodiments 1 and 2 are incorporated. The light-emitting devices described in Embodiments 1 and 2 can be formed into what is called a see-through display device, through which the opposite side can be seen, by including an anode and a cathode formed of electrodes having a light-transmitting property. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

A display device incorporating the light-emitting device described in Embodiments 1 and 2 is provided in the display region 5202 in a pillar portion. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile. Thus, blind areas can be eliminated to enhance the safety. Displaying images that compensate for the areas which a driver cannot see enables the driver to ensure safety easily and comfortably.

The display region 5203 can provide a variety of kinds of information by displaying navigation data, a speedometer, a tachometer, and the like. The content or layout of the display can be changed freely by a user as appropriate. Note that such information can also be displayed on the display regions 5200 to 5202. The display regions 5200 to 5203 can also be used as lighting devices.

Figure 14A:
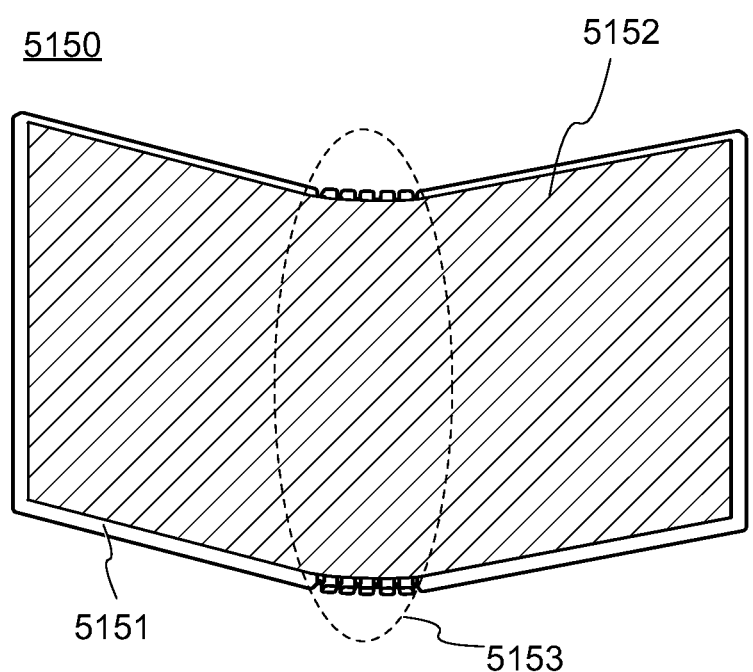
FIGS. 14A and 14B illustrate an electronic device.
Figure 14B:
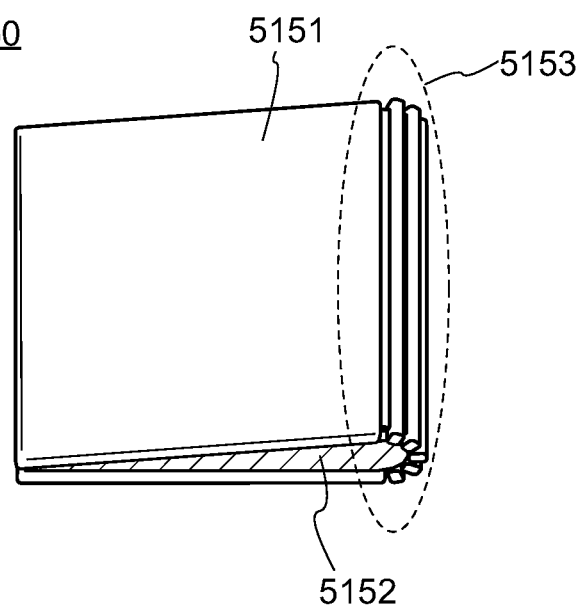

FIGS. 14A and 14B illustrate a foldable portable information terminal 5150. The foldable portable information terminal 5150 includes a housing 5151, a display region 5152, and a bend portion 5153. FIG. 14A illustrates the portable information terminal 5150 that is opened. FIG. 14B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands and the bend portion 5153 has a radius of curvature of greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 15A:
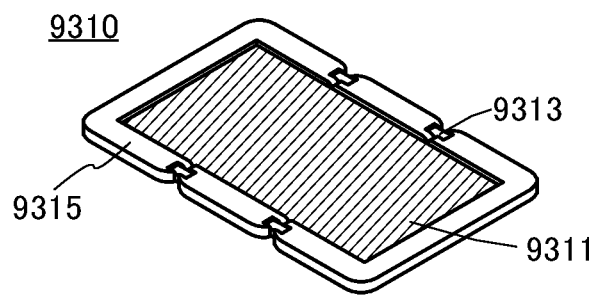
FIGS. 15A to 15C illustrate an electronic device.
Figure 15B:
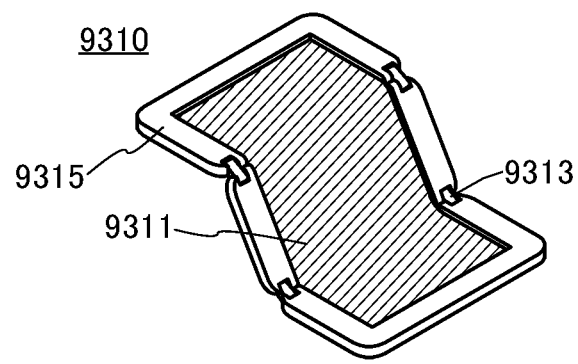
Figure 15C:
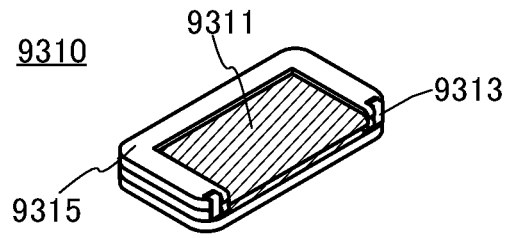

FIGS. 15A to 15C illustrate a foldable portable information terminal 9310. FIG. 15A illustrates the portable information terminal 9310 that is opened. FIG. 15B illustrates the portable information terminal 9310 that is being opened or being folded. FIG. 15C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Example 1

In this example, light-emitting devices 1 to 3 of one embodiment of the present invention and a comparative light-emitting device 1 are described. Structural formulae of organic compounds used for the light-emitting devices 1 to 3 and the comparative light-emitting device 1 are shown below.

[Chemical Formulae 5]

(i) BBABnf

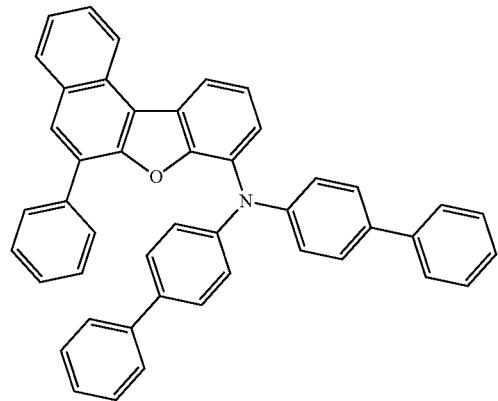

(ii) PCzN2

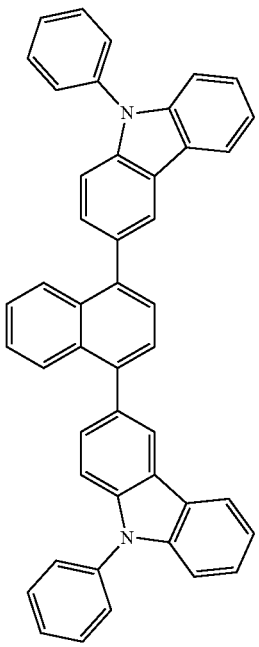

(iii) αN-βNPAnth

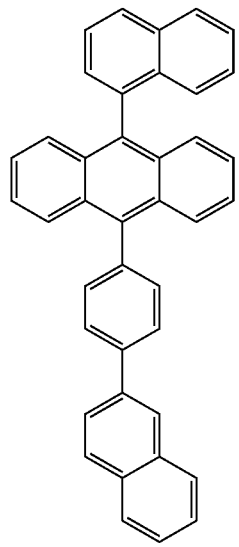

(iv) 3,10PCA2Nbf(IV)-02

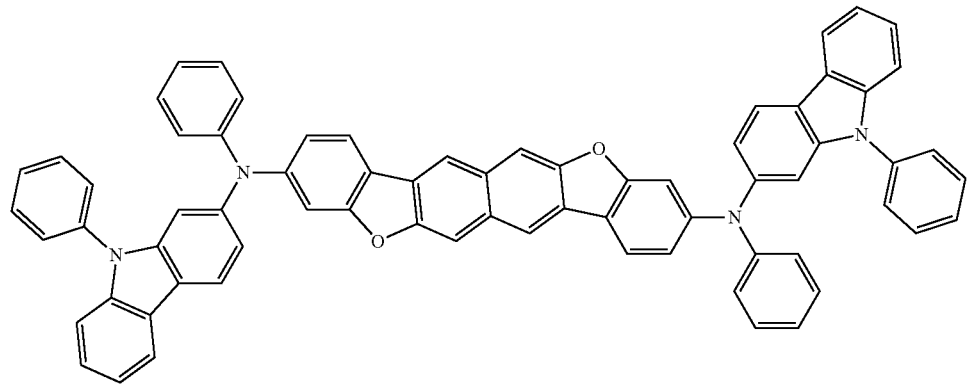

(v) ZADN (vi) Liq

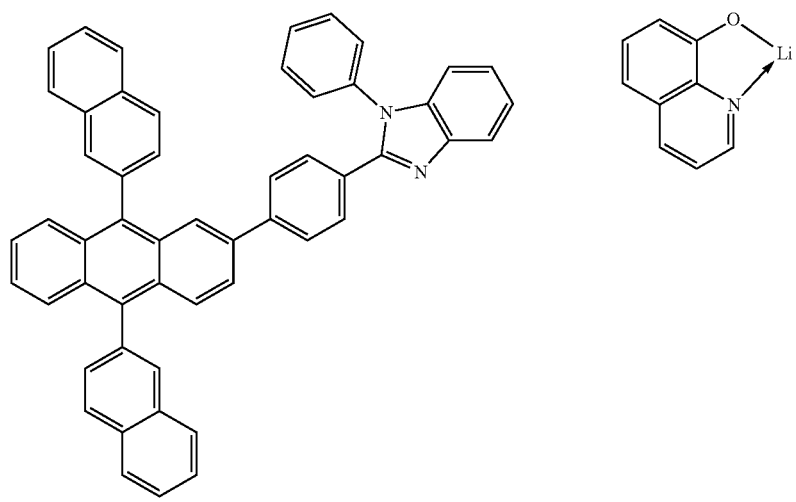

(Fabrication Method of Light-Emitting Device 1)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N,N-bis(4-biphenyl)-6-phenylbenzo[b]naphtho[1,2-d]furan-8-amine (abbreviation: BBABnf) represented by Structural Formula (i) and ALD-MP001Q (produced by Analysis Atelier Corporation, material serial No. 1S20170124) were deposited on the anode 101 to a thickness of 10 nm by co-evaporation using a resistance-heating method such that the weight ratio of BBABnf to ALD-MP001Q was 1:0.1, whereby the hole-injection layer 111 was formed.

Subsequently, over the hole-injection layer 111, BBABnf was deposited by evaporation to a thickness of 20 nm to form the first hole-transport layer 112-1, and then 3,3'-(naphthalene-1,4-diyl)bis(9-phenyl-9H-carbazole) (abbreviation: PCzN2) represented by Structural Formula (ii) was deposited by evaporation to a thickness of 10 nm to form the second hole-transport layer 112-2, whereby the hole-transport layer 112 was formed. Note that the second hole-transport layer 112-2 also functions as an electron-blocking layer.

Then, 9-(1-naphthyl)-10-[4-(2-naphthyl)phenyl]anthracene (abbreviation: αN-βNPAnth) represented by Structural Formula (iii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by Structural Formula (iv) were deposited by co-evaporation to a thickness of 25 nm such that the weight ratio of αN-βNPAnth to 3,10PCA2Nbf(IV)-02 was 1:0.015, whereby the light-emitting layer 113 was formed.

Then, over the light-emitting layer 113, 2-{4-[9,10-di(naphthalen-2-yl)-2-anthryl]phenyl}-1-phenyl-1H-benzimidazole (abbreviation: ZADN) represented by Structural Formula (v) and 8-hydroxyquinolinatolithium (abbreviation: Liq) represented by Structural Formula (vi) were deposited by co-evaporation to a thickness of 12.5 nm such that the weight ratio of ZADN to Liq was 0.9:1, and successively, ZADN and Liq were deposited by co-evaporation to a thickness of 12.5 nm such that the weight ratio of ZADN to Liq was 1:0.9, whereby the electron-transport layer 114 was formed.

After the formation of the electron-transport layer 114, Liq was deposited by evaporation to a thickness of 1 nm to form the electron-injection layer 115. Then, aluminum was deposited by evaporation to a thickness of 200 nm to form the cathode 102. Thus, the light-emitting device 1 of this example was fabricated.

(Fabrication Method of Light-Emitting Device 2)

The light-emitting device 2 was fabricated in the same manner as the light-emitting device 1 except that the electron-transport layer 114 was formed by co-evaporation of ZADN and Liq to a thickness of 12.5 nm in a weight ratio of ZADN:Liq=0.7:1 and successively by co-evaporation of ZADN and Liq to a thickness of 12.5 nm in a weight ratio of ZADN:Liq=1:0.7.

(Fabrication Method of Light-Emitting Device 3)

The light-emitting device 3 was fabricated in the same manner as the light-emitting device 1 except that the electron-transport layer 114 was formed by co-evaporation of ZADN and Liq to a thickness of 12.5 nm in a weight ratio of ZADN:Liq=0.5:1 and successively by co-evaporation of ZADN and Liq to a thickness of 12.5 nm in a weight ratio of ZADN:Liq=1:0.5.

(Fabrication Method of Comparative Light-Emitting Device 1)

The comparative light-emitting device 1 was fabricated in the same manner as the light-emitting device 1 except that the electron-transport layer 114 was formed by co-evaporation of ZADN and Liq to a thickness of 25 nm in a weight ratio of ZADN:Liq=1:1.

The structures of the light-emitting devices 1 to 3 and the comparative light-emitting device 1 are listed in the following table.

TABLE 1

| | Hole-injection layer | Hole-transport layer | | Light-emitting layer 25 nm | Electron-transport layer | | Electron-injection layer |
|---|---|---|---|---|---|---|---|
| | | 1 | 2 | | 1 | 2 | |
| | 10 nm | 20 nm | 10 nm | | 12.5 nm | 12.5 nm | 1 nm |
| Light-emitting device 1 | BBABnf: ALD-MP001Q (1:0.1) | BBABnf | PCzN2 | αN-βNP Anth: 3,10PCA2Nbf(IV)-02 (1:0.015) | ZADN: Liq (0.9:1) | ZADN: Liq (1:0.9) | Liq |
| Light-emitting device 2 | | | | | ZADN: Liq (0.7:1) | ZADN: Liq (1:0.7) | |
| Light-emitting device 3 | | | | | ZADN: Liq (0.5:1) | ZADN: Liq (1:0.5) | |
| Comparative light-emitting device 1 | | | | | ZADN: Liq (1:1) | | |

The HOMO levels, the LUMO levels, and the electron mobilities of the organic compounds used in this example are listed in the following table. The electron mobilities were measured when the square root of the electric field strength [V/cm] was 600.

TABLE 2

|  | HOMO level (eV) | LUMO level (eV) | Electron mobility (cm$^2$/Vs) |
|---|---|---|---|
| BBABnf | −5.56 | — | — |
| PCzN2 | −5.71 | — | — |
| αN-βNP Anth | −5.85 | −2.74 | — |
| ZADN | — | −2.87 | — |
| ZADN: Liq (1:1) | — | — | $3.1 \times 10^{-6}$ |

The light-emitting devices were sealed using a glass substrate in a glove box containing a nitrogen atmosphere so as not to be exposed to the air (a sealant was applied to surround the devices and UV treatment and heat treatment at 80° C. for 1 hour were performed at the time of sealing). Then, the initial characteristics and reliability of the light-emitting devices were measured. Note that the measurement was performed at room temperature.

Figure 16:
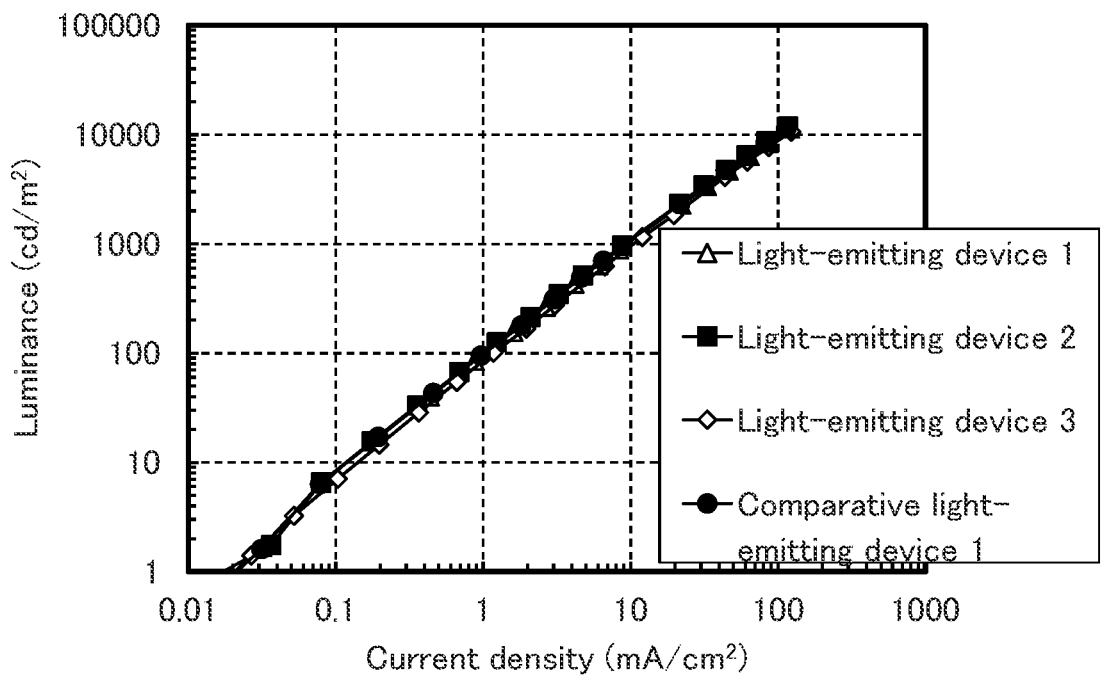
FIG. 16 shows the luminance-current density characteristics of light-emitting devices 1 to 3 and a comparative light-emitting device 1.
Figure 17:
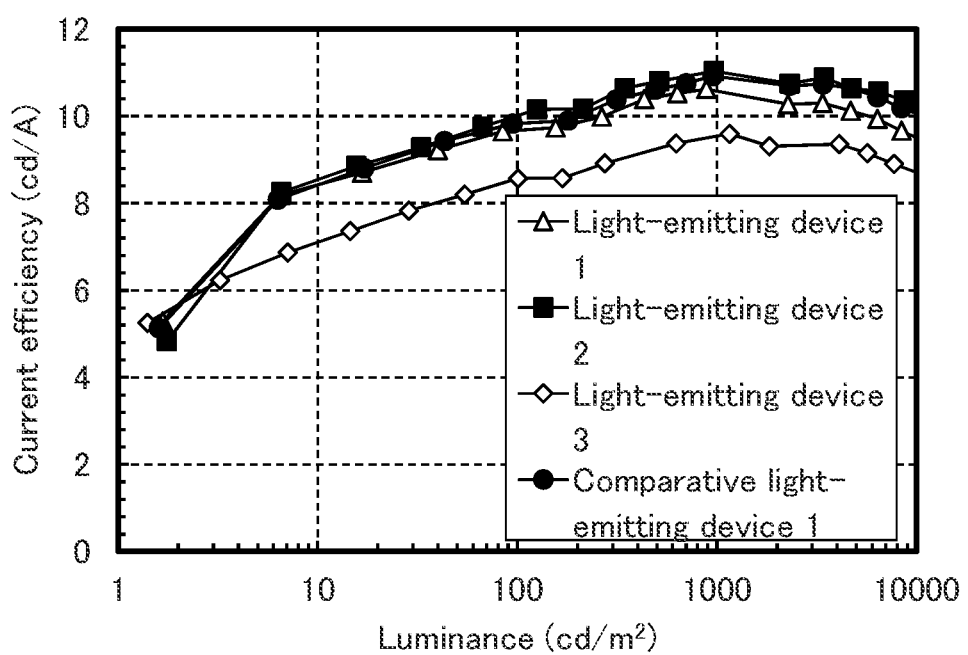
FIG. 17 shows the current efficiency-luminance characteristics of light-emitting devices 1 to 3 and a comparative light-emitting device 1.
Figure 18:
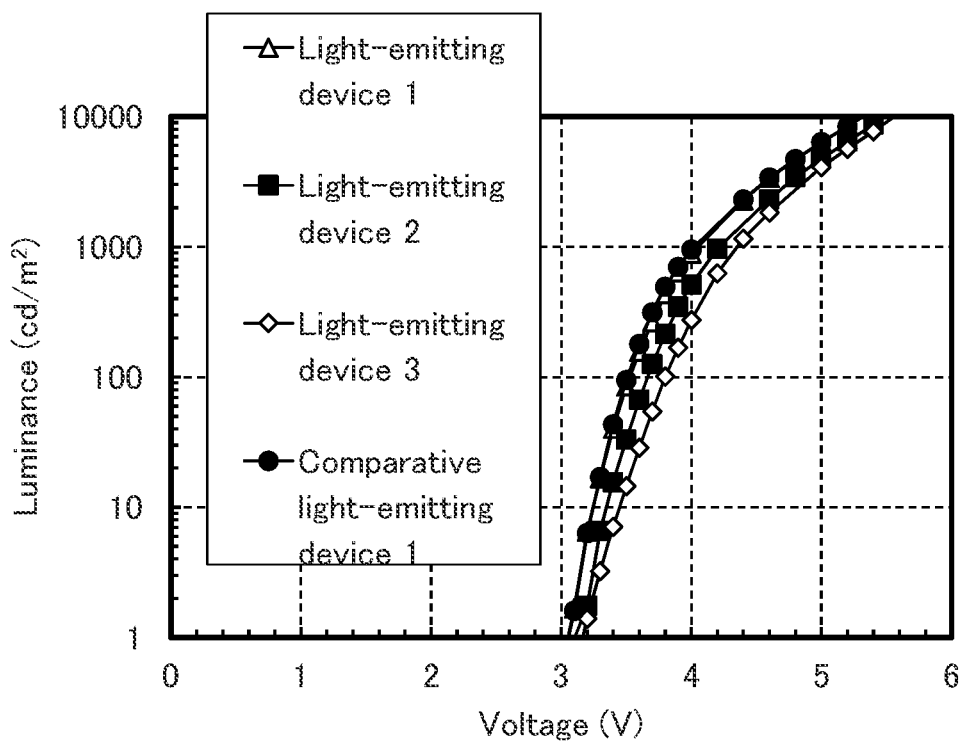
FIG. 18 shows the luminance-voltage characteristics of light-emitting devices 1 to 3 and a comparative light-emitting device 1.
Figure 19:
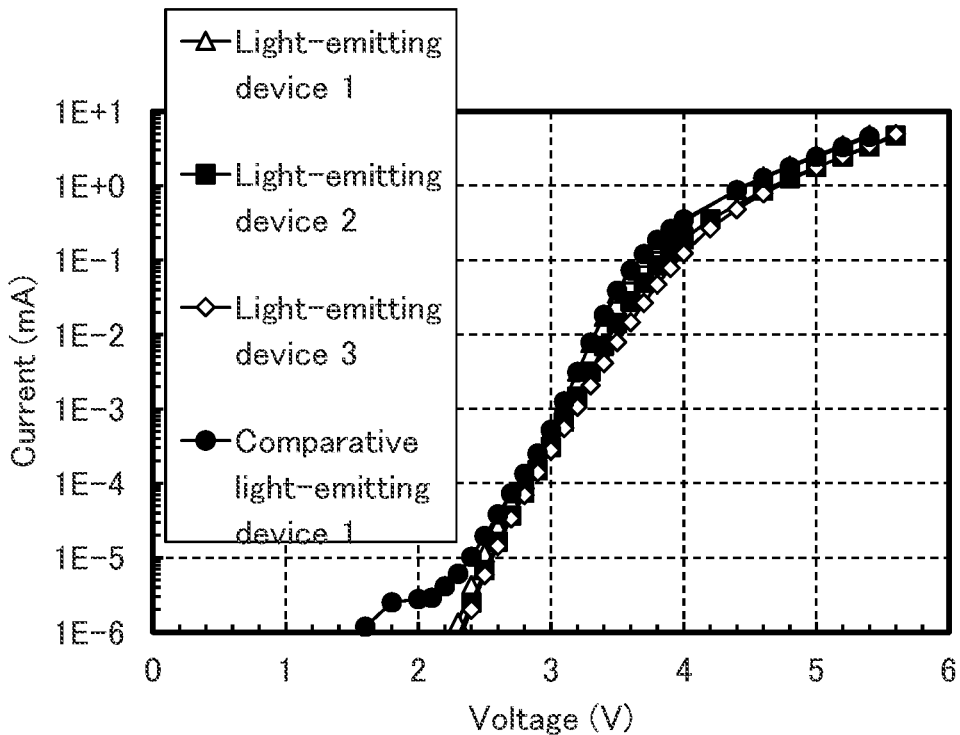
FIG. 19 shows the current-voltage characteristics of light-emitting devices 1 to 3 and a comparative light-emitting device 1.
Figure 20:
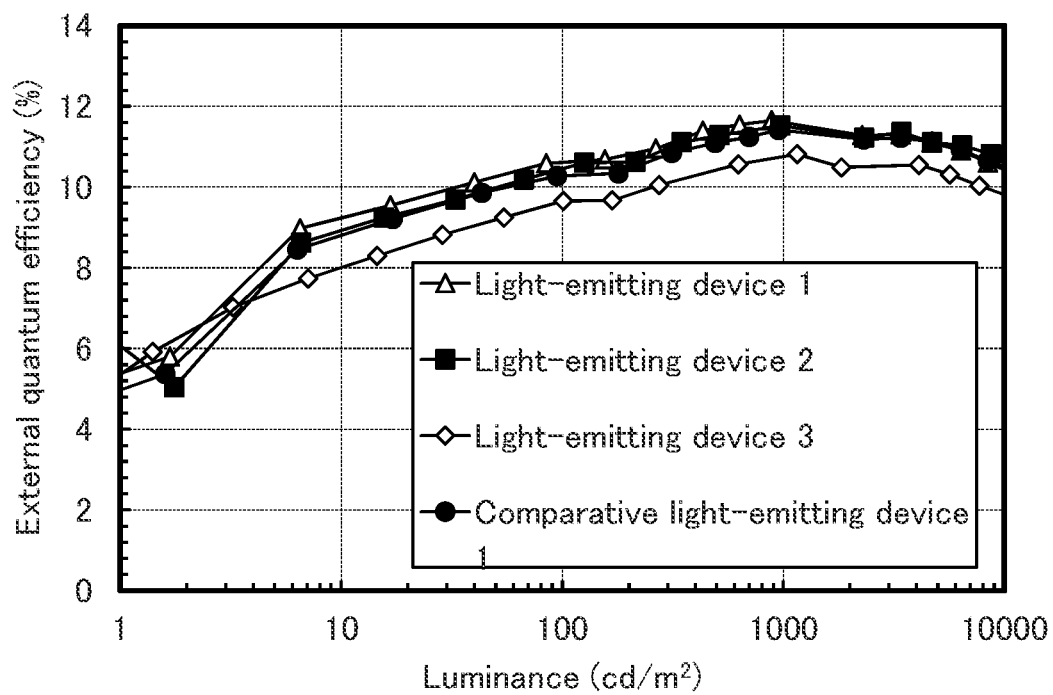
FIG. 20 shows the external quantum efficiency-luminance characteristics of light-emitting devices 1 to 3 and a comparative light-emitting device 1.
Figure 21:
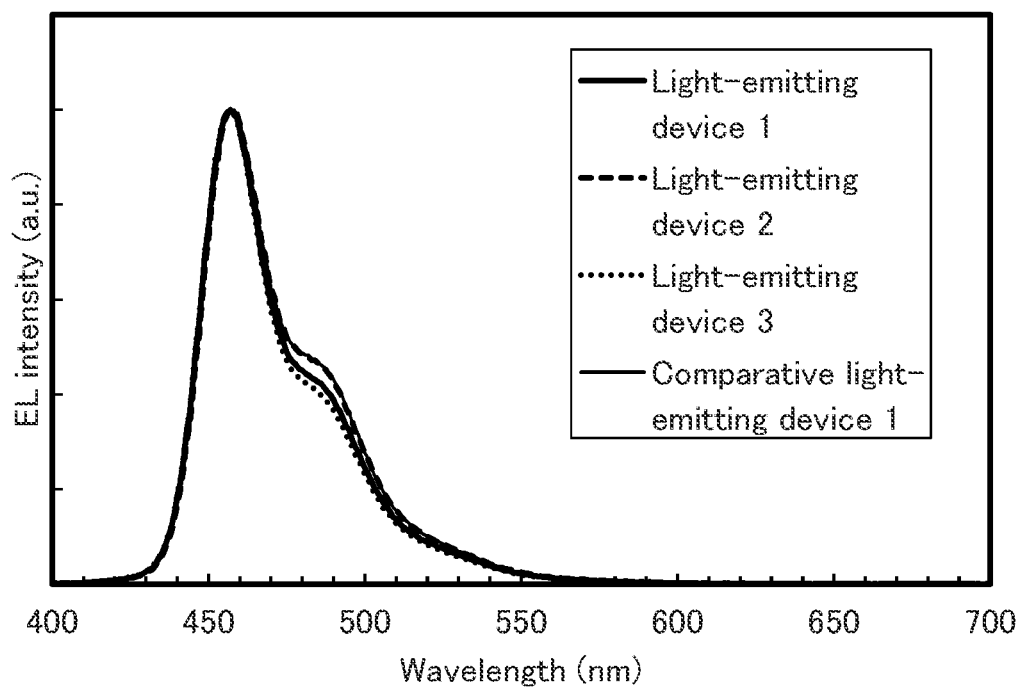
FIG. 21 shows emission spectra of light-emitting devices 1 to 3 and a comparative light-emitting device 1.

FIG. 16 shows the luminance-current density characteristics of the light-emitting devices 1 to 3 and the comparative light-emitting device 1. FIG. 17 shows the current efficiency-luminance characteristics thereof. FIG. 18 shows the luminance-voltage characteristics thereof. FIG. 19 shows the current-voltage characteristics thereof. FIG. 20 shows the external quantum efficiency-luminance characteristics thereof. FIG. 21 shows the emission spectra thereof. Table 3 shows the main characteristics of the light-emitting devices 1 to 3 and the comparative light-emitting device 1 at a luminance of about 1000 cd/m$^2$.

TABLE 3

|  | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting device 1 | 4.0 | 0.33 | 8.3 | 0.14 | 0.11 | 10.6 | 11.6 |
| Light-emitting device 2 | 4.2 | 0.35 | 8.8 | 0.14 | 0.12 | 11.0 | 11.5 |
| Light-emitting device 3 | 4.4 | 0.48 | 12.0 | 0.14 | 0.10 | 9.6 | 10.8 |
| Comparative light-emitting device 1 | 4.0 | 0.35 | 8.7 | 0.14 | 0.12 | 10.9 | 11.4 |

FIG. 16 to FIG. 21 and Table 3 show that the light-emitting devices 1 to 3 of one embodiment of the present invention and the comparative light-emitting device 1 are blue-light-emitting devices with favorable initial characteristics.

Figure 22:
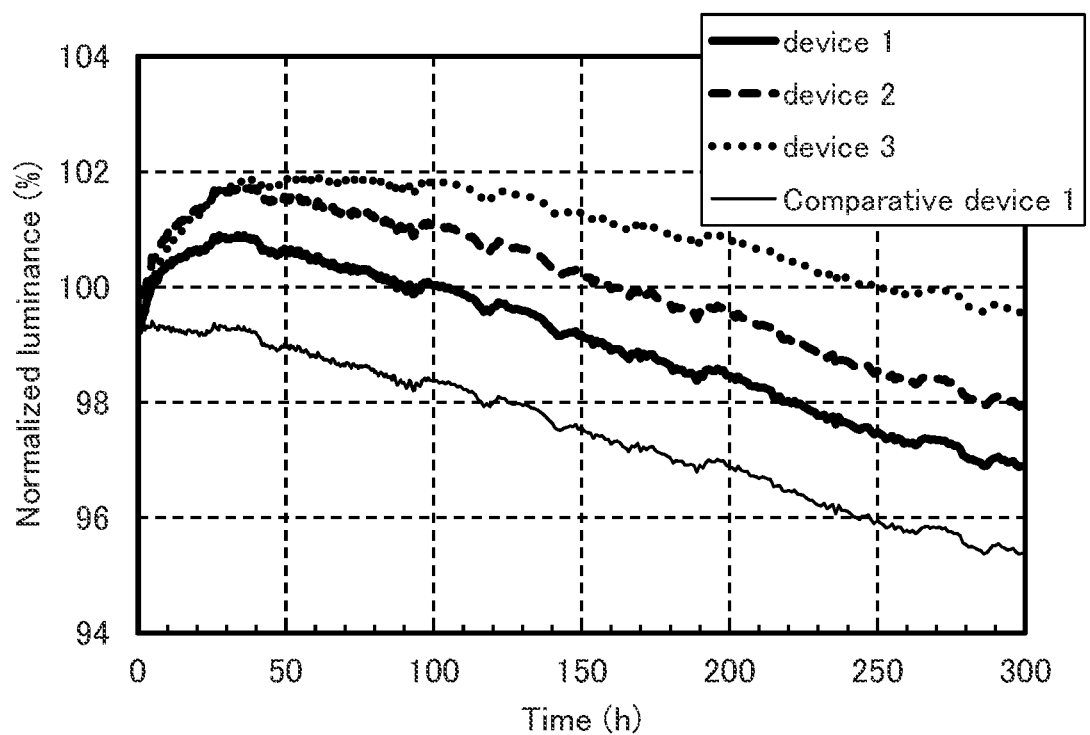
FIG. 22 shows the time dependence of normalized luminance of light-emitting devices 1 to 3 and a comparative light-emitting device 1.

FIG. 22 is a graph showing a change in luminance of the light-emitting devices 1 to 3 (devices 1 to 3 in FIG. 22) and the comparative light-emitting device 1 (comparative device 1 in FIG. 22) over driving time at a current density of 50 mA/cm$^2$. As shown in FIG. 22, the luminance of the light-emitting devices 1 to 3 of one embodiment of the present invention increases after the start of the driving, becomes higher than the initial luminance, and then gradually decreases. That is, the decay curve has the maximum value. This results in a significant improvement in the driving lifetime particularly in the state with a small decay of approximately 2% to 5%. In addition, a change in the ratio of ZADN to Liq in the electron-transport layer enables control of the degree of a luminance increase.

Example 2
In this example, light-emitting devices 4 and 5 of one embodiment of the present invention are described. Structural formulae of organic compounds used for the light-emitting devices 4 and 5 are shown below.
[Chemical Formulae 6]
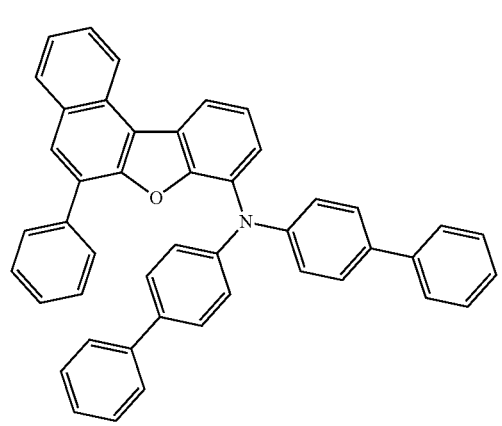
BBABnf (i)
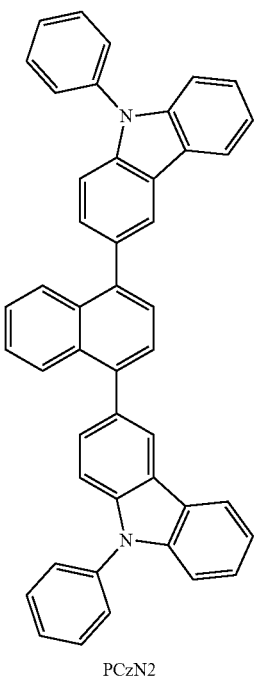
PCzN2 (ii)
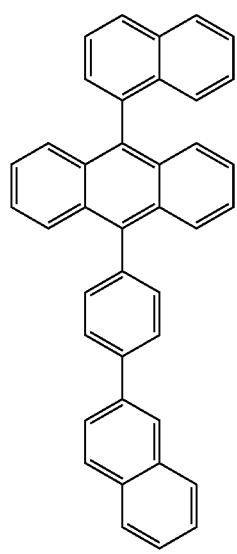
αN-βNPAnth (iii)

(iv)
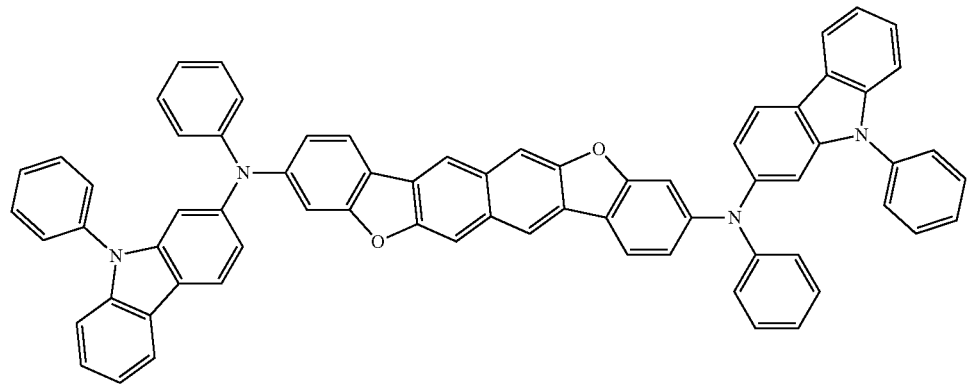
3,10PCA2Nbf(IV)-02
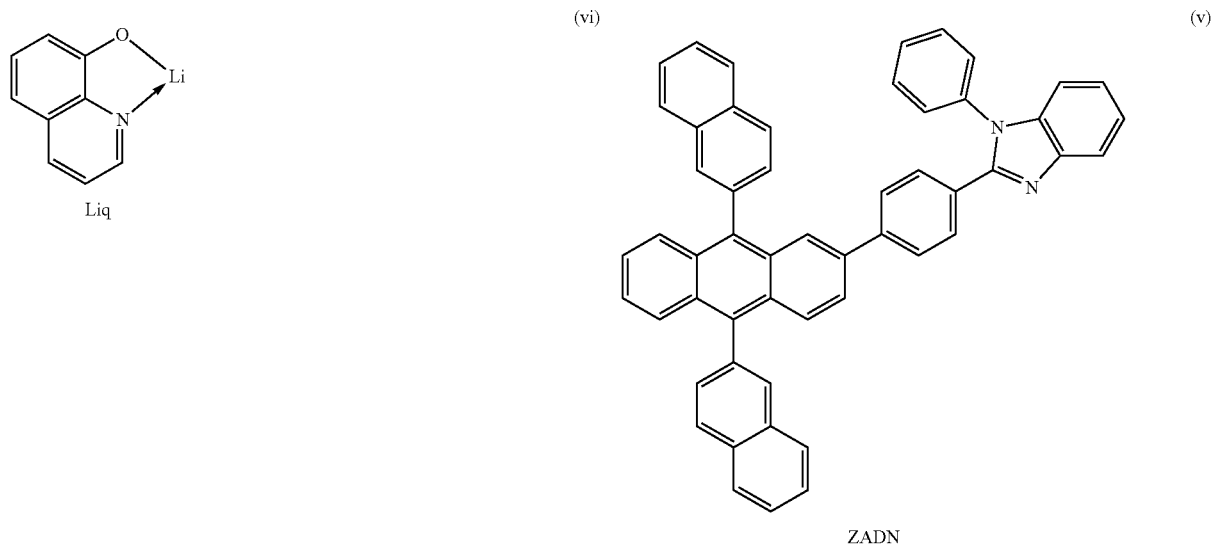
Liq
ZADN
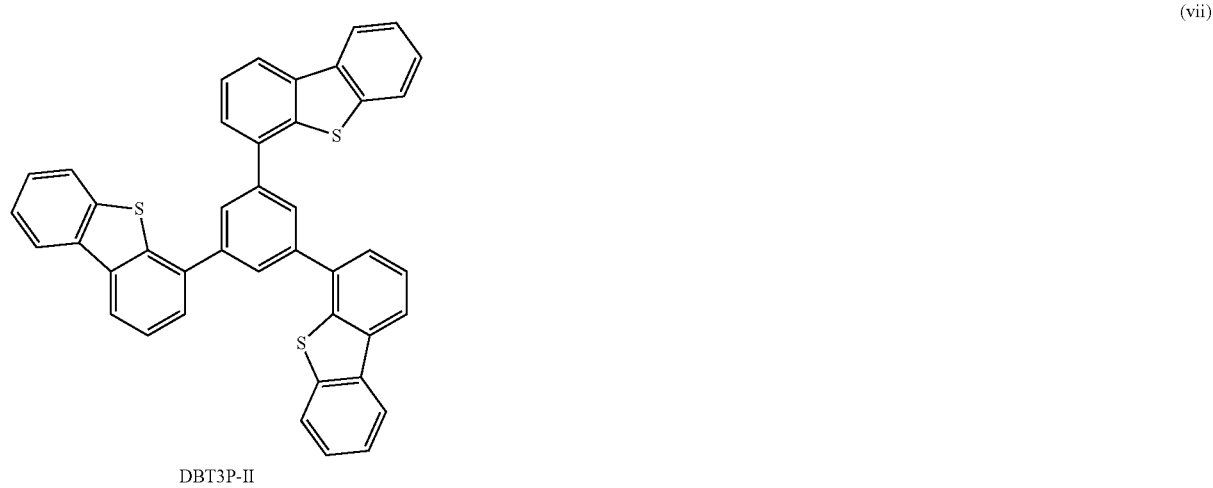
DBT3P-II (Fabrication Method of Light-Emitting Devices 4 and 5)

First, as a reflective electrode, an alloy film of silver (Ag), palladium (Pd), and copper (Cu), i.e., an Ag—Pd—Cu (APC) film, was formed over a glass substrate to a thickness of 100 nm by a sputtering method, and then, as a transparent electrode, indium tin oxide containing silicon oxide (ITSO) was formed to a thickness of 85 nm by a sputtering method, whereby the anode 101 was formed. The electrode area was set to 4 mm² (2 mm×2 mm).

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N,N-bis(4-biphenyl)-6-phenylbenzo[b]naphtho[1,2-d]furan-8-amine (abbreviation: BBABnf) represented by Structural Formula (i) and ALD-MP001Q (produced by Analysis Atelier Corporation, material serial No. 1S20170124) were deposited on the anode 101 to a thickness of 10 nm by co-evaporation using a resistance-heating method such that the weight ratio of BBABnf to ALD-MP001Q was 1:0.05, whereby the hole-injection layer 111 was formed.

Subsequently, over the hole-injection layer 111, BBABnf was deposited by evaporation to a thickness of 25 nm to form the first hole-transport layer 112-1, and then 3,3'-(naphthalene-1,4-diyl)bis(9-phenyl-9H-carbazole) (abbreviation: PCzN2) represented by Structural Formula (ii) was deposited by evaporation to a thickness of 10 nm to form the second hole-transport layer 112-2, whereby the hole-transport layer 112 was formed. Note that the second hole-transport layer 112-2 also functions as an electron-blocking layer.

Then, 9-(1-naphthyl)-10-[4-(2-naphthyl)phenyl]anthracene (abbreviation: αN-βNPAnth) represented by Structural Formula (iii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by Structural Formula (iv) were deposited by co-evaporation to a thickness of 25 nm such that the weight ratio of αN-βNPanth to 3,10PCA2Nbf(IV)-02 was 1:0.015, whereby the light-emitting layer 113 was formed.

Then, over the light-emitting layer 113, 2-{4-[9,10-di(naphthalen-2-yl)-2-anthryl]phenyl}-1-phenyl-1H-benzimidazole (abbreviation: ZADN) represented by Structural Formula (v) and 8-hydroxyquinolinatolithium (abbreviation: Liq) represented by Structural Formula (vi) were deposited by co-evaporation to a thickness of 12.5 nm such that the weight ratio of ZADN to Liq was 0.7:1, and successively, ZADN and Liq were deposited by co-evaporation to a thickness of 12.5 nm such that the weight ratio of ZADN to Liq was 1:0.7, whereby the electron-transport layer 114 was formed.

After the formation of the electron-transport layer 114, the cathode 102 was formed to a thickness of 15 nm by evaporation of silver (Ag) and magnesium (Mg) in a volume ratio of Ag: Mg=1:0.1. Thus, the light-emitting devices 4 and 5 were fabricated. The cathode 102 is a transflective electrode having a function of reflecting light and a function of transmitting light; thus, the light-emitting devices 4 and 5 of this example are each a top-emission device in which light is extracted through the cathode 102. Over the cathode 102, 1,3,5-tri(dibenzothiophen-4-yl)benzene (abbreviation: DBT3P-II) represented by Structural Formula (vii) was deposited by evaporation to a thickness of 80 nm so that extraction efficiency can be improved.

The structures of the light-emitting devices 4 and 5 are listed in the following table.

TABLE 4

| | Hole-injection layer | Hole-transport layer 1 | Hole-transport layer 2 | Light-emitting layer | Electron-transport layer | Electron-transport layer |
| --- | --- | --- | --- | --- | --- | --- |
| | 10 nm | 25 nm | 10 nm | 25 nm | 12.5 nm | 12.5 nm |
| Light-emitting devices 4 and 5 | BBABnf: ALD-MP001Q (1:0.05) | BBABnf | PCzN2 | αN-βNP Anth: 3,10PCA2Nbf(IV)-02 (1:0.015) | ZADN: Liq (0.7:1) | ZADN: Liq (1:0.7) |

The HOMO levels, the LUMO levels, and the electron mobilities of the organic compounds used in this example are listed in the following table. The electron mobilities were measured when the square root of the electric field strength [V/cm] was 600.

TABLE 5

| | HOMO level (eV) | LUMO level (eV) | Electron mobility (cm²/Vs) |
| --- | --- | --- | --- |
| BBABnf | −5.56 | — | — |
| PCzN2 | −5.71 | — | — |
| αN-βNP Anth | −5.85 | −2.74 | — |
| ZADN | — | −2.87 | — |
| ZADN: Liq (1:1) | — | — | $3.1 \times 10^{-6}$ |

The light-emitting devices were sealed using a glass substrate in a glove box containing a nitrogen atmosphere so as not to be exposed to the air (a sealant was applied to surround the devices and UV treatment and heat treatment at 80° C. for 1 hour were performed at the time of sealing). Then, the initial characteristics and reliability of the light-emitting devices were measured. Note that the measurement was performed at room temperature.

Figure 30:
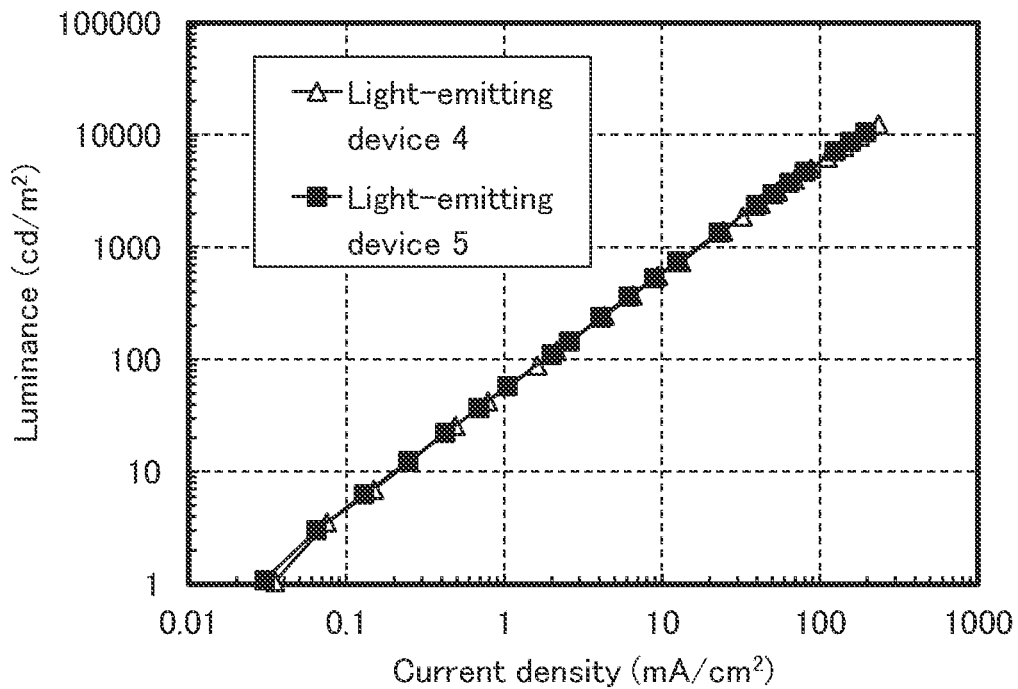
FIG. 30 shows the luminance-current density characteristics of light-emitting devices 4 and 5.
Figure 31:
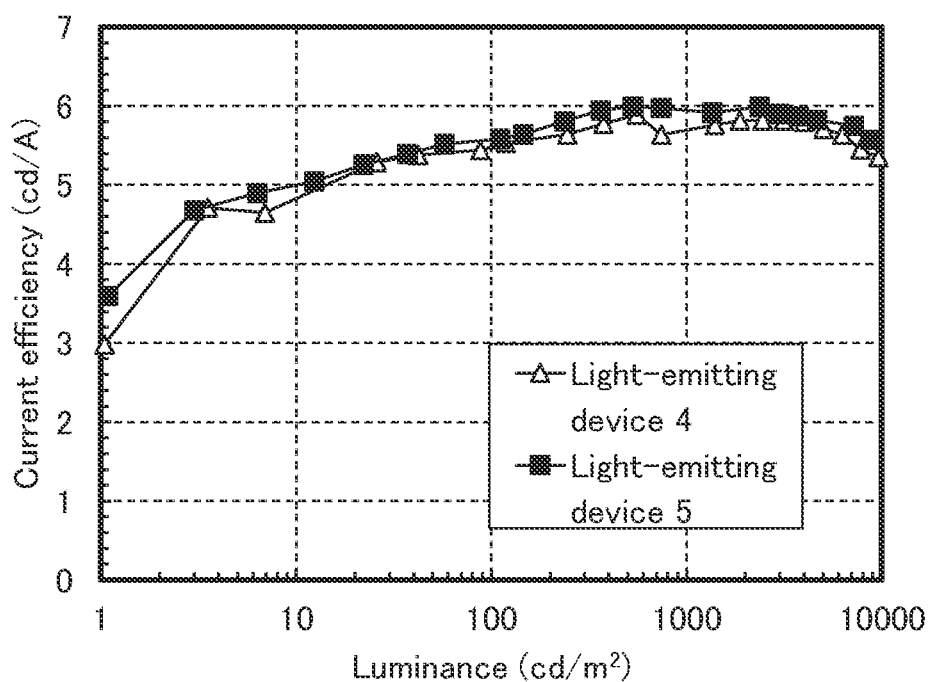
FIG. 31 shows the current efficiency-luminance characteristics of light-emitting devices 4 and 5.
Figure 32:
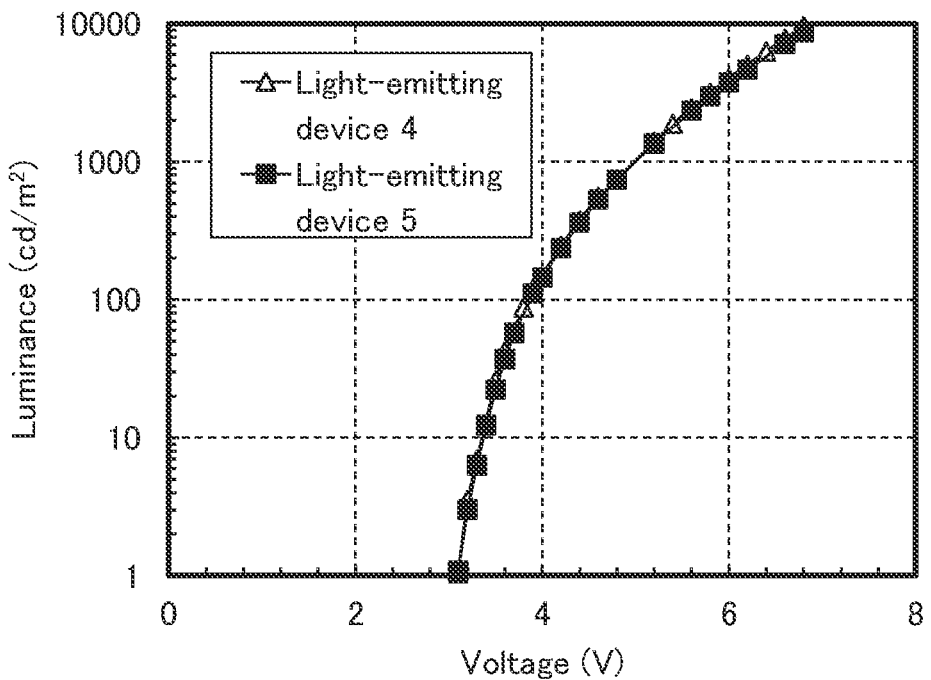
FIG. 32 shows the luminance-voltage characteristics of light-emitting devices 4 and 5.
Figure 33:
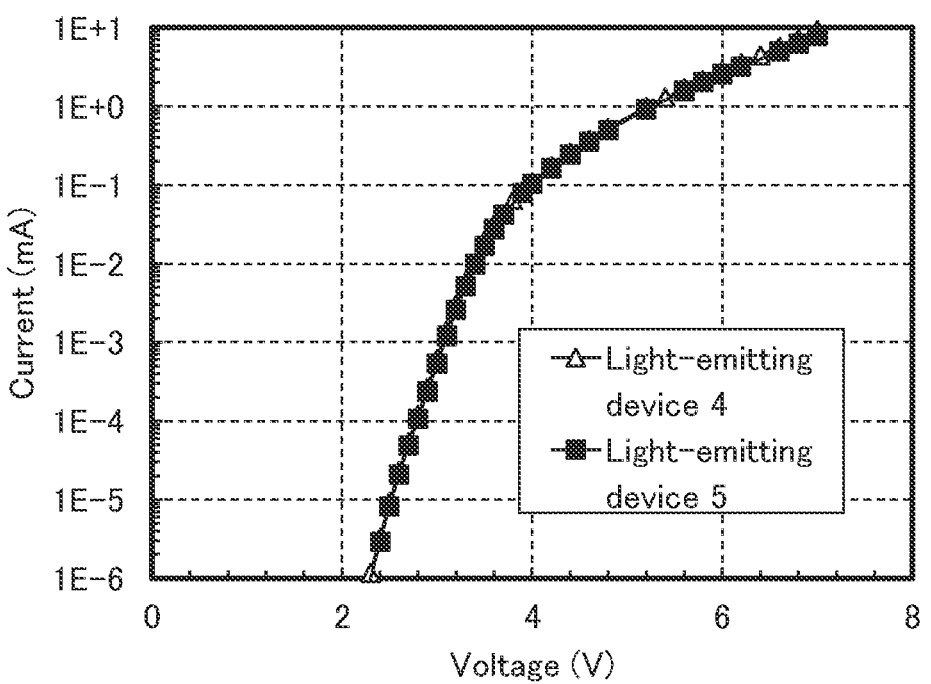
FIG. 33 shows the current-voltage characteristics of light-emitting devices 4 and 5.
Figure 34:
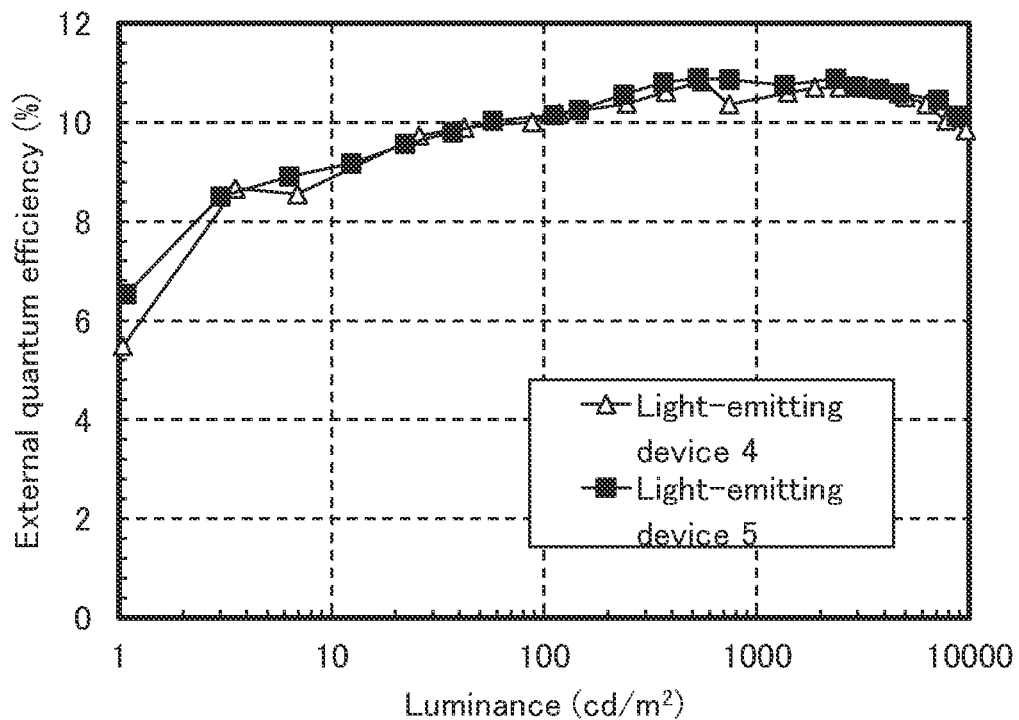
FIG. 34 shows the external quantum efficiency-luminance characteristics of light-emitting devices 4 and 5.
Figure 35:
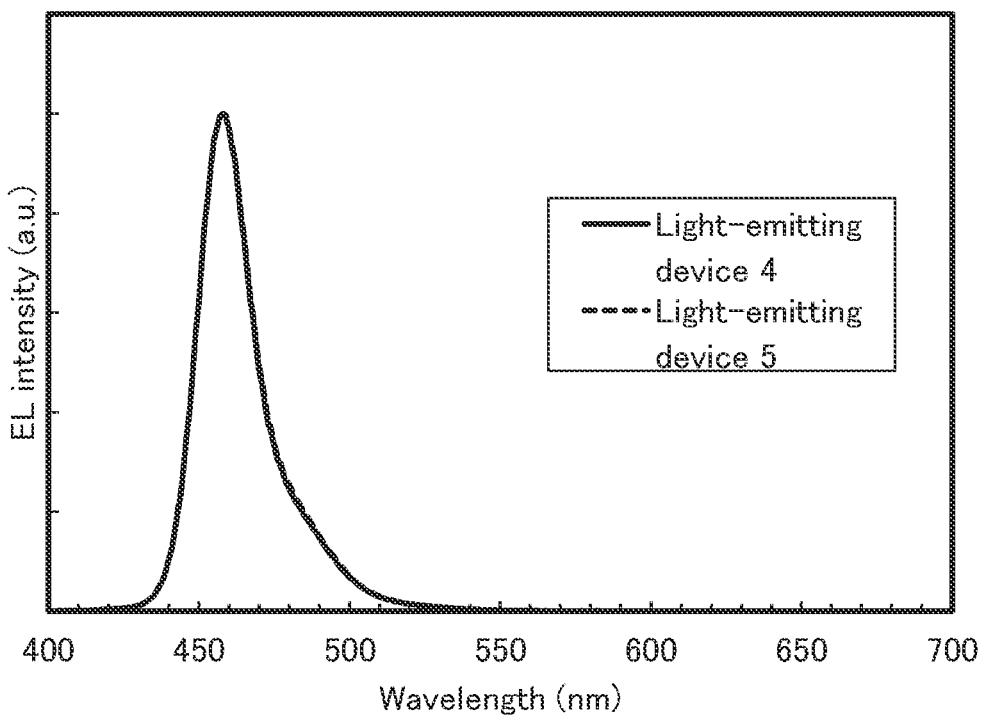
FIG. 35 shows emission spectra of light-emitting devices 4 and 5.

FIG. 30 shows the luminance-current density characteristics of the light-emitting devices 4 and 5. FIG. 31 shows the current efficiency-luminance characteristics thereof. FIG. 32 shows the luminance-voltage characteristics thereof. FIG. 33 shows the current-voltage characteristics thereof. FIG. 34 shows the external quantum efficiency-luminance characteristics thereof. FIG. 35 shows the emission spectra thereof. Table 6 shows the main characteristics of the light-emitting devices 4 and 5 at a luminance of about 1000 cd/m².

TABLE 6

|  | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting device 4 | 4.8 | 0.53 | 13.2 | 0.14 | 0.05 | 5.6 | 10.4 |
| Light-emitting device 5 | 4.8 | 0.50 | 12.4 | 0.14 | 0.05 | 6.0 | 10.9 |

FIG. 30 to FIG. 35 and Table 6 show that the light-emitting devices 4 and 5 of one embodiment of the present invention are blue-light-emitting devices with favorable characteristics.

Figure 36:
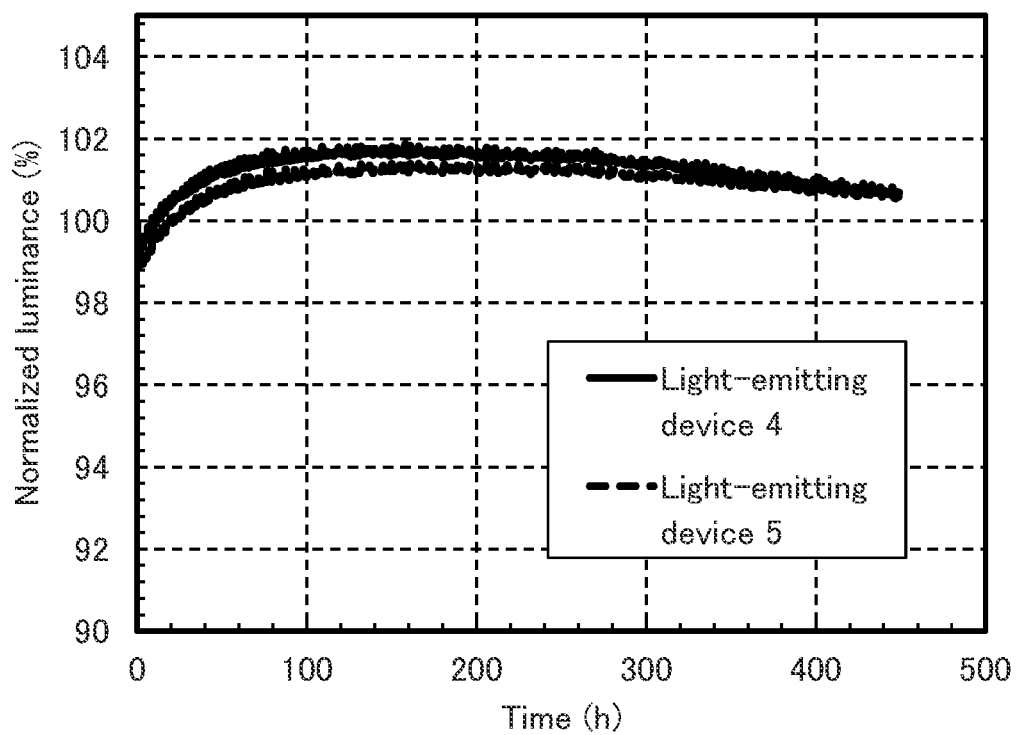
FIG. 36 shows the time dependence of normalized luminance of light-emitting devices 4 and 5.

FIG. 36 shows a change in luminance of the light-emitting devices over driving time under the conditions where the initial luminance was 1450 cd/m$^2$ and the current density was constant. As shown in FIG. 36, the luminance of the light-emitting devices 4 and 5 of one embodiment of the present invention increases after the start of the driving, becomes higher than the initial luminance, and then gradually decreases. That is, the decay curve has the maximum value. This reveals that the light-emitting devices 4 and 5 maintain 101% of the initial luminance even when 450 hours have passed, which demonstrates that the driving lifetime in the state with a small decay can be significantly improved.

Example 3

In this example, a light-emitting device 6 of one embodiment of the present invention is described. Structural formulae of organic compounds used for the light-emitting device 6 are shown below.

[Chemical Formulae 7]

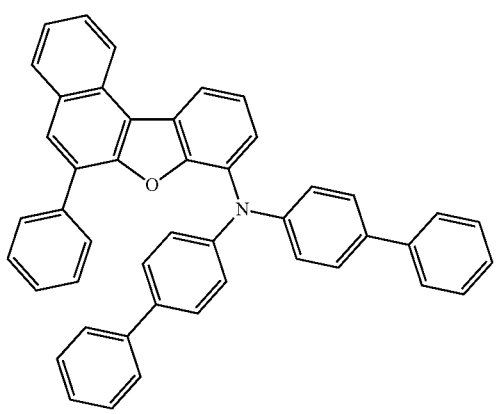

(i)

BBABnf

-continued

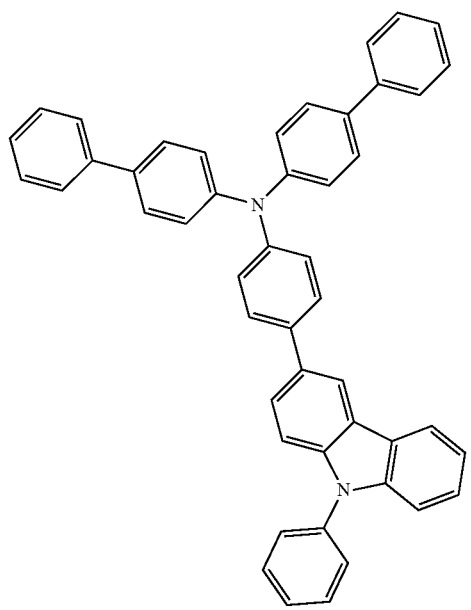

(viii)

PCBBilBP (ix)

8BP-4mDBtPBfpm

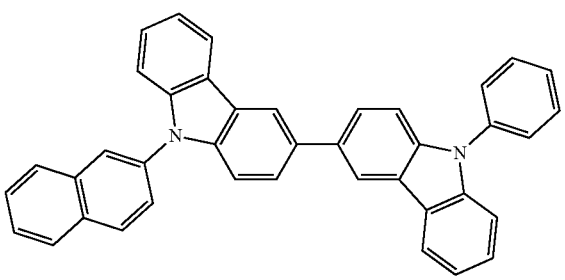

(x)

β NCCP

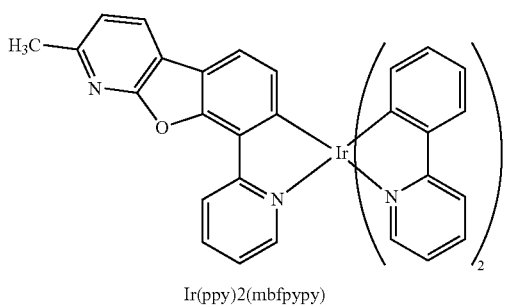

Ir(ppy)2(mbfpypy)

ZAPN

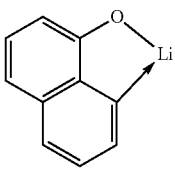

Liq (Fabrication Method of Light-Emitting Device 6)

First, as a reflective electrode, an alloy film of silver (Ag), palladium (Pd), and copper (Cu), i.e., an Ag—Pd—Cu (APC) film, was formed over a glass substrate to a thickness of 100 nm by a sputtering method, and then, as a transparent electrode, indium tin oxide containing silicon oxide (ITSO) was formed to a thickness of 85 nm by a sputtering method, whereby the anode 101 was formed. The electrode area was set to 4 mm² (2 mm×2 mm).

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N,N-bis(4-biphenyl)-6-phenylbenzo[b]naphtho[1,2-d]furan-8-amine (abbreviation: BBABnf) represented by Structural Formula (i) and ALD-MP001Q (produced by Analysis Atelier Corporation, material serial No. 1S20170124) were deposited on the anode 101 to a thickness of 10 nm by co-evaporation using a resistance-heating method such that the weight ratio of BBABnf to ALD-MP001Q was 1:0.05, whereby the hole-injection layer 111 was formed.

Subsequently, over the hole-injection layer 111, BBABnf was deposited by evaporation to a thickness of 10 nm to form the first hole-transport layer 112-1, and then 4,4'-diphenyl-4"-(9-phenyl-9H-carbazol-3-yl)triphenylamine (abbreviation: PCBBi1BP) represented by Structural Formula (viii) was deposited by evaporation to a thickness of 50 nm to form the second hole-transport layer 112-2, whereby the hole-transport layer 112 was formed. Note that the second hole-transport layer 112-2 also functions as an electron-blocking layer.

Then, 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm) represented by Structural Formula (ix), 9-(2-naphthyl)-9'-phenyl-9H,9'H-3,3'-bicarbazole (abbreviation: βNCCP) represented by Structural Formula (x), and [2-methyl-(2-pyridinyl-κN)benzofuro[2,3-b]pyridine-κC] bis[2-(2-pyridinyl-κN)phenyl-κC]iridium(III) (abbreviation: [Ir(ppy)₂(mbfpypy)]) represented by Structural Formula (xi) were deposited by co-evaporation to a thickness of 50 nm such that the weight ratio of 8BP-4mDBtPBfpm to βNCCP and [Ir(ppy)₂(mbfpypy)] was 0.4:0.6:0.1, whereby the light-emitting layer 113 was formed.

Then, over the light-emitting layer 113, 2-{4-[9,10-di (naphthalen-2-yl)-2-anthryl]phenyl}-1-phenyl-1H-benzimidazole (abbreviation: ZADN) represented by Structural Formula (v) and 8-hydroxyquinolinatolithium (abbreviation: Liq) represented by Structural Formula (vi) were deposited by co-evaporation to a thickness of 17.5 nm such that the weight ratio of ZADN to Liq was 0.3:1.0, and successively, ZADN and Liq were deposited by co-evaporation to a thickness of 17.5 nm such that the weight ratio of ZADN to Liq was 1.0:0.3, whereby the electron-transport layer 114 was formed.

After the formation of the electron-transport layer 114, the cathode 102 was formed to a thickness of 15 nm by evaporation of silver (Ag) and magnesium (Mg) in a volume ratio of Ag: Mg=1:0.3. Thus, the light-emitting device 6 was fabricated. The cathode 102 is a transflective electrode having a function of reflecting light and a function of transmitting light; thus, the light-emitting device 6 of this example is a top-emission device in which light is extracted through the cathode 102. Over the cathode 102, 1,3,5-tri (dibenzothiophen-4-yl)benzene (abbreviation: DBT3P-II) was deposited by evaporation to a thickness of 80 nm so that extraction efficiency can be improved.

The structure of the light-emitting device 6 is listed in the following table

TABLE 7

| | Hole-injection layer 10 nm | Hole-transport layer 1 10 nm | Hole-transport layer 2 50 nm | Light-emitting layer 50 nm | Electron-transport layer 1 17.5 nm | Electron-transport layer 2 17.5 nm |
|---|---|---|---|---|---|---|
| Light-emitting device 6 | BBABnf: ALD-MP001Q (1:0.05) | BBABnf | PCBBi1BP | 8BP-4mDBtPBfpm: βNCCP: Ir(ppy)₂(mbfpypy) (0.4:0.6:0.1) | ZADN:Liq (0.3:1.0) | (1.0:0.3) |

The HOMO levels, the LUMO levels, and the electron mobilities of the organic compounds used in this example are listed in the following table. The electron mobilities were measured when the square root of the electric field strength [V/cm] was 600.

TABLE 8

| | HOMO level (eV) | LUMO level (eV) | Electron mobility (cm$^2$/Vs) |
|---|---|---|---|
| BBABnf | −5.56 | — | — |
| PCBBi1 BP | −5.42 | — | — |
| βNCCP | −5.62 | −2.21 | — |
| 8BP-4mDBtPBfpm | −6.21 | −3.01 | — |
| ZADN | — | −2.87 | — |
| ZADN: Liq (1:1) | — | — | $3.1 \times 10^{-6}$ |

The light-emitting device was sealed using a glass substrate in a glove box containing a nitrogen atmosphere so as not to be exposed to the air (a sealant was applied to surround the device and UV treatment and heat treatment at 80° C. for 1 hour were performed at the time of sealing). Then, the initial characteristics and reliability of the light-emitting device were measured. Note that the measurement was performed at room temperature.

Figure 37:
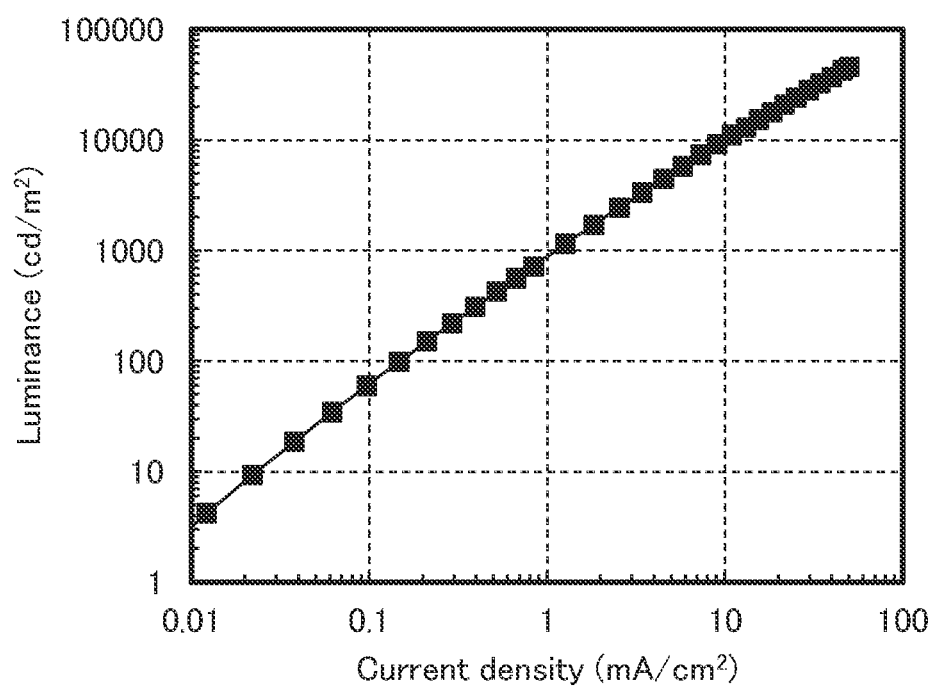
FIG. 37 shows the luminance-current density characteristics of a light-emitting device 6.
Figure 38:
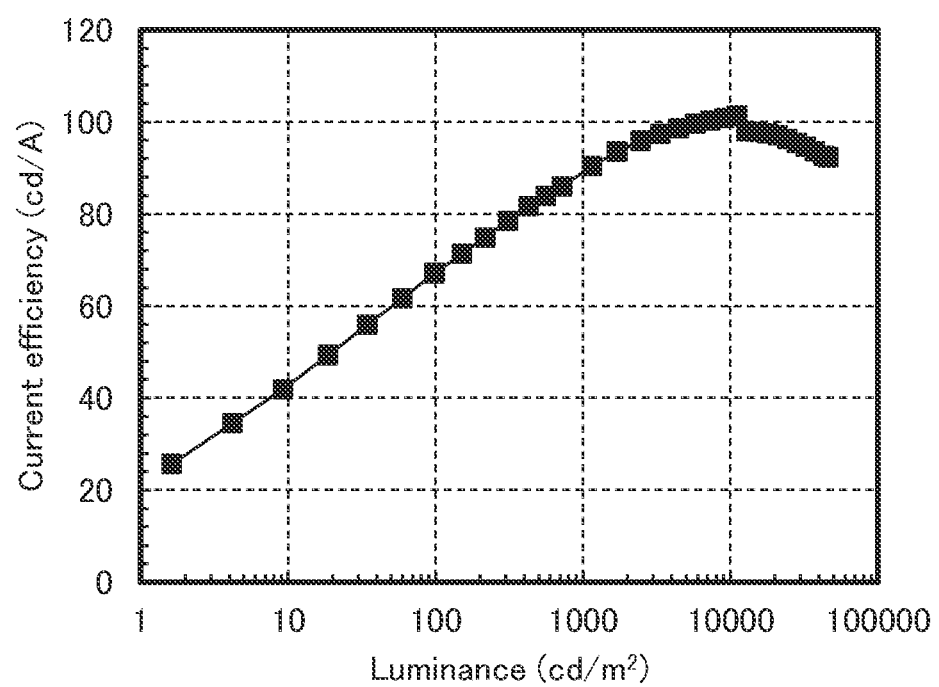
FIG. 38 shows the current efficiency-luminance characteristics of a light-emitting device 6.
Figure 39:
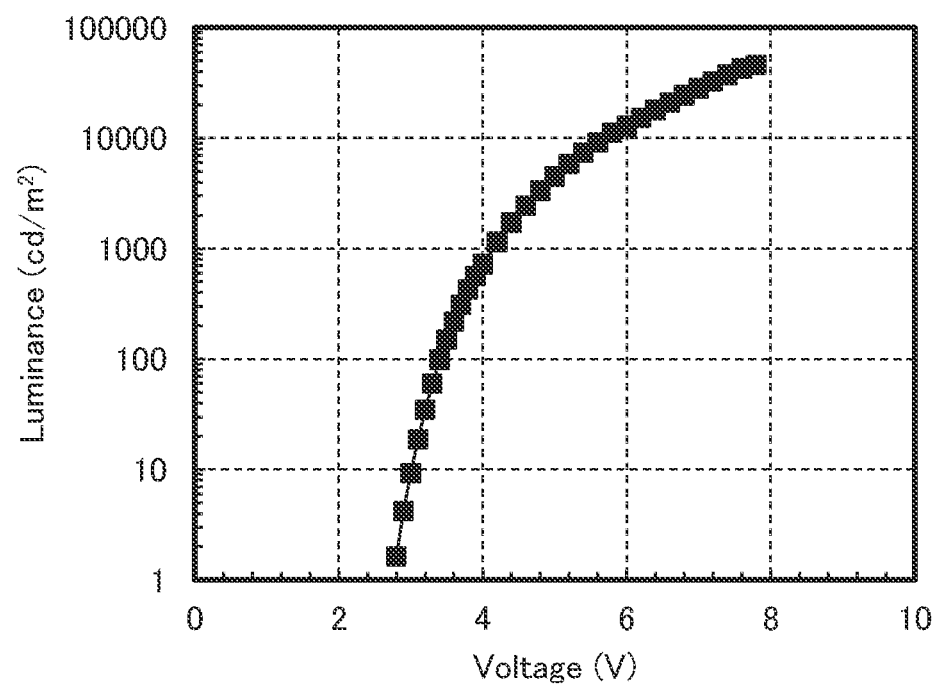
FIG. 39 shows the luminance-voltage characteristics of a light-emitting device 6.
Figure 40:
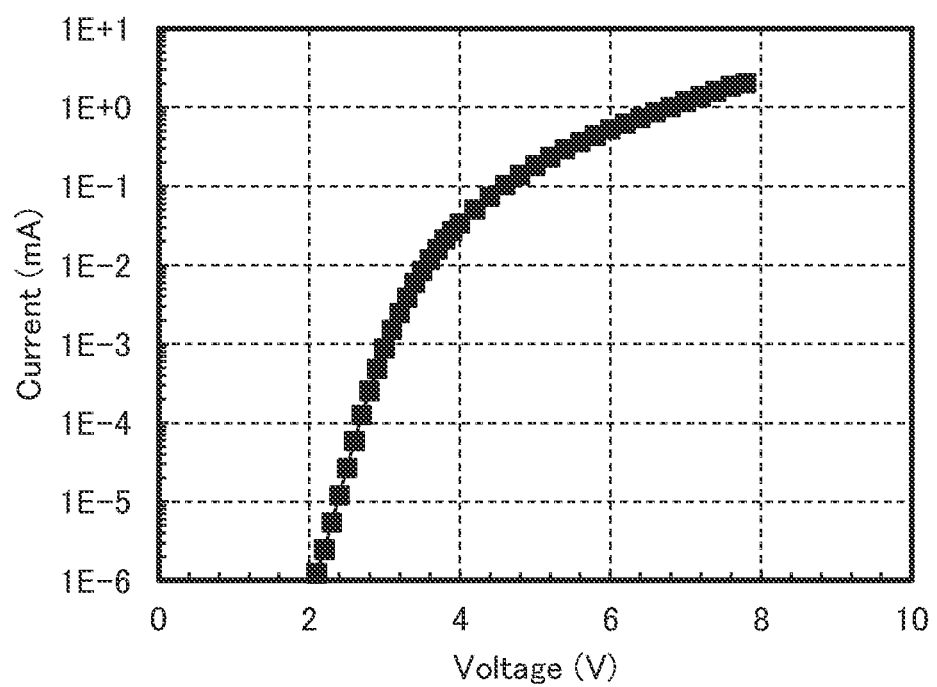
FIG. 40 shows the current-voltage characteristics of a light-emitting device 6.
Figure 41:
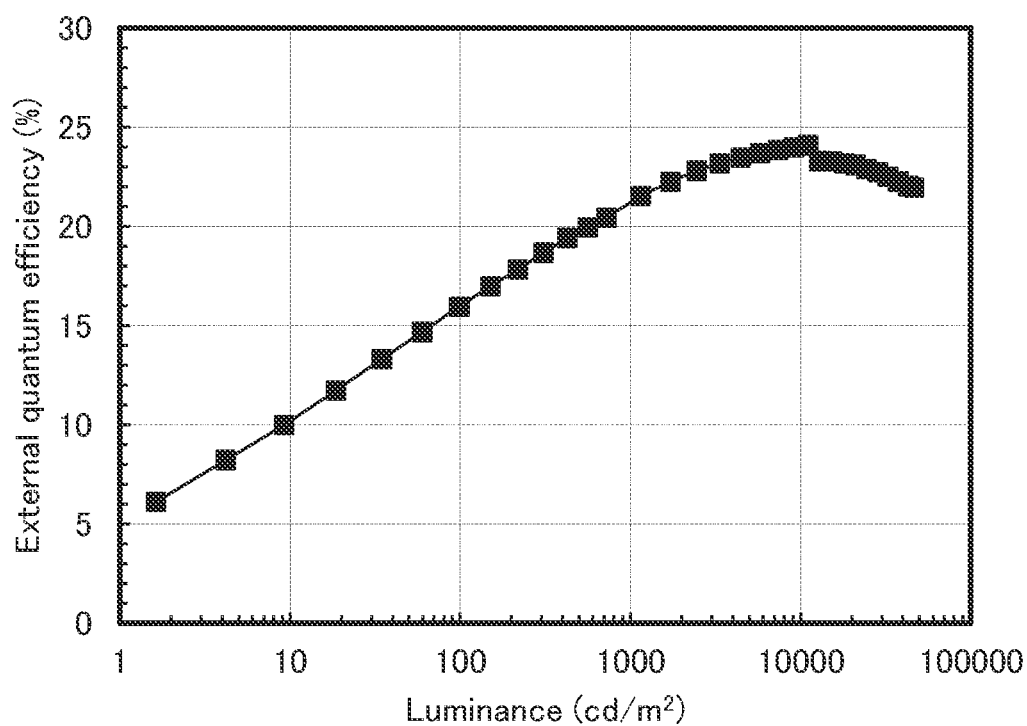
FIG. 41 shows the external quantum efficiency-luminance characteristics of a light-emitting device 6.
Figure 42:
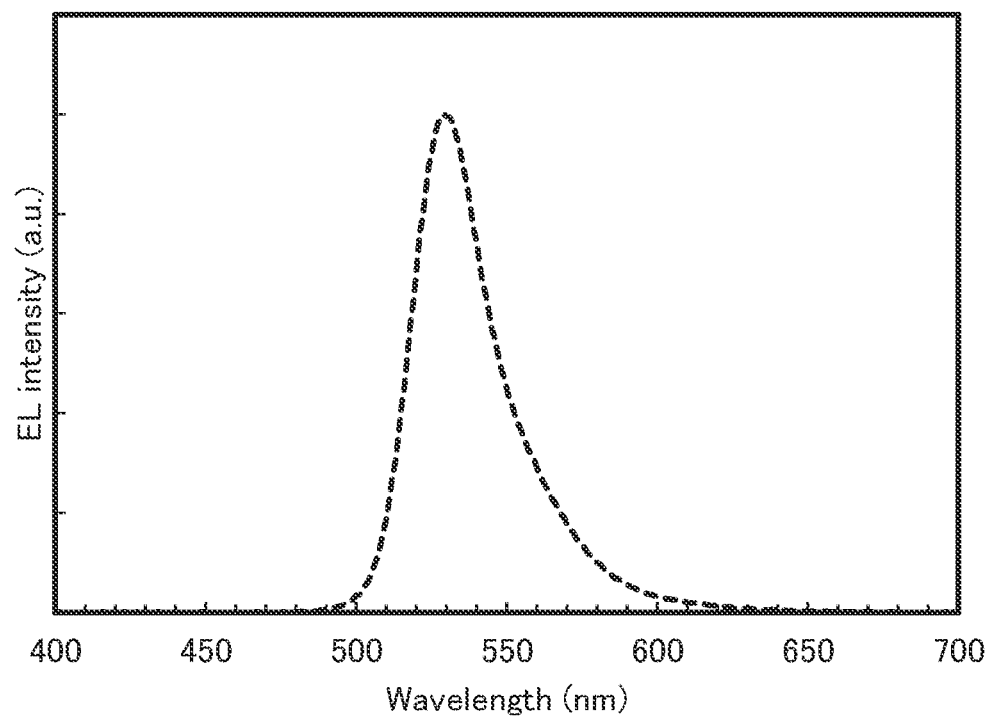
FIG. 42 shows an emission spectrum of a light-emitting device 6.

FIG. 37 shows the luminance-current density characteristics of the light-emitting device 6, FIG. 38 shows the current efficiency-luminance characteristics thereof, FIG. 39 shows the luminance-voltage characteristics thereof, FIG. 40 shows the current-voltage characteristics thereof, FIG. 41 shows the external quantum efficiency-luminance characteristics thereof, and FIG. 42 shows the emission spectrum thereof. Table 9 shows the main characteristics of the light-emitting device 6 at a luminance of about 1000 cd/m².

TABLE 9

| | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting device 6 | 4.2 | 0.05 | 1.3 | 0.26 | 0.72 | 90.5 | 21.5 |

FIG. 37 to FIG. 42 and Table 9 show that the light-emitting device 6 of one embodiment of the present invention is a light-emitting device with favorable characteristics.

Figure 43:
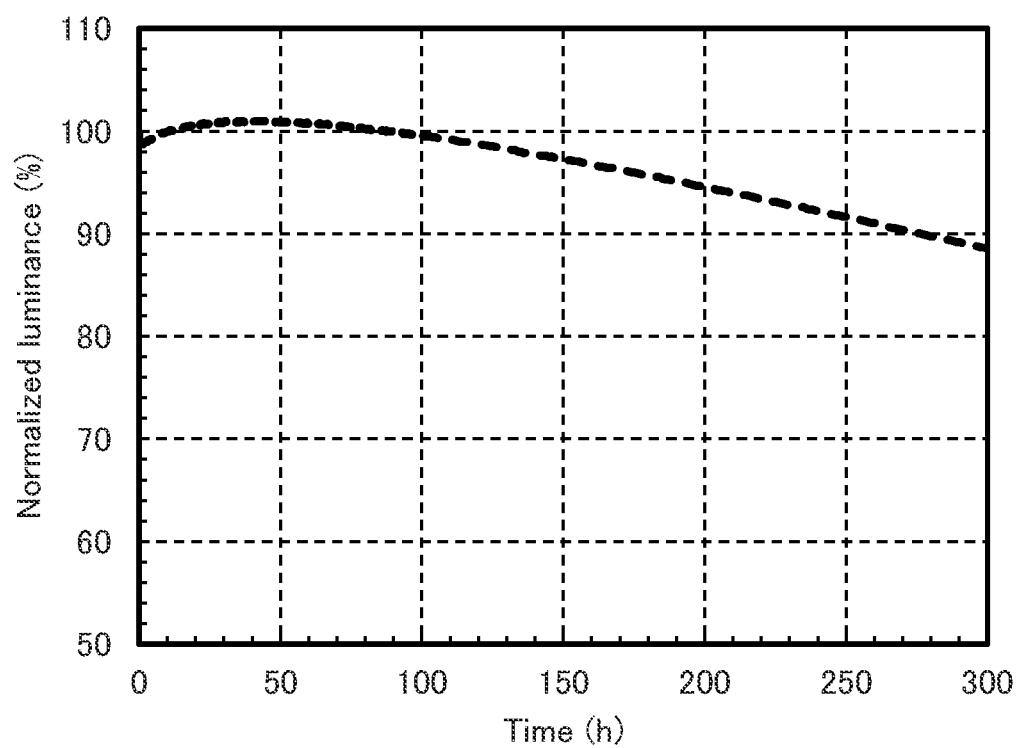
FIG. 43 shows the time dependence of normalized luminance of a light-emitting device 6.

FIG. 43 is a graph showing a change in luminance over driving time at a current density of 50 mA/cm². As shown in FIG. 43, the light-emitting device 6 of one embodiment of the present invention maintains 90% or more of the initial luminance even when 250 hours have passed. This reveals that a reduction in luminance over driving time is particularly small and the light-emitting device 6 of one embodiment of the present invention has a long lifetime.

Example 4

In this example, a light-emitting device 7 of one embodiment of the present invention is described. Structural formulae of organic compounds used for the light-emitting device 7 are shown below.

[Chemical Formulae 8]

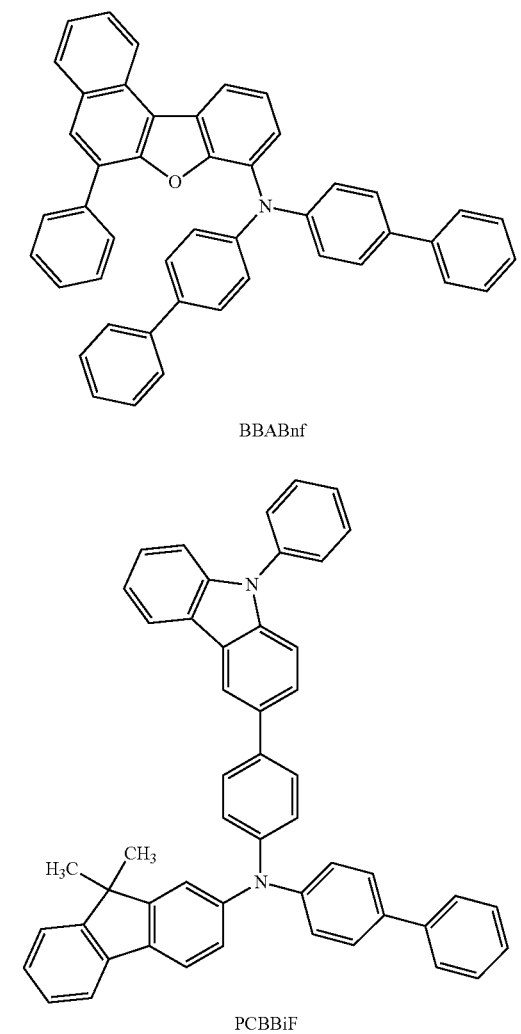

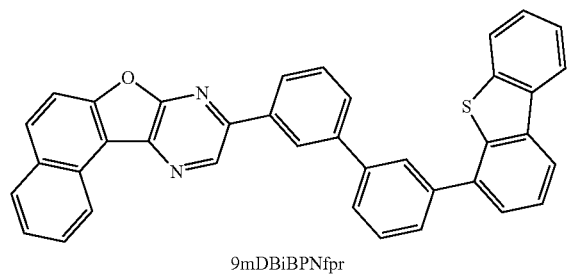

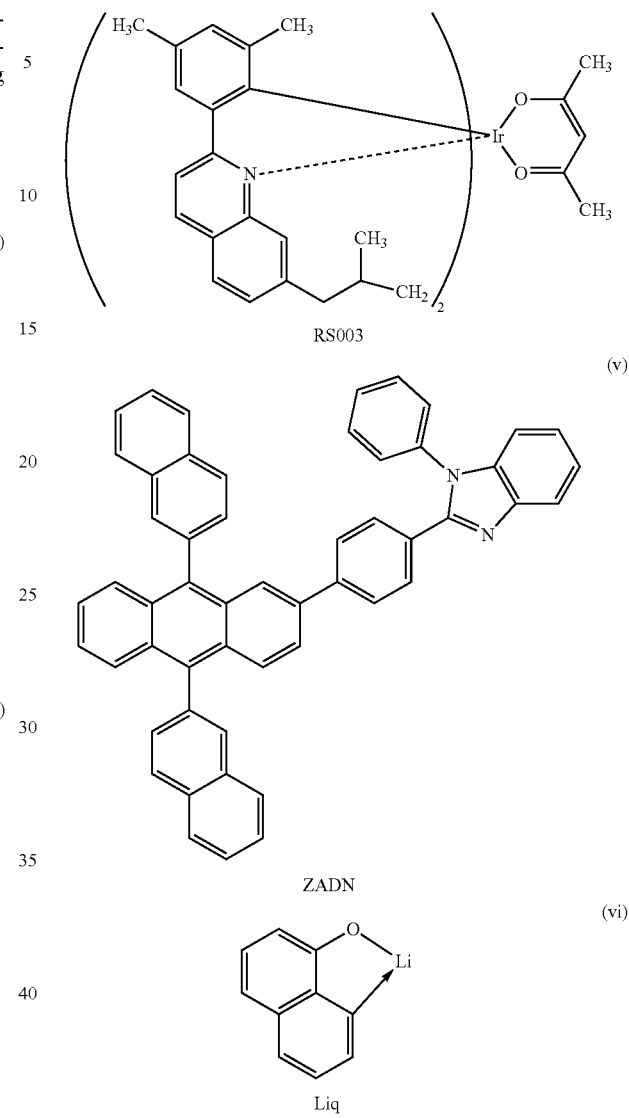

(Fabrication Method of Light-Emitting Device 7)

First, as a reflective electrode, an alloy film of silver (Ag), palladium (Pd), and copper (Cu), i.e., an Ag—Pd—Cu (APC) film, was formed over a glass substrate to a thickness of 100 nm by a sputtering method, and then, as a transparent electrode, indium tin oxide containing silicon oxide (ITSO) was formed to a thickness of 110 nm by a sputtering method, whereby the anode 101 was formed. The electrode area was set to 4 mm² (2 mm×2 mm).

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N,N-bis(4-biphenyl)-6-phenylbenzo[b]naphtho[1,2-d]furan-8-amine (abbreviation: BBABnf) represented by Structural Formula (i) and ALD-MP001Q (produced by Analysis Atelier Corporation, material serial No. 1S20170124) were deposited on the anode 101 to a thickness of 10 nm by co-evaporation using a resistance-heating method such that the weight ratio of BBABnf to ALD-MP001Q was 1:0.05, whereby the hole-injection layer 111 was formed.

Subsequently, over the hole-injection layer 111, BBABnf was deposited by evaporation to a thickness of 30 nm to form the first hole-transport layer 112-1, and then N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (xii) was deposited by evaporation to a thickness of 70 nm to form the second hole-transport layer 112-2, whereby the hole-transport layer 112 was formed. Note that the second hole-transport layer 112-2 also functions as an electron-blocking layer.

Then, 9-[(3'-dibenzothiophen-4-yl)biphenyl-3-yl]naphtho[1',2':4,5]furo[2,3-b]pyrazine (abbreviation: 9mDBtBPNfpr) represented by Structural Formula (xiii), PCBBiF, and bis[4,6-dimethyl-2-(7-(2-methylpropyl)-2-quinolinyl-κN)phenyl-κC](2,4-pentanedionato-κ$^2$O,O') iridium(III) (abbreviation: RS003) represented by Structural Formula (xiv) were deposited by co-evaporation to a thickness of 60 nm such that the weight ratio of 9mDBtBPNfpr to PCBBiF and RS003 was 0.6:0.4:0.05, whereby the light-emitting layer 113 was formed.

Then, over the light-emitting layer 113, 2-{4-[9,10-di (naphthalen-2-yl)-2-anthryl]phenyl}-1-phenyl-1H-benzimidazole (abbreviation: ZADN) represented by Structural Formula (v) and 8-hydroxyquinolinatolithium (abbreviation: Liq) represented by Structural Formula (vi) were deposited by co-evaporation to a thickness of 17.5 nm such that the weight ratio of ZADN to Liq was 0.3:1.0, and successively, ZADN and Liq were deposited by co-evaporation to a thickness of 17.5 nm such that the weight ratio of ZADN to Liq was 1.0:0.3, whereby the electron-transport layer 114 was formed.

After the formation of the electron-transport layer 114, the cathode 102 was formed to a thickness of 15 nm by evaporation of silver (Ag) and magnesium (Mg) in a volume ratio of Ag: Mg=1:0.3. Thus, the light-emitting device 7 was fabricated. The cathode 102 is a transflective electrode having a function of reflecting light and a function of transmitting light; thus, the light-emitting device 7 of this example is a top-emission device in which light is extracted through the cathode 102. Over the cathode 102, 1,3,5-tri (dibenzothiophen-4-yl)benzene (abbreviation: DBT3P-II) was deposited by evaporation to a thickness of 80 nm so that extraction efficiency can be improved.

The structure of the light-emitting device 7 is listed in the following table.

TABLE 10

| | Hole-injection layer 10 nm | Hole-transport layer 1 30 nm | Hole-transport layer 2 70 nm | Light-emitting layer 60 nm | Electron-transport layer 1 17.5 nm | Electron-transport layer 2 17.5 nm |
|---|---|---|---|---|---|---|
| Light-emitting device 7 | BBABnf: ALD-MP001Q (1:0.05) | BBABnf | PCBBIF | 9mDBtBPNfpr: PCBBIF: RS003 (0.6:0.4:0.05) | ZADN: Liq (0.3:1.0) | ZADN: Liq (1.0:0.3) |

The HOMO levels, the LUMO levels, and the electron mobilities of the organic compounds used in this example are listed in the following table. The electron mobilities were measured when the square root of the electric field strength [V/cm] was 600.

TABLE 11

| | HOMO level (eV) | LUMO level (eV) | Electron mobility (cm$^2$/Vs) |
|---|---|---|---|
| BBABnf | −5.56 | — | — |
| PCBBiF | −5.36 | — | — |
| 9mDBtBPNfpr | −6.20 | −3.05 | — |
| ZADN | — | −2.87 | — |
| ZADN: Liq (1:1) | — | — | 3.1 × 10$^{-6}$ |

The light-emitting device was sealed using a glass substrate in a glove box containing a nitrogen atmosphere so as not to be exposed to the air (a sealant was applied to surround the device and UV treatment and heat treatment at 80° C. for 1 hour were performed at the time of sealing). Then, the initial characteristics and reliability of the light-emitting device were measured. Note that the measurement was performed at room temperature.

Figure 44:
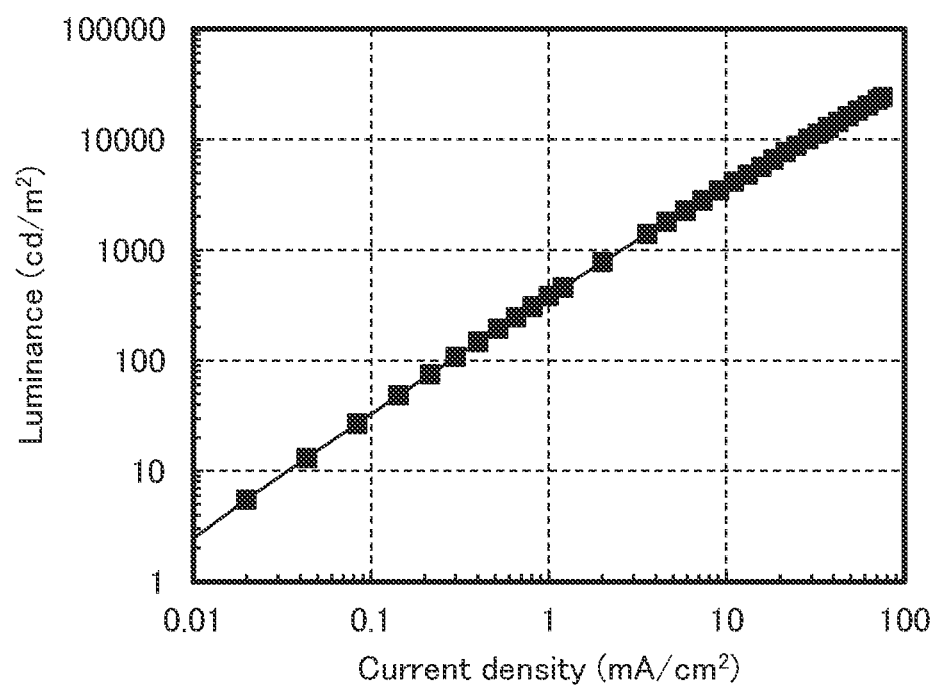
FIG. 44 shows the luminance-current density characteristics of a light-emitting device 7.
Figure 45:
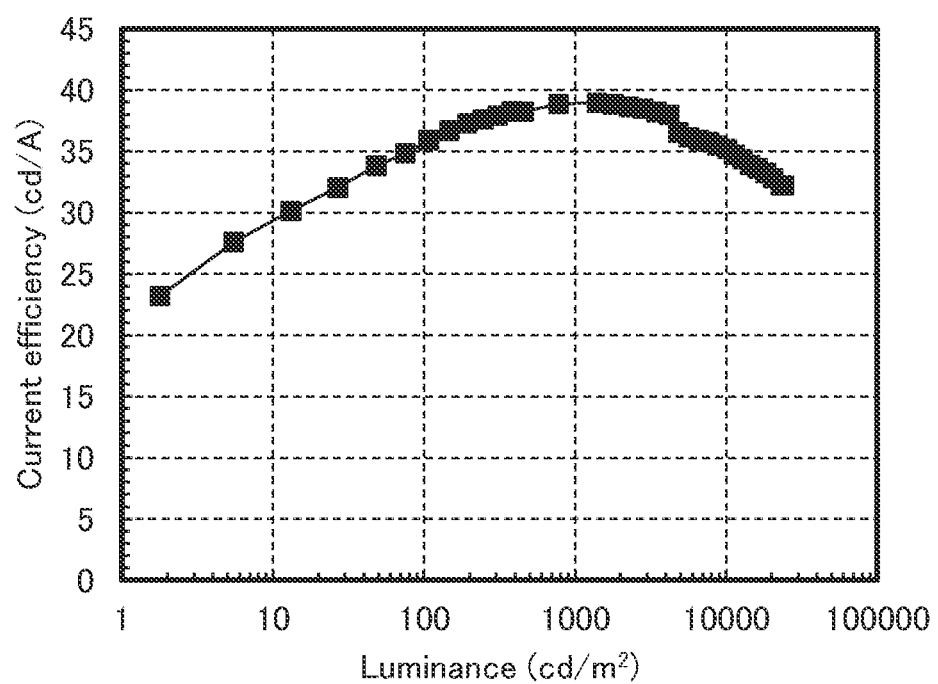
FIG. 45 shows the current efficiency-luminance characteristics of a light-emitting device 7.
Figure 46:
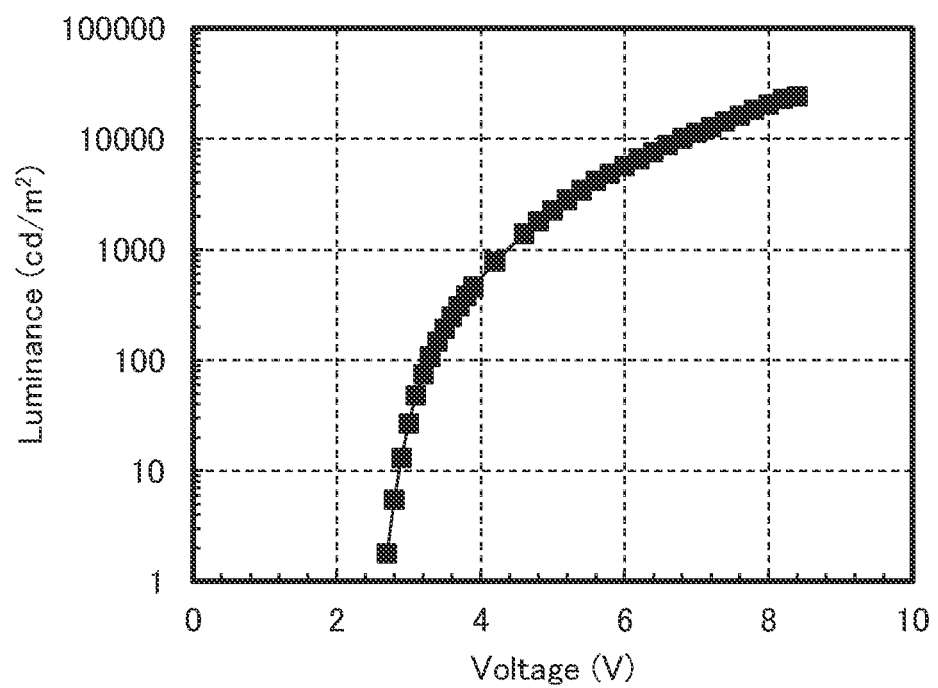
FIG. 46 shows the luminance-voltage characteristics of a light-emitting device 7.
Figure 47:
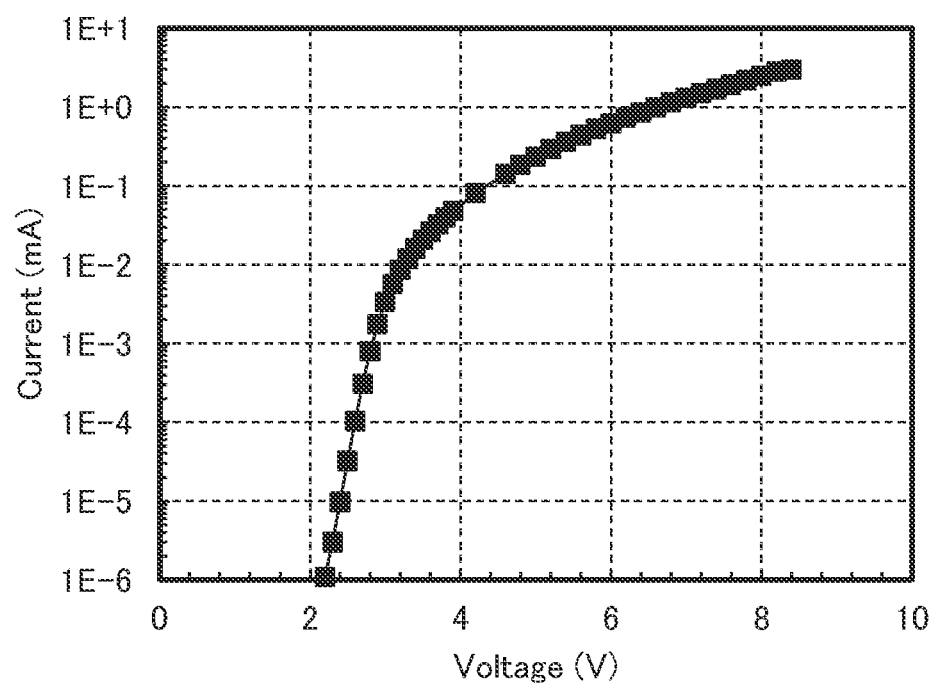
FIG. 47 shows the current-voltage characteristics of a light-emitting device 7.
Figure 48:
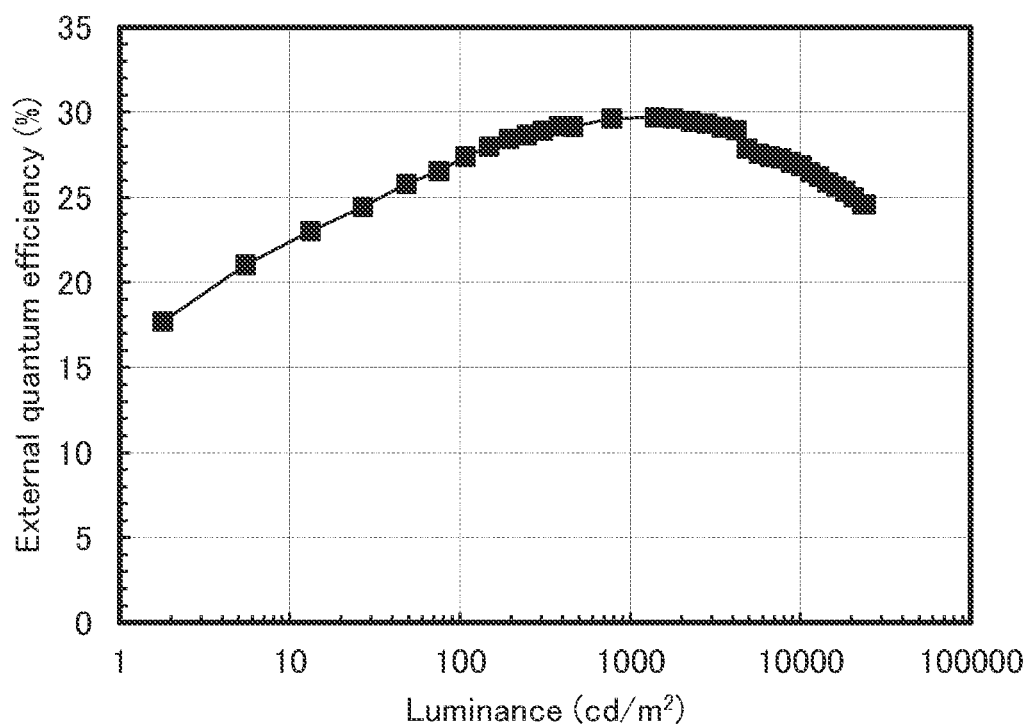
FIG. 48 shows the external quantum efficiency-luminance characteristics of a light-emitting device 7.
Figure 49:
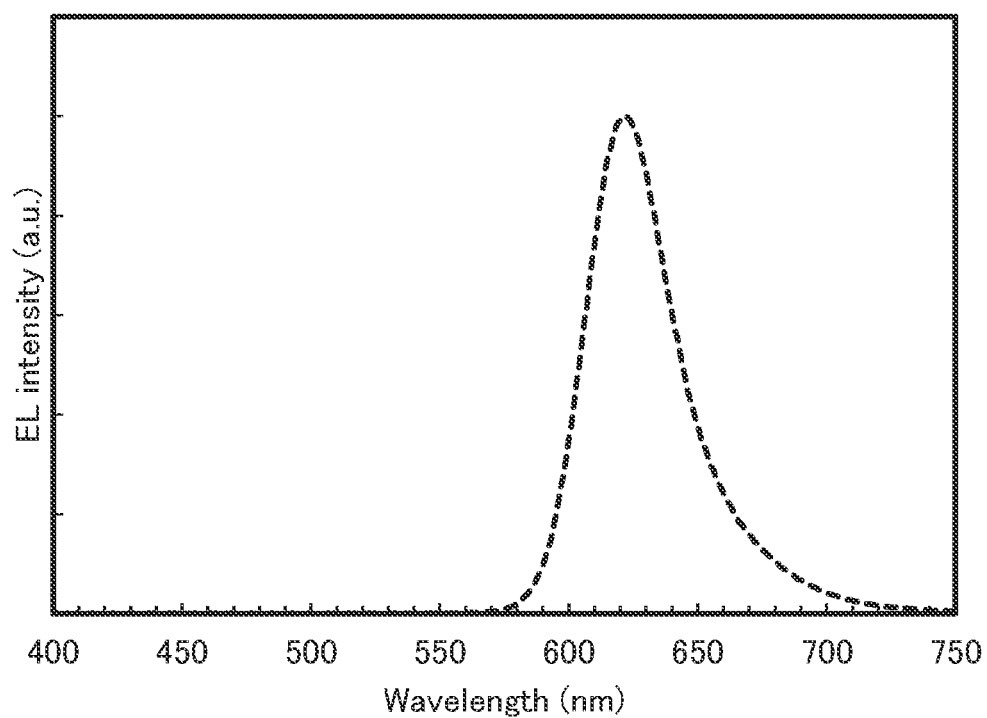
FIG. 49 shows an emission spectrum of a light-emitting device 7.

FIG. 44 shows the luminance-current density characteristics of the light-emitting device 7, FIG. 45 shows the current efficiency-luminance characteristics thereof, FIG. 46 shows the luminance-voltage characteristics thereof, FIG. 47 shows the current-voltage characteristics thereof, FIG. 48 shows the external quantum efficiency-luminance characteristics thereof, and FIG. 49 shows the emission spectrum thereof. Table 12 shows the main characteristics of the light-emitting device 7 at a luminance of about 1000 cd/m$^2$.

TABLE 12

| | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting device 7 | 4.2 | 0.08 | 2.0 | 0.68 | 0.32 | 38.9 | 29.6 |

FIG. 44 to FIG. 49 and Table 12 show that the light-emitting device 7 of one embodiment of the present invention is a light-emitting device with favorable characteristics.

Figure 50:
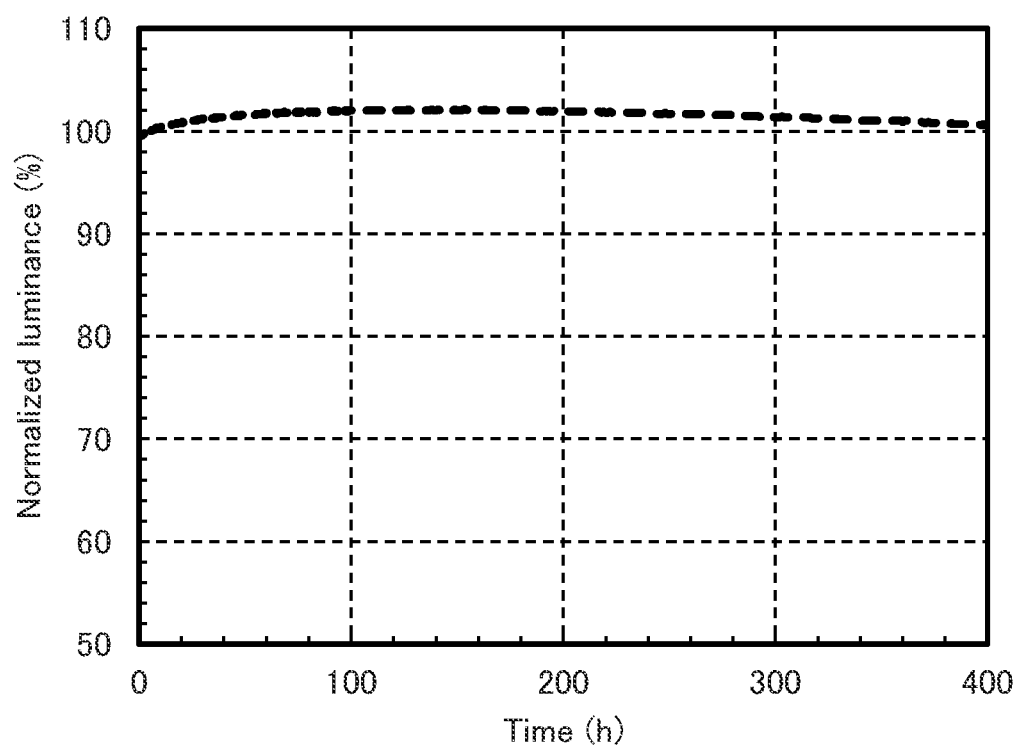
FIG. 50 shows the time dependence of normalized luminance of a light-emitting device 7.

FIG. 50 is a graph (decay curve) showing a change in luminance over driving time at a current density of 75 mA/cm$^2$. As shown in FIG. 50, the light-emitting device 7 of one embodiment of the present invention maintains 100% or more of the initial luminance even when 400 hours have passed. This reveals that a reduction in luminance over driving time is particularly small and the light-emitting device 7 of one embodiment of the present invention has an extremely long lifetime. The decay curve has a characteristic shape in having the maximum value, so that the light-emitting device 7 can have an extremely long lifetime by showing the above degradation behavior.

Example 5

In this example, light-emitting devices 8 and 9 of one embodiment of the present invention are described. Structural formulae of organic compounds used for the light-emitting devices 8 and 9 are shown below.

[Chemical Formulae 9]

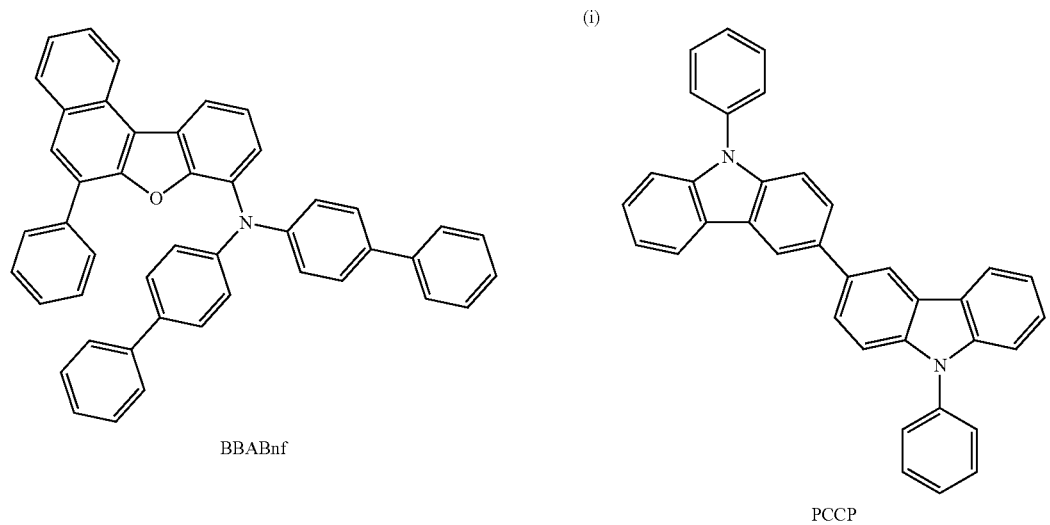

(i) BBABnf (xv) PCCP

-continued
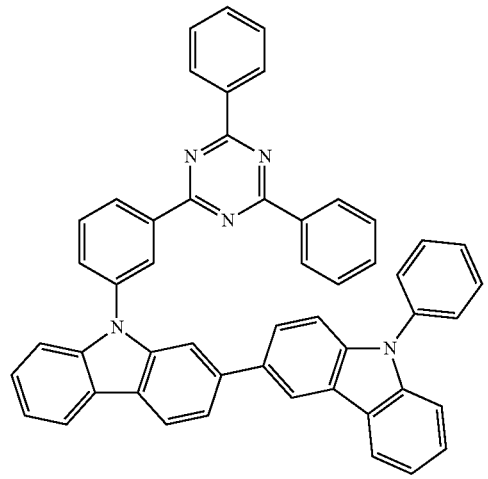
mPCCzPTzn-02
(xvi)
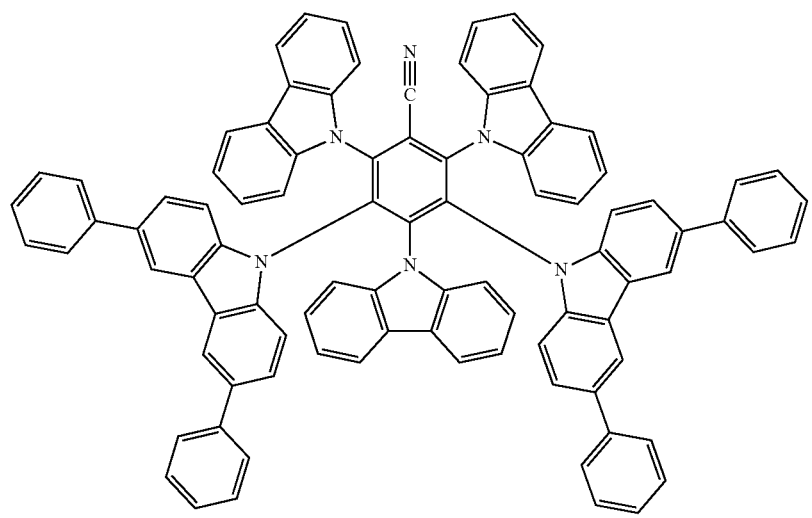
3Cz2DPhCzBN
(xvii)
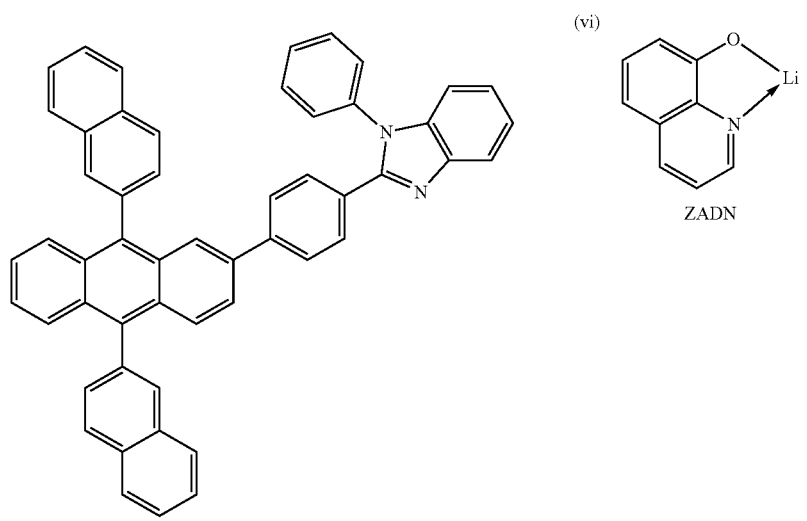
Liq
(vi)
ZADN
(v)

(xviii)

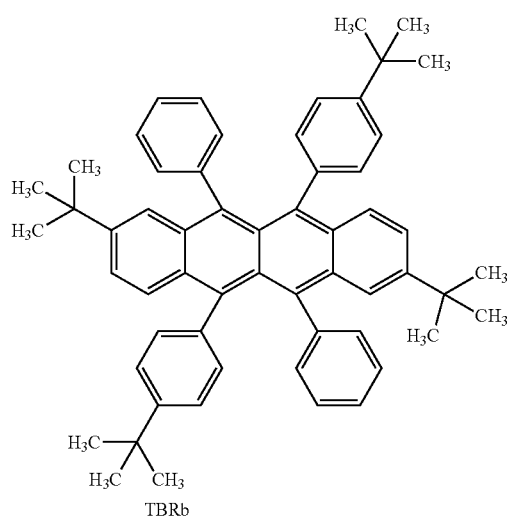

TBRb (Fabrication Method of Light-Emitting Device 8)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N,N-bis(4-biphenyl)-6-phenylbenzo[b]naphtho[1,2-d]furan-8-amine (abbreviation: BBABnf) represented by Structural Formula (i) and ALD-MP001Q (produced by Analysis Atelier Corporation, material serial No. 1S20170124) were deposited on the anode 101 to a thickness of 10 nm by co-evaporation using a resistance-heating method such that the weight ratio of BBABnf to ALD-MP001Q was 1:0.05, whereby the hole-injection layer 111 was formed.

Subsequently, over the hole-injection layer 111, BBABnf was deposited by evaporation to a thickness of 30 nm to form the first hole-transport layer 112-1, and then 3,3'-bis(9-phenyl-9H-carbazole) (abbreviation: PCCP) represented by Structural Formula (xv) was deposited by evaporation to a thickness of 20 nm to form the second hole-transport layer 112-2, whereby the hole-transport layer 112 was formed. Note that the second hole-transport layer 112-2 also functions as an electron-blocking layer.

Then, 9-[3-(4,6-diphenyl-1,3,5-triazin-2-yl)phenyl]-9'-phenyl-2,3'-bi-9H-carbazole (abbreviation: mPCCzPTzn-02) represented by Structural Formula (xvi), PCCP, and 3',3''',6',6'''-tetraphenyl-9,9',9'',9''',9''''-(cyanobenzene-2,3,4,5,6-pentanyl)pentakis(9H-carbazole) (abbreviation: 3Cz2DPhCzBN) represented by Structural Formula (xvii) were deposited by co-evaporation to a thickness of 40 nm such that the weight ratio of mPCCzPTzn-02 to PCCP and 3Cz2DPhCzBN was 0.6:0.4:0.5, whereby the light-emitting layer 113 was formed.

Then, over the light-emitting layer 113, 2-{4-[9,10-di(naphthalen-2-yl)-2-anthryl]phenyl}-1-phenyl-1H-benzimidazole (abbreviation: ZADN) represented by Structural Formula (v) and 8-hydroxyquinolinatolithium (abbreviation: Liq) represented by Structural Formula (vi) were deposited by co-evaporation to a thickness of 12.5 nm such that the weight ratio of ZADN to Liq was 0.4:1, and successively, ZADN and Liq were deposited by co-evaporation to a thickness of 12.5 nm such that the weight ratio of ZADN to Liq was 1:0.4, whereby the electron-transport layer 114 was formed.

After the formation of the electron-transport layer 114, Liq was deposited by evaporation to a thickness of 1 nm to form the electron-injection layer 115. Then, aluminum was deposited by evaporation to a thickness of 200 nm to form the cathode 102. Thus, the light-emitting device 8 of this example was fabricated.

(Fabrication Method of Light-Emitting Device 9)

The light-emitting device 9 was fabricated in the same manner as the light-emitting device 8 except that the hole-transport layer was formed by evaporation of BBABnf to a thickness of 40 nm and the light-emitting layer 113 was formed by co-evaporation of mPCCzPTzn-02, PCCP, 3Cz2DPhCzBN, and 2,8-di-tert-butyl-5,11-bis(4-tert-butylphenyl)-6,12-diphenyltetracene (abbreviation: TBRb) represented by Structural Formula (xviii) to a thickness of 40 nm such that the weight ratio of mPCCzPTzn-02 to PCCP, 3Cz2DPhCzBN, and TBRb was 0.6:0.4:0.5:0.01.

The structures of the light-emitting devices 8 and 9 are listed in the following table.

TABLE 13

| | Hole-injection layer 10 nm | Hole-transport layer 1 30 nm | Hole-transport layer 2 20 nm | Light-emitting layer 40 nm | Electron-transport layer 12.5 nm | Electron-transport layer 12.5 nm |
|---|---|---|---|---|---|---|
| Light-emitting devices 8 and 9 | BBABnf: ALD-MP001Q (1:0.05) | BBABnf | PCCP | *1 *2 | ZADN: Liq (0.4:1) | ZADN: Liq (1:0.4) |

*1 mPCCzPTzn-02: PCCP: 3Cz2DPhCzBN (0.6.0.4:0.5)
*2 mPCCzPTzn-02: PCCP: 3Cz2DPhCzBN: TBRb (0.6:0.4:0.5:0.01)

Note that 3Cz2DPhCzBN is a TADF material and TBRb is a fluorescent material. That is, the light-emitting device 8 contains the TADF material as a light-emitting material, and the light-emitting device 9 contains TBRb, which can receive energy from 3Cz2DPhCzBN, as a light-emitting material.

The HOMO levels, the LUMO levels, and the electron mobilities of the organic compounds used in this example are listed in the following table. The electron mobilities were measured when the square root of the electric field strength [V/cm] was 600.

TABLE 14

| | HOMO level (eV) | LUMO level (eV) | Electron mobility (cm$^2$/Vs) |
|---|---|---|---|
| BBABnf | −5.56 | — | — |
| PCCP | −5.63 | — | — |
| mPCCzPTzn-02 | −5.69 | −3.00 | — |
| ZADN | — | −2.87 | — |
| ZADN: Liq (1:1) | — | — | $3.1 \times 10^{-6}$ |

The light-emitting devices were sealed using a glass substrate in a glove box containing a nitrogen atmosphere so as not to be exposed to the air (a sealant was applied to surround the devices and UV treatment and heat treatment at 80° C. for 1 hour were performed at the time of sealing). Then, the initial characteristics and reliability of the light-emitting devices were measured. Note that the measurement was performed at room temperature.

Figure 51:
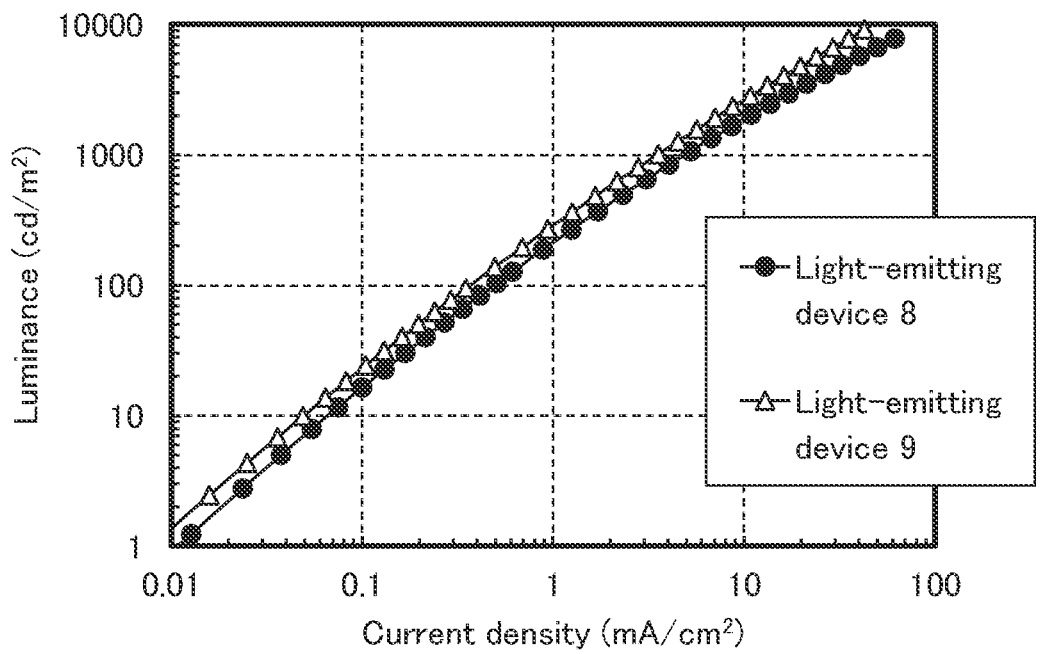
FIG. 51 shows the luminance-current density characteristics of light-emitting devices 8 and 9.
Figure 52:
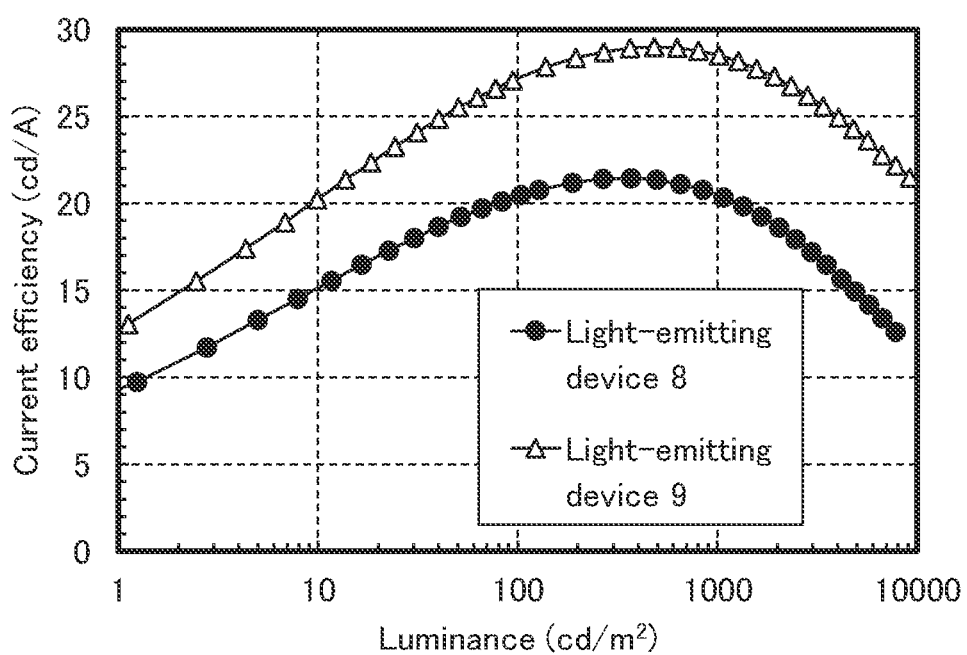
FIG. 52 shows the current efficiency-luminance characteristics of light-emitting devices 8 and 9.
Figure 53:
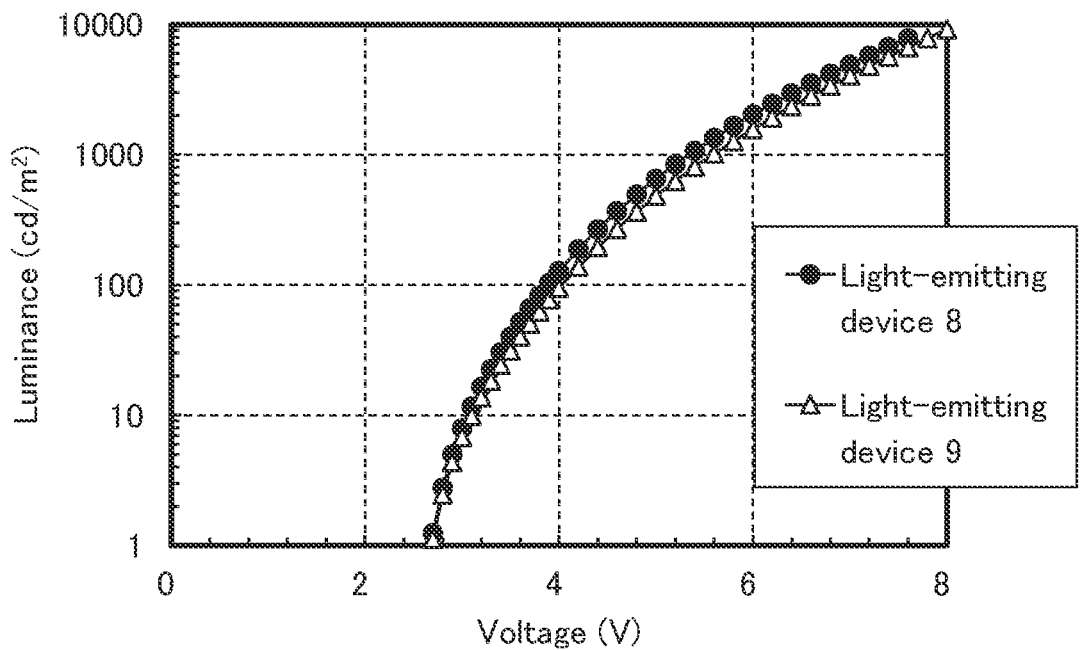
FIG. 53 shows the luminance-voltage characteristics of light-emitting devices 8 and 9.
Figure 54:
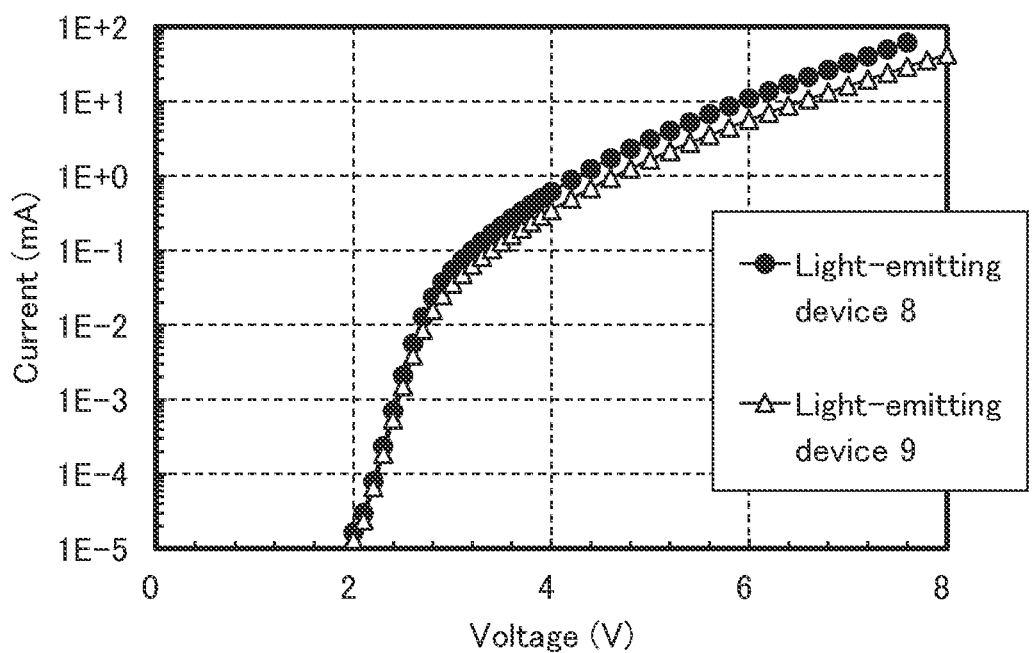
FIG. 54 shows the current-voltage characteristics of light-emitting devices 8 and 9.
Figure 55:
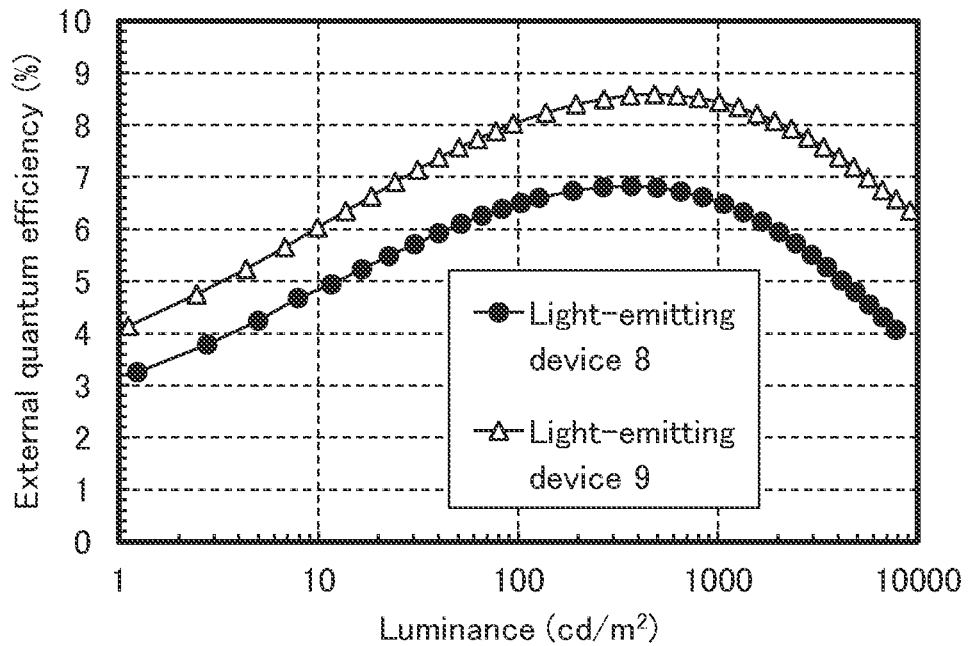
FIG. 55 shows the external quantum efficiency-luminance characteristics of light-emitting devices 8 and 9.
Figure 56:
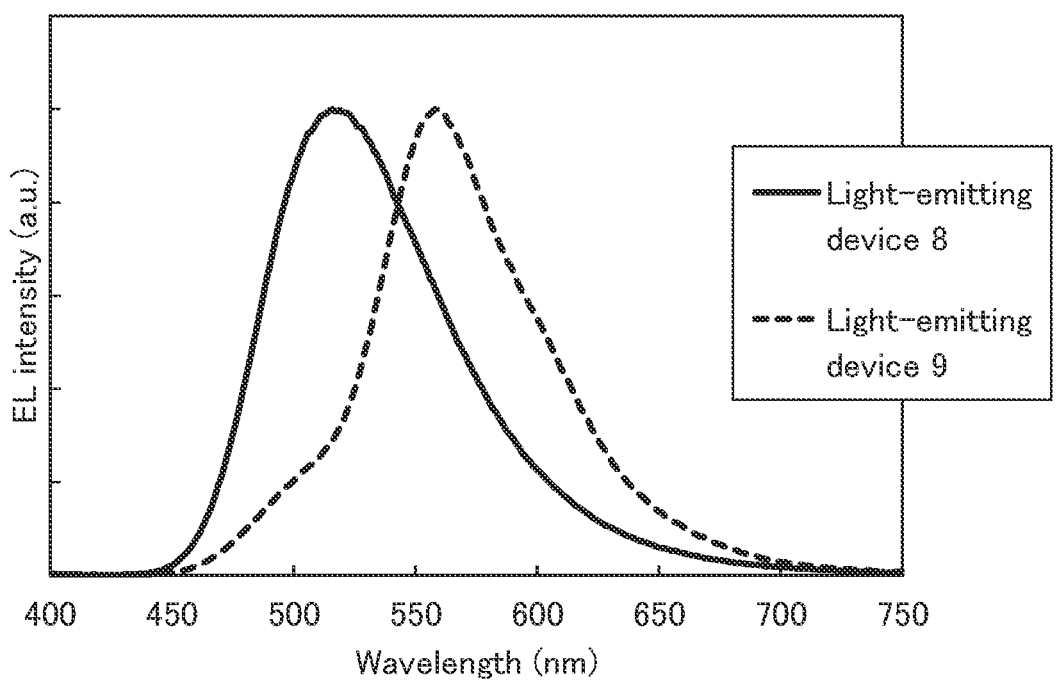
FIG. 56 shows emission spectra of light-emitting devices 8 and 9.

FIG. 51 shows the luminance-current density characteristics of the light-emitting devices 8 and 9, FIG. 52 shows the current efficiency-luminance characteristics thereof, FIG. 53 shows the luminance-voltage characteristics thereof, FIG. 54 shows the current-voltage characteristics thereof, FIG. 55 shows the external quantum efficiency-luminance characteristics thereof, and FIG. 56 shows the emission spectra thereof. Table 15 shows the main characteristics of the light-emitting devices 8 and 9 at a luminance of about 1000 cd/m$^2$.

FIG. 51 to FIG. 56 and Table 15 show that the light-emitting devices 8 and 9 of one embodiment of the present invention are light-emitting devices with favorable characteristics.

Figure 57:
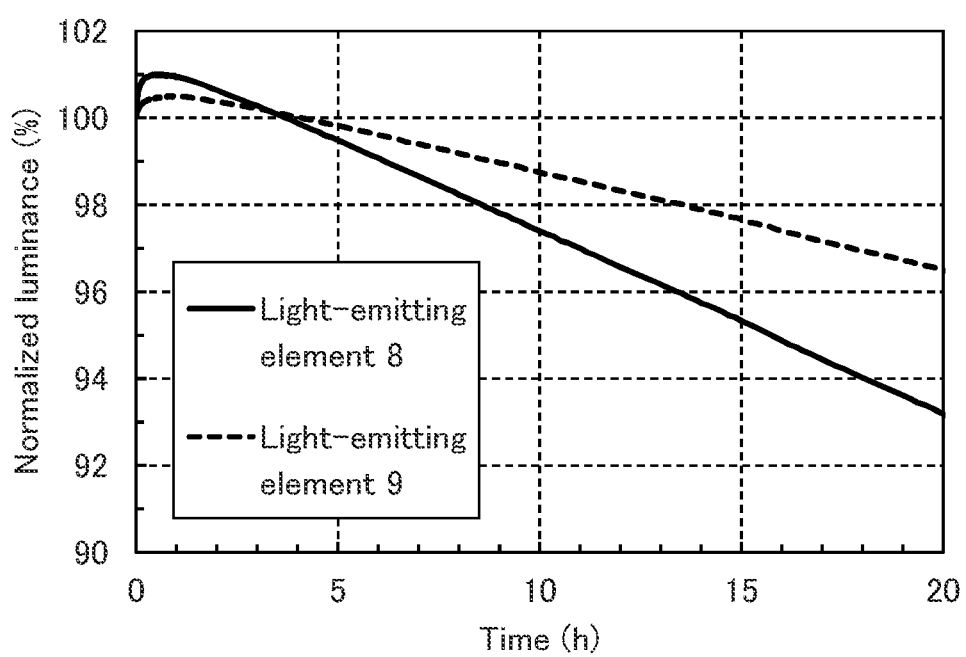
FIG. 57 shows the time dependence of normalized luminance of light-emitting devices 8 and 9.

FIG. 57 is a graph showing a change in luminance over driving time at a current density of 50 mA/cm$^2$. As shown in FIG. 57, the luminance of the light-emitting devices 8 and 9 of one embodiment of the present invention increases after the start of the driving, becomes higher than the initial luminance, and then gradually decreases. That is, the decay curve has the maximum value. This results in a significant improvement in the driving lifetime in the state with a small decay.

Reference Example 1

In this reference example, methods for calculating the HOMO levels, the LUMO levels, and the electron mobilities of the organic compounds used in the examples are described.

The HOMO level and the LUMO level can be calculated through cyclic voltammetry (CV) measurement.

An electrochemical analyzer (ALS model 600A or 600C, manufactured by BAS Inc.) was used as the measurement apparatus. A solution for the CV measurement was prepared in the following manner: tetra-n-butylammonium perchlorate (n-Bu$_4$NClO$_4$, produced by Tokyo Chemical Industry Co., Ltd., catalog No. T0836) as a supporting electrolyte was dissolved in dehydrated dimethylformamide (DMF, produced by Sigma-Aldrich Co. LLC., 99.8%, catalog No. 22705-6) as a solvent at a concentration of 100 mmol/L, and the object to be measured was dissolved therein at a concentration of 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag$^+$ electrode (RE7 reference electrode for nonaqueous solvent, manufactured by BAS Inc.) was used as a reference electrode. Note that the measurement was conducted at room temperature (20° C. to 25° C.). In addition, the scan speed in the CV measurement was fixed to 0.1 V/sec, and an oxidation potential Ea [V] and

TABLE 15

| | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting device 8 | 5.4 | 0.21 | 5.3 | 0.28 | 0.56 | 20.3 | 6.5 |
| Light-emitting device 9 | 5.6 | 0.14 | 3.6 | 0.43 | 0.54 | 28.5 | 8.4 | a reduction potential Ec [V] with respect to the reference electrode were measured. The potential Ea is an intermediate potential of an oxidation-reduction wave, and the potential Ec is an intermediate potential of a reduction-oxidation wave. Here, since the potential energy of the reference electrode used in this example with respect to the vacuum level is known to be −4.94 [eV], the HOMO level and the LUMO level can be calculated by the following formulae: HOMO level [eV]=−4.94−Ea and LUMO level [eV]=−4.94−Ec.

The electron mobility can be measured by an impedance spectroscopy (IS) method.

As a method for measuring the carrier mobility of an EL material, a time-of-flight (TOF) method, a method using I-V characteristics of a space-charge-limited current (SCLC), or the like has been known for a long time. The TOF method needs a sample with a much larger thickness than that of an actual organic EL device. The SCLC method has a disadvantage in that electric field strength dependence of carrier mobility cannot be obtained, for example. Since an organic film required for the measurement employing the IS method is thin (approximately several hundreds of nanometers), the organic film can be formed of a relatively small amount of EL materials, whereby the mobility can be measured with a thickness close to the thickness of a film in an actual EL device. In this method, the electric field strength dependence of the carrier mobility can also be measured.

In the IS method, a micro sinusoidal voltage signal ($V=V_0[\exp(j\omega t)]$) is applied to an EL device, and the impedance of the EL device ($Z=V/I$) is obtained from a phase difference between the current amplitude of a response current signal ($I=I_0\exp[j\omega t+\phi)]$) and the input signal. By applying the voltage to the EL device while the frequency of the voltage is changed from a high level to a low level, components having various relaxation times that contribute to the impedance can be separated and measured.

Here, admittance Y ($=1/Z$), which is the reciprocal number of the impedance, can be represented by conductance G and susceptance B as shown in the following formula (1).

[Formula 1]

$$Y = \frac{1}{Z} = G + jB \qquad (1)$$

In addition, by a single injection model, calculation of the following formulae (2) and (3) can be performed. Here, g in the formula (4) is differential conductance. In the formula, C represents capacitance, $\theta$ represents a transit angle ($\omega t$), $\omega$ represents angular frequency, and t represents transit time. For the analysis, the current equation, the Poisson's equation, and the current continuity equation are used, and a diffusion current and a trap state are ignored.

[Formula 2]

$$G = \frac{g\theta^3}{6} \frac{(\theta - \sin\theta)}{(\theta - \sin\theta)^2 + \left(\frac{\theta^2}{2} + \cos\theta - 1\right)^2} \qquad (2)$$

$$B = \omega C = \frac{g\theta^3}{6} \frac{\frac{\theta^2}{2} + \cos\theta - 1}{(\theta - \sin\theta)^2 + \left(\frac{\theta^2}{2} + \cos\theta - 1\right)^2} \qquad (3)$$

$$g = \frac{9}{4}\varepsilon\mu\frac{V_0}{d^3} \qquad (4)$$

A method for calculating mobility from the frequency characteristics of capacitance is a $-\Delta B$ method. A method for calculating mobility from the frequency characteristics of conductance is a $\omega\Delta G$ method.

Figure 25:
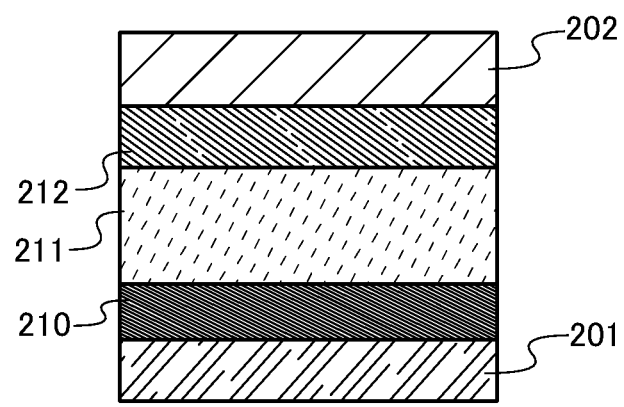
FIG. 25 illustrates a structure of a measurement device.

In practice, first, a measurement device is fabricated using a material whose electron mobility is intended to be calculated. The measurement device is designed such that only electrons flow therein as carriers. In this specification, a method for calculating electron mobility from the frequency characteristics of capacitance (the $-\Delta B$ method) is described. FIG. 25 is a schematic view of a measurement device used in this example.

As illustrated in FIG. 25, the measurement device fabricated in this example includes a first layer 210, a second layer 211, and a third layer 212 between an anode 201 and a cathode 202. The material whose electron mobility is intended to be calculated is used as a material for the second layer 211. For explanation, an example in which the electron mobility of a film formed by co-evaporation of ZADN and Liq in a weight ratio of 1:1 is measured is given. A specific structure example is listed in the following table.

TABLE 16

| Anode | | | First layer | Second layer | Third layer | Cathode |
|---|---|---|---|---|---|---|
| 100 nm | 50 nm | 100 nm | 1 nm | 200 nm | 1 nm | 100 nm |
| APC | NITO | Al | Liq | ZADN: Liq (1:1) | Liq | Al |

Figure 26:
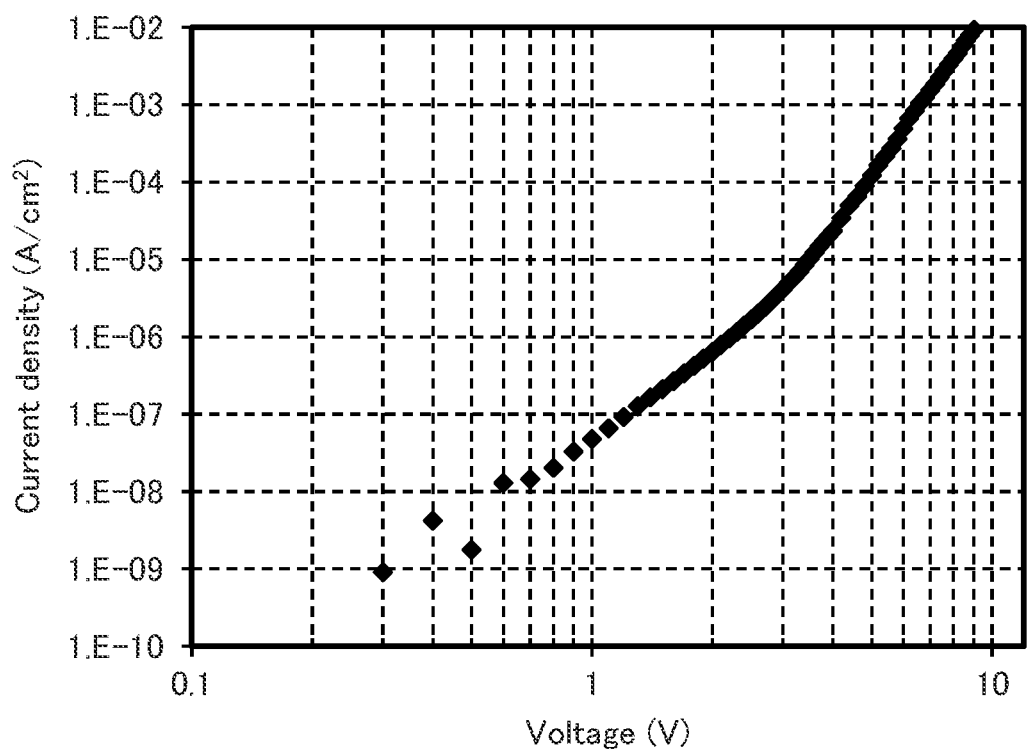
FIG. 26 shows the current density-voltage characteristics of a measurement device.

FIG. 26 shows the current density-voltage characteristics of the measurement device using the film formed by co-evaporation of ZADN and Liq as the second layer 211.

Figure 27:
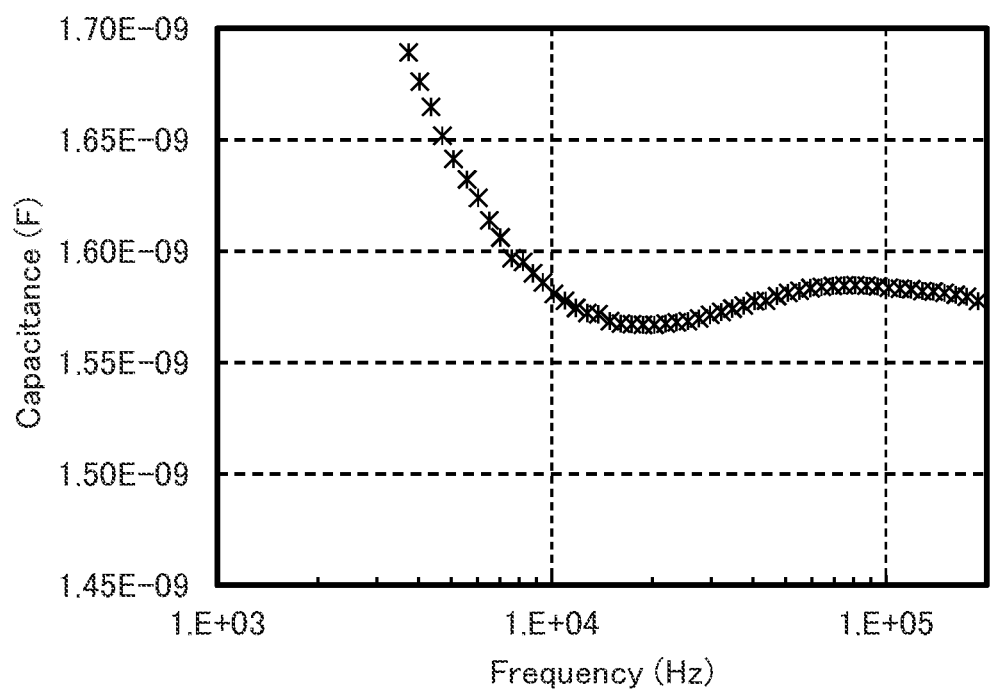
FIG. 27 shows the calculated frequency characteristics of capacitance C when a DC voltage is 7.0 V and a ratio of ZADN to Liq is 1:1.

The impedance was measured under the conditions where the frequency was 1 Hz to 3 MHz, the AC voltage was 70 mV, and the DC voltage was applied in the range of 5.0 V to 9.0 V. Here, capacitance is calculated from admittance, which is the reciprocal number of the obtained impedance (the above formula (1)). FIG. 27 shows the frequency characteristics of the calculated capacitance C when the application voltage was 7.0 V.

The frequency characteristics of the capacitance C are obtained from a phase difference in current, which is generated because a space charge generated by carriers injected by the micro voltage signal cannot completely follow the micro AC voltage. The transit time of the injected carriers in the film is defined by time T until the carriers reach a counter electrode, and is represented by the following formula (5).

[Formula 3]

$$T = \frac{4}{3}\frac{L^2}{\mu V_0} \qquad (5)$$

A negative susceptance change ($-\Delta B$) corresponds to a value ($-\omega\Delta C$) obtained by multiplying a capacitance change $-\Delta C$ by angular frequency $\omega$. According to the formula (3), there is a relation between peak frequency on the lowest frequency side $f'_{max}(=\omega_{max}/2\pi)$ and the transit time T as shown in the following formula (6).

[Formula 4]

$$T = \frac{4.5}{2\pi f'_{max}} \quad (6)$$

Figure 28:
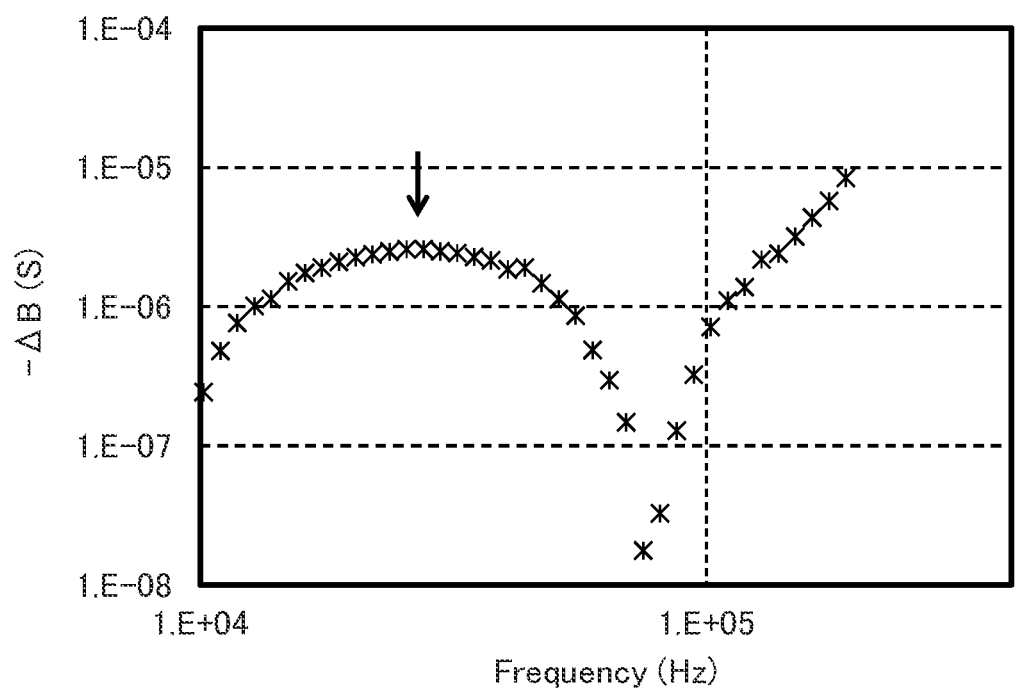
FIG. 28 shows the frequency characteristics of $-\Delta B$ when a DC voltage is 7.0 V and a ratio of ZADN to Liq is 1:1.

FIG. 28 shows the frequency characteristics of −ΔB calculated from the above measurement (i.e., −ΔB at a DC voltage of 7.0 V). The peak frequency on the lowest frequency side $f'_{max}$ is indicated by an arrow in FIG. 28.

The transit time T is obtained from $f'_{max}$ obtained from the above measurement and analysis (see the above formula (6)); thus, in this example, the electron mobility at a DC voltage of 7.0 V can be obtained from the above formula (5). Through the same measurement with the DC voltage in the range of 5.0 V to 9.0 V, the electron mobility at each voltage (electric field strength) can be calculated, so that the electric field strength dependence of the mobility can also be measured.

Figure 29:
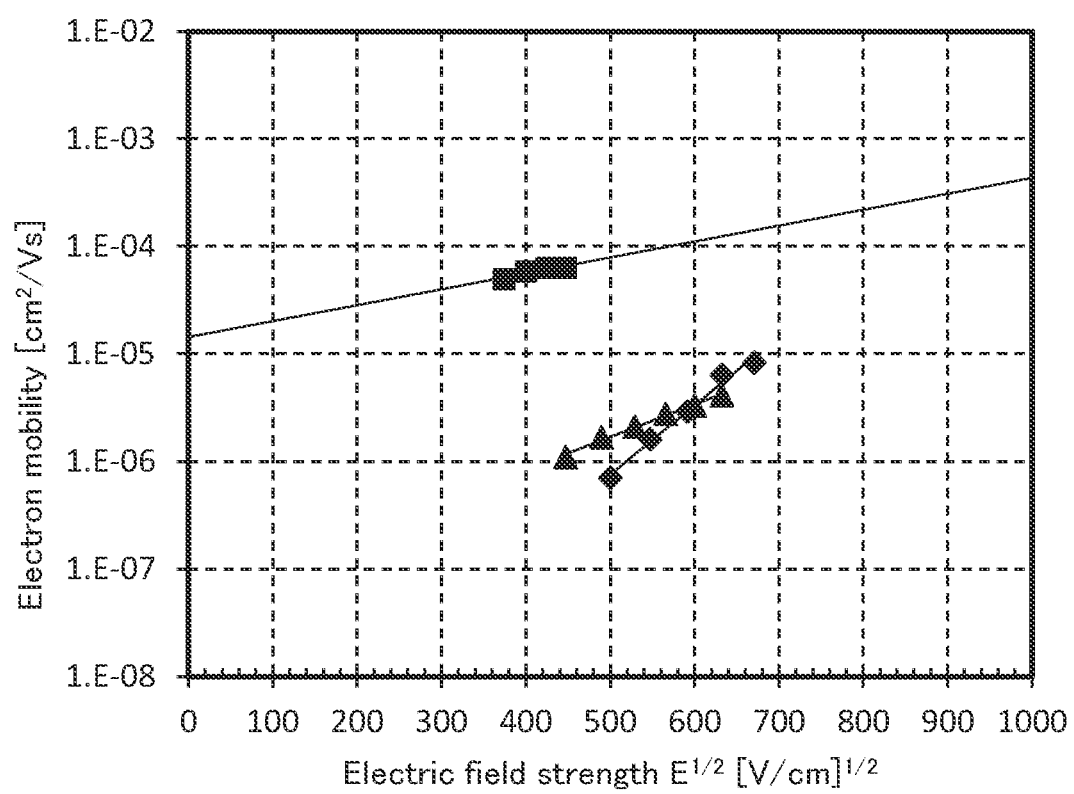
FIG. 29 shows the electric field strength dependence of electron mobility of organic compounds.

FIG. 29 shows the final electric field strength dependence of the electron mobility of the organic compounds obtained by the above calculation method, and Table 17 shows the values of the electron mobility in the case where the square root of the electric field strength [V/cm] read from the figure was 600 $[V/cm]^{1/2}$.

TABLE 17

|  | Electron mobility (cm²/Vs) |
| --- | --- |
| cgDBCzPA | 7.7 × 10⁻⁵ |
| 2mDBTBPDBq-II | 2.2 × 10⁻⁵ |
| ZADN: Liq (1:1) | 3.5 × 10⁻⁶ |

The electron mobility can be calculated as described above. For the details about the measurement method, refer to the following reference: T. Okachi et al., *Japanese Journal of Applied Physics*, vol. 47, No. 12, pp. 8965-8972, 2008.

Reference Example 2

Synthesis methods of 9mDBtBPNfpr and 8BP-4mDBtPBfpm, the unpublished substances used in the example, are described.

Synthesis Method of 9mDBtBPNfpr

A method for synthesizing 9-[(3'-dibenzothiophen-4-yl)biphenyl-3-yl]naphtho[1',2':4,5]furo[2,3-b]pyrazine (abbreviation: 9mDBtBPNfpr) represented by Structural Formula (xiii) in Example 4 is described. The structure of 9mDBtBPNfpr is shown below.

[Chemical Formula 10]

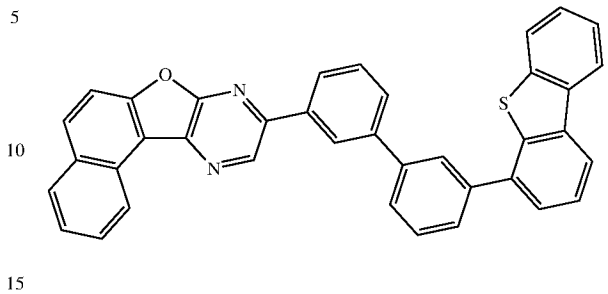

9mDBtBPNfpr

Step 1: Synthesis of 6-chloro-3-(2-methoxynaphthalen-1-yl)pyrazin-2-amine

First, into a three-neck flask equipped with a reflux pipe, 4.37 g of 3-bromo-6-chloropyrazin-2-amine, 4.23 g of 2-methoxynaphthalene-1-boronic acid, 4.14 g of potassium fluoride, and 75 mL of dehydrated tetrahydrofuran were put, and the air in the flask was replaced with nitrogen. The mixture in the flask was degassed by being stirred under reduced pressure, and then 0.57 g of tris(dibenzylideneacetone)dipalladium(0) (abbreviation: Pd₂(dba)₃) and 4.5 mL of tri-tert-butylphosphine (abbreviation: P(tBu)₃) were added thereto. The mixture was stirred at 80° C. for 54 hours to be reacted.

After a predetermined time elapsed, the obtained mixture was subjected to suction filtration and the filtrate was concentrated. Then, purification by silica gel column chromatography using a developing solvent (toluene:ethyl acetate=9:1) was performed, so that 2.19 g of a target pyrazine derivative (yellowish white powder) was obtained in a yield of 36%. The synthesis scheme of Step 1 is shown below.

[Chemical Formula 11]

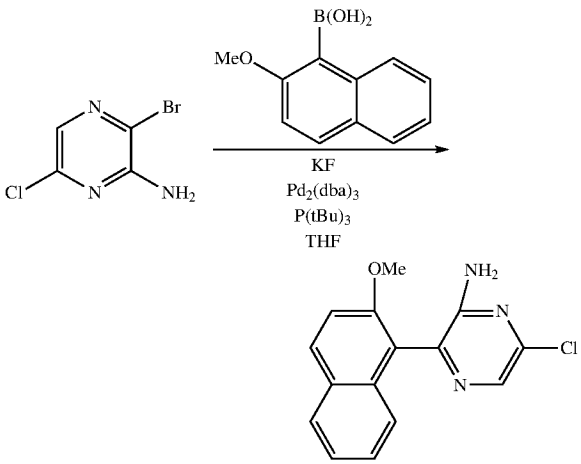

Step 2: Synthesis of 9-chloronaphtho[1',2':4,5]furo[2,3-b]pyrazine

Next, into a three-neck flask, 2.18 g of 6-chloro-3-(2-methoxynaphthalen-1-yl)pyrazin-2-amine obtained in Step 1, 63 mL of dehydrated tetrahydrofuran, and 84 mL of a glacial acetic acid were put, and the air in the flask was replaced with nitrogen. After the flask was cooled down to −10° C., 2.8 mL of tert-butyl nitrite was dripped, and the mixture was stirred at −10° C. for 30 minutes and at 0° C. for 3 hours. After a predetermined time elapsed, 250 mL of water was added to the obtained suspension and suction filtration was performed, so that 1.48 g of a target pyrazine derivative (yellowish white powder) was obtained in a yield of 77%. The synthesis scheme of Step 2 is shown below.

[Chemical Formula 12]

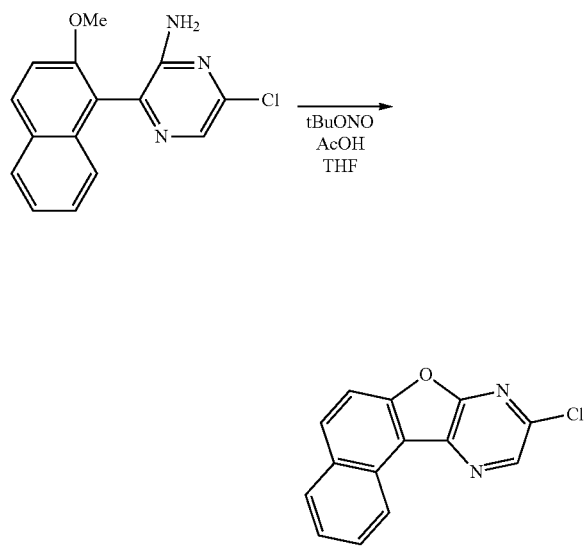

Step 3: Synthesis of 9-[(3'-dibenzothiophen-4-yl)biphenyl-3-yl]naphtho[1',2':4,5]furo[2,3-b]pyrazine (abbreviation: 9mDBtBPNfpr)

Into a three-neck flask, 1.48 g of 9-chloronaphtho[1',2':4,5]furo[2,3-b]pyrazine obtained in Step 2, 3.41 g of 3'-(4-dibenzothiophene)-1,1'-biphenyl-3-boronic acid, 8.8 mL of a 2 M aqueous solution of potassium carbonate, 100 mL of toluene, and 10 mL of ethanol were put, and the air in the flask was replaced with nitrogen. The mixture in the flask was degassed by being stirred under reduced pressure, and then 0.84 g of bis(triphenylphosphine)palladium(II) dichloride (abbreviation: Pd(PPh₃)₂Cl₂) was added thereto. The mixture was stirred at 80° C. for 18 hours to be reacted.

After a predetermined time elapsed, the obtained suspension was subjected to suction filtration, followed by washing with water and ethanol. The obtained solid was dissolved in toluene, and the mixture was filtered through a filter aid in which Celite, alumina, and Celite were stacked in this order and was recrystallized with a mixed solvent of toluene and hexane, so that 2.66 g of a target pale yellow solid was obtained in a yield of 82%.

By a train sublimation method, 2.64 g of the obtained pale yellow solid was purified by sublimation. In the purification by sublimation, the solid was heated at 315° C. under a pressure of 2.6 Pa with an argon gas flow rate of 15 mL/min. After the purification by sublimation, 2.34 g of a target pale yellow solid was obtained at a collection rate of 89%. The synthesis scheme of Step 3 is shown below.

[Chemical Formula 13]

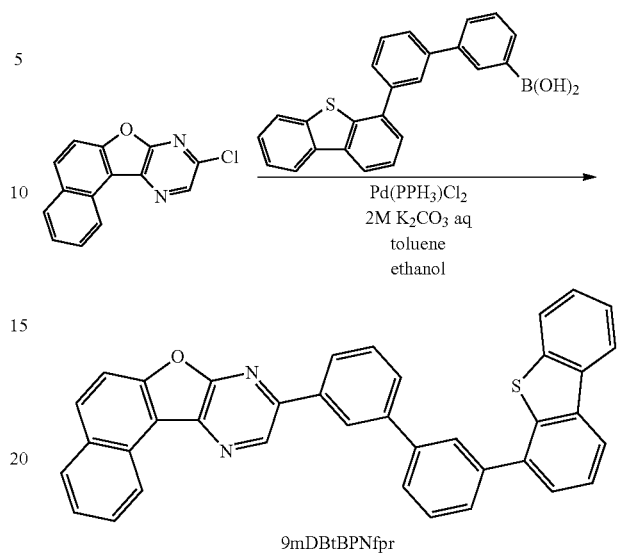

9mDBtBPNfpr

Analysis results by nuclear magnetic resonance ($^1$H-NMR) spectroscopy of the pale yellow solid obtained in Step 3 are shown below. The results reveal that 9mDBtBPNfpr was obtained.

$^1$H-NMR. δ (CD₂Cl₂): 7.47-7.51 (m, 2H), 7.60-7.69 (m, 5H), 7.79-7.89 (m, 6H), 8.05 (d, 1H), 8.10-8.11 (m, 2H), 8.18-8.23 (m, 3H), 8.53 (s, 1H), 9.16 (d, 1H), 9.32 (s, 1H).

Synthesis Method of 8BP-4mDBtPBfpm

A method for synthesizing 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm) represented by Structural Formula (ix) in Example 3 is described. The structure of 8BP-4mDBtPBfpm is shown below.

[Chemical Formula 14]

8BP-4mDBtPBfpm

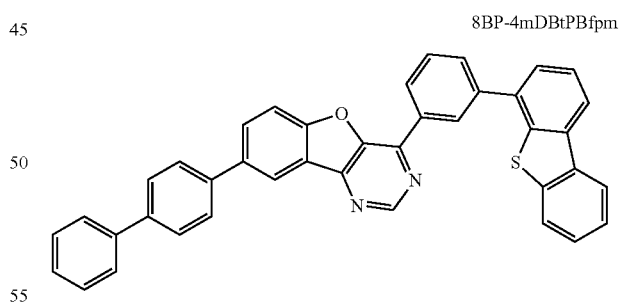

Synthesis of 8-(1,1'-biphenyl-4-yl)-4-[3-(dibenzothiophen-4-yl)phenyl]-[1]benzofuro[3,2-d]pyrimidine Into a three-neck flask, 1.37 g of 8-chloro-4-[3-(dibenzothiophen-4-yl)phenyl]-[1]benzofuro[3,2-d]pyrimidine, 0.657 g of 4-biphenylboronic acid, 1.91 g of tripotassium phosphate, 30 mL of diglyme, and 0.662 g of t-butanol were put. The mixture was degassed by being stirred under reduced pressure, and the air in the flask was replaced with nitrogen.

This mixture was heated at 60° C. and 23.3 mg of palladium(II) acetate and 66.4 mg of di(1-adamantyl)-n-butylphosphine were added, followed by stirring at 120° C. for 27 hours. Water was added to this reaction solution, suction filtration was performed, and the obtained residue was washed with water, ethanol, and toluene. This residue was dissolved in heated toluene, followed by filtration through a filter aid filled with Celite, alumina, and Celite in this order. The obtained solution was concentrated and dried, and then recrystallized with toluene, whereby 1.28 g of a target white solid was obtained in a yield of 74%.

By a train sublimation method, 1.26 g of the white solid was purified by sublimation. In the purification by sublimation, the solid was heated at 310° C. under a pressure of 2.56 Pa with an argon gas flow rate of 10 mL/min. After the purification by sublimation, 1.01 g of a target pale yellow solid was obtained at a collection rate of 80%. The synthesis scheme is shown below.

[Chemical Formula 15]

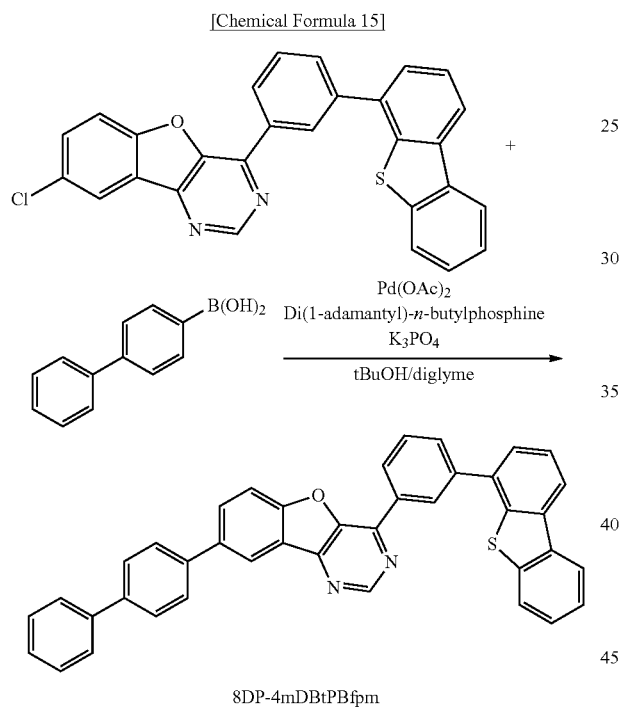

8DP-4mDBtPBfpm

Analysis results by nuclear magnetic resonance ($^1$H-NMR) spectroscopy of the pale yellow solid obtained by the above reaction are shown below. The results reveal that 8BP-4mDBtPBfpm was obtained.

$^1$H-NMR. δ (CDCl$_3$): 7.39 (t, 1H), 7.47-7.53 (m, 4H), 7.63-7.67 (m, 2H), 7.68 (d, 2H), 7.75 (d, 2H), 7.79-7.83 (m, 4H), 7.87 (d, 1H), 7.98 (d, 1H), 8.02 (d, 1H), 8.23-8.26 (m, 2H), 8.57 (s, 1H), 8.73 (d, 1H), 9.05 (s, 1H), 9.34 (s, 1H).

REFERENCE NUMERALS

101: anode, 102: cathode, 103: EL layer, 111: hole-injection layer, 112: hole-transport layer, 112-1: first hole-transport layer, 112-2: second hole-transport layer, 113: light-emitting layer, 113-1: light-emitting region, 114: electron-transport layer, 114-1: first electron-transport layer, 114-2: second electron-transport layer, 115: electron-injection layer, 116: charge-generation layer, 117: p-type layer, 118: electron-relay layer, 119: electron-injection buffer layer, 120: non-light-emitting recombination region, 201: anode, 202: cathode, 210: first layer, 211: second layer, 212: third layer, 400: substrate, 401: anode, 403: EL layer, 404: cathode, 405: sealant, 406: sealant, 407: sealing substrate, 412: pad, 420: IC chip, 501: anode, 502: cathode, 511: first light-emitting unit, 512: second light-emitting unit, 513: charge-generation layer, 601: driver circuit portion (source line driver circuit), 602: pixel portion, 603: driver circuit portion (gate line driver circuit), 604: sealing substrate, 605: sealant, 607: space, 608: wiring, 609: FPC(flexible printed circuit), 610: element substrate, 611: switching FET, 612: current controlling FET, 613: anode, 614: insulator, 616: EL layer, 617: cathode, 618: light-emitting device, 951: substrate, 952: electrode, 953: insulating layer, 954: partition layer, 955: EL layer, 956: electrode, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024W: anode, 1024R: anode, 1024G: anode, 1024B: anode, 1025: partition, 1028: EL layer, 1029: cathode, 1031: sealing substrate, 1032: sealant, 1033: transparent base material, 1034R: red coloring layer, 1034G: green coloring layer, 1034B: blue coloring layer, 1035: black matrix, 1036: overcoat layer, 1037: third interlayer insulating film, 1040: pixel portion, 1041: driver circuit portion, 1042: peripheral portion, 2001: housing, 2002: light source, 2100: robot, 2110: arithmetic device, 2101: illuminance sensor, 2102: microphone, 2103: upper camera, 2104: speaker, 2105: display, 2106: lower camera, 2107: obstacle sensor, 2108: moving mechanism, 3001: lighting device, 5000: housing, 5001: display portion, 5002: second display portion, 5003: speaker, 5004: LED lamp, 5005: operation key, 5006: connection terminal, 5007: sensor, 5008: microphone, 5012: support, 5013: earphone, 5100: cleaning robot, 5101: display, 5102: camera, 5103: brush, 5104: operation button, 5150: portable information terminal, 5151: housing, 5152: display region, 5153: bend portion, 5120: dust, 5200: display region, 5201: display region, 5202: display region, 5203: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7401: housing, 7402: display portion, 7403: operation button, 7404: external connection port, 7405: speaker, 7406: microphone, 9310: portable information terminal, 9311: display panel, 9313: hinge, and 9315: housing.

This application is based on Japanese Patent Application Serial No. 2018-247999 filed with Japan Patent Office on Dec. 28, 2018, Japanese Patent Application Serial No. 2019-020056 filed with Japan Patent Office on Feb. 6, 2019, Japanese Patent Application Serial No. 2019-028460 filed with Japan Patent Office on Feb. 20, 2019, Japanese Patent Application Serial No. 2019-080376 filed with Japan Patent Office on Apr. 19, 2019, and Japanese Patent Application Serial No. 2019-087061 filed with Japan Patent Office on Apr. 30, 2019, the entire contents of which are hereby incorporated by reference.

The invention claimed is:

1. A light-emitting device comprising:
an anode;
a cathode; and
an EL layer between the anode and the cathode,
wherein the EL layer comprises a light-emitting layer and an electron-transport layer,
wherein the electron-transport layer comprises a first substance and a second substance,
wherein the first substance is any of an alkali metal, an alkaline earth metal, an organic complex of an alkali metal or an alkaline earth metal, and a compound of an alkali metal or an alkaline earth metal,
wherein the second substance is an organic compound with an electron-transport property,
wherein the electron-transport layer comprises a first region and a second region in a thickness direction,
wherein an amount of the first substance in the first region is larger than an amount of the first substance in the second region,
wherein the first region is closer to the anode than the second region is in the electron-transport layer,
wherein a decay curve showing a change in luminance of light emission obtained when a constant current is supplied to the light-emitting device has a maximum value, and
wherein the decay curve comprises a portion where the change in luminance exceeds 100%.

2. An electronic device comprising:
the light-emitting device according to claim 1; and
at least one of a sensor, an operation button, a speaker, and a microphone.

3. A light-emitting device comprising:
an anode;
a cathode; and
an EL layer between the anode and the cathode,
wherein the EL layer comprises a light-emitting layer and an electron-transport layer,
wherein the electron-transport layer comprises a first substance and a second substance,
wherein the first substance is any of an alkali metal, an alkaline earth metal, an organic complex of an alkali metal or an alkaline earth metal, and a compound of an alkali metal or an alkaline earth metal,
wherein the second substance is an organic compound with an electron-transport property,
wherein the electron-transport layer comprises a first region and a second region in a thickness direction,
wherein an amount of the second substance in the first region is smaller than an amount of the second substance in the second region,
wherein the first region is closer to the anode than the second region is in the electron-transport layer,
wherein a decay curve showing a change in luminance of light emission obtained when a constant current is supplied to the light-emitting device has a maximum value, and
wherein the decay curve comprises a portion where the change in luminance exceeds 100.

4. An electronic device comprising:
the light-emitting device according to claim 3, and
at least one of a sensor, an operation button, a speaker, and a mic.

5. A light-emitting device comprising:
an anode;
a cathode; and
an EL layer between the anode and the cathode,
wherein the EL layer comprises a first layer, a second layer, a third layer, a light-emitting layer, and a fourth layer in this order from the anode side,
wherein the first layer is in contact with the anode,
wherein the first layer comprises a first organic compound and a second organic compound,
wherein the second layer comprises a third organic compound,
wherein the third layer comprises a fourth organic compound,
wherein the light-emitting layer comprises a fifth organic compound and a sixth organic compound,
wherein the fourth layer comprises a seventh organic compound and a first substance, wherein the first organic compound exhibits an electron-accepting property with respect to the second organic compound,
wherein the fifth organic compound is an emission center substance,
wherein the first substance is any of an alkali metal, an alkaline earth metal, an organic complex of an alkali metal or an alkaline earth metal, and a compound of an alkali metal or an alkaline earth metal,
wherein a HOMO level of the second organic compound is higher than or equal to −5.7 eV and lower than or equal to −5.4 eV,
wherein electron mobility of the seventh organic compound is higher than or equal to $1\times10^{-7}$ cm$^2$/Vs and lower than or equal to $5\times10^{-5}$ cm$^2$/Vs when a square root of electric field strength [V/cm] is 600,
wherein the fourth layer comprises a first region and a second region in a thickness direction,
wherein an amount of the seventh organic compound in the first region is smaller than an amount of the seventh organic compound in the second region, and
wherein the first region is closer to the anode than the second region is in the fourth layer.

6. The light-emitting device according to claim 5,
wherein the fourth layer is in contact with the light-emitting layer, and
wherein a HOMO level of the seventh organic compound is higher than or equal to −6.0 eV.

7. The light-emitting device according to claim 5,
wherein a difference between a HOMO level of the third organic compound and the HOMO level of the second organic compound is less than or equal to 0.2 eV, and
wherein the HOMO level of the third organic compound is deeper than or equal to the HOMO level of the second organic compound.

8. The light-emitting device according to claim 5,
wherein the second organic compound comprises a first hole-transport skeleton,
wherein the third organic compound comprises a second hole-transport skeleton,
wherein the fourth organic compound comprises a third hole-transport skeleton, and
wherein the first hole-transport skeleton, the second hole-transport skeleton, and the third hole-transport skeleton are independently any one of a carbazole skeleton, a dibenzofuran skeleton, a dibenzothiophene skeleton, and an anthracene skeleton.

9. The light-emitting device according to claim 5,
wherein the seventh organic compound comprises an anthracene skeleton.

10. The light-emitting device according to claim 5,
wherein the seventh organic compound comprises an anthracene skeleton and a heterocyclic skeleton.

11. The light-emitting device according to claim 5,
wherein the electron mobility of the seventh organic compound is lower than electron mobility of the sixth organic compound.

12. The light-emitting device according to claim 5,
wherein a difference between a HOMO level of the fourth organic compound and a HOMO level of the third organic compound is less than or equal to 0.2 eV.

13. The light-emitting device according to claim 12,
wherein the HOMO level of the fourth organic compound is deeper than the HOMO level of the third organic compound.

14. The light-emitting device according to claim 5,
wherein the second organic compound comprises a dibenzofuran skeleton.

15. The light-emitting device according to claim 5,
wherein the second organic compound and the third organic compound are the same substance.

16. The light-emitting device according to claim 5,
wherein the fifth organic compound is a blue fluorescent material.

17. The light-emitting device according to claim 5,
wherein a decay curve showing a change in luminance of light emission obtained when a constant current is supplied to the light-emitting device has a maximum value, and
wherein the decay curve comprises a portion where the change in luminance exceeds 100.

18. An electronic device comprising:
the light-emitting device according to claim 5; and
at least one of a sensor, an operation button, a speaker, and a microphone.

* * * * *